(12) United States Patent
Nagatomo et al.

(10) Patent No.: US 9,414,512 B2
(45) Date of Patent: Aug. 9, 2016

(54) SUBSTRATE FOR POWER MODULE, SUBSTRATE WITH HEAT SINK FOR POWER MODULE, POWER MODULE, METHOD FOR PRODUCING SUBSTRATE FOR POWER MODULE, AND METHOD FOR PRODUCING SUBSTRATE WITH HEAT SINK FOR POWER MODULE

(75) Inventors: Yoshiyuki Nagatomo, Saitama (JP); Kazuhiro Akiyama, Naka-gun (JP); Hiroshi Tonomura, Naka (JP); Nobuyuki Terasaki, Okegawa (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 1077 days.

(21) Appl. No.: 13/503,126

(22) PCT Filed: Oct. 19, 2010
(Under 37 CFR 1.47)

(86) PCT No.: PCT/JP2010/068332
§ 371 (c)(1),
(2), (4) Date: Aug. 3, 2012

(87) PCT Pub. No.: WO2011/049067
PCT Pub. Date: Apr. 28, 2011

(65) Prior Publication Data
US 2013/0335921 A1 Dec. 19, 2013

(30) Foreign Application Priority Data

Oct. 22, 2009 (JP) .............................. P2009-243259
Mar. 2, 2010 (JP) .............................. P2010-045747
Apr. 12, 2010 (JP) .............................. P2010-091366
Sep. 28, 2010 (JP) .............................. P2010-217590
Sep. 28, 2010 (JP) .............................. P2010-217591

(51) Int. Cl.
*H05K 7/02* (2006.01)
*H05K 13/00* (2006.01)
(Continued)

(52) U.S. Cl.
CPC ............... *H05K 7/02* (2013.01); *C04B 35/645* (2013.01); *C04B 37/021* (2013.01);
(Continued)

(58) Field of Classification Search
None
See application file for complete search history.

(56) References Cited

U.S. PATENT DOCUMENTS 9,066,433 B2 * 6/2015 Kuromitsu et al.
2007/0274047 A1 * 11/2007 Nagase et al. ................. 361/704

(Continued)

FOREIGN PATENT DOCUMENTS

JP 63-220987 A 9/1988
JP 03-234045 A 10/1991

(Continued)

OTHER PUBLICATIONS

JP 11-163209 A Jun. 18, 1999_MT.*

(Continued)

*Primary Examiner* — Vera Katz
(74) *Attorney, Agent, or Firm* — Locke Lord LLP; James E. Armstrong, IV; Brian S. Matross

(57) ABSTRACT

Provided is a power module substrate including a ceramic substrate, and a metal plate which contains aluminum or an aluminum alloy, and which is stacked and bonded on a surface of the ceramic substrate, wherein one or more additional elements selected from Ag, Zn, Ge, Mg, Ca, Ga, and Li are solid-solubilized in the metal plate, and the Ag concentration in the metal plate in the vicinity of the interface with the ceramic substrate is greater than or equal to 0.05% by mass and less than or equal to 10% by mass, or the total concentration of Zn, Ge, Mg, Ca, Ga, and Li in the metal plate in the vicinity of the interface with the ceramic substrate is greater than or equal to 0.01% by mass and less than or equal to 5% by mass.

4 Claims, 31 Drawing Sheets

(51) Int. Cl.
  *H05K 7/20* (2006.01)
  *H01L 23/373* (2006.01)
  *H01L 23/473* (2006.01)
  *C04B 35/645* (2006.01)
  *C04B 37/02* (2006.01)
  *H01L 21/48* (2006.01)

(52) U.S. Cl.
  CPC ......... *C04B 37/026* (2013.01); *H01L 23/3735* (2013.01); *H01L 23/3736* (2013.01); *H01L 23/473* (2013.01); *H05K 7/2039* (2013.01); *H05K 13/00* (2013.01); *C04B 2235/6581* (2013.01); *C04B 2237/12* (2013.01); *C04B 2237/125* (2013.01); *C04B 2237/343* (2013.01); *C04B 2237/366* (2013.01); *C04B 2237/368* (2013.01); *C04B 2237/402* (2013.01); *C04B 2237/55* (2013.01); *C04B 2237/58* (2013.01); *C04B 2237/60* (2013.01); *C04B 2237/704* (2013.01); *C04B 2237/86* (2013.01); *H01L 21/4882* (2013.01); *H01L 2224/32225* (2013.01); *Y10T 29/49002* (2015.01)

(56) References Cited

U.S. PATENT DOCUMENTS

2014/0192486 A1* 7/2014 Kuromitsu et al. ........... 361/715
2015/0055303 A1* 2/2015 Nagatomo et al. ........... 361/715

FOREIGN PATENT DOCUMENTS

| JP | 07-086444 A | 3/1995 |
| JP | 07-101785 A | 4/1995 |
| JP | 07-122581 A | 5/1995 |
| JP | 8-255973 A | 10/1996 |
| JP | 09-262691 A | 10/1997 |
| JP | H1065075 A | 3/1998 |
| JP | 11-154776 A | 6/1999 |
| JP | 11-163209 A | 6/1999 |
| JP | 2001-010874 A | 1/2001 |
| JP | 2001-053405 A | 2/2001 |
| JP | 2003-078086 A | 3/2003 |
| JP | 2003-086744 A | 3/2003 |
| JP | 2006-240955 A | 9/2006 |
| JP | 2008-311294 A | 12/2008 |
| JP | 2009-147316 A | 7/2009 |

OTHER PUBLICATIONS

Office Action mailed Jul. 8, 2014, issued for the Japanese patent application No. 2010-217590 and English translation thereof.
Office Action mailed Sep. 2, 2014, issued for the Japanese patent application No. 2010-217591 and English translation thereof.
International Search Report dated Nov. 16, 2010, issued for PCT/JP2010/068332.
Office Action issued in corresponding Taiwanese Patent Application No. TW 099135756, dated Nov. 17, 2015.

* cited by examiner

FIG. 2
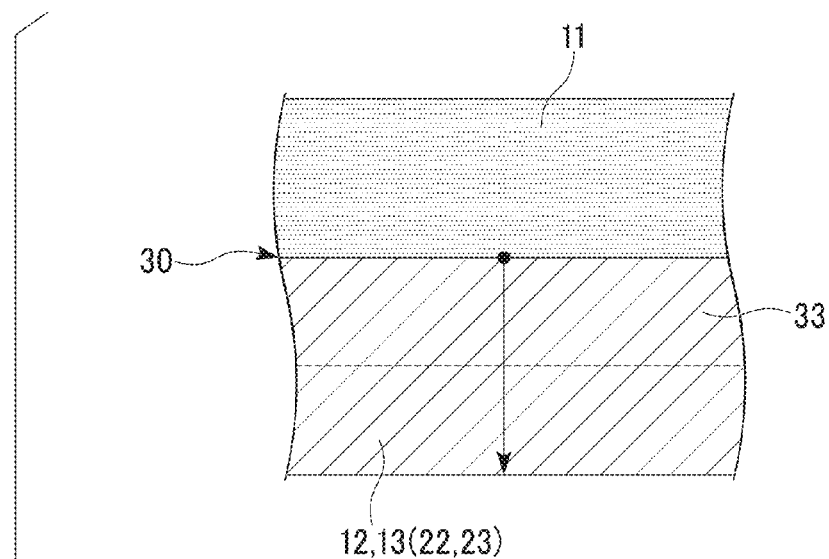
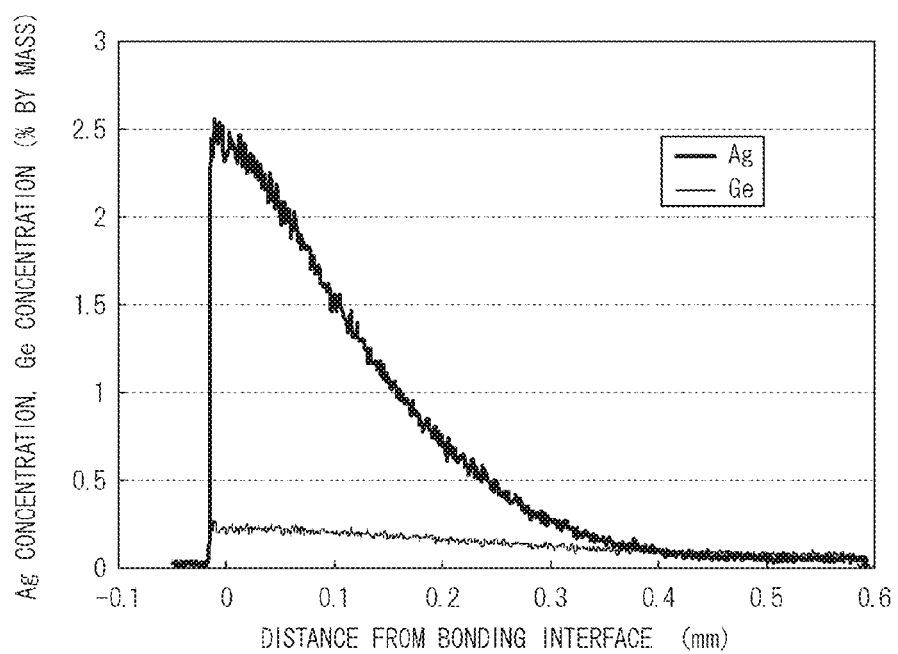

FIG. 13
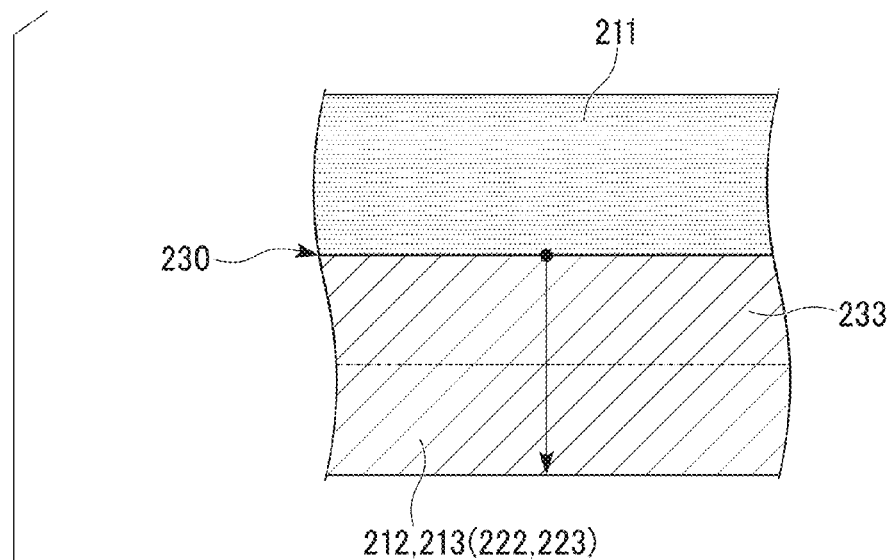
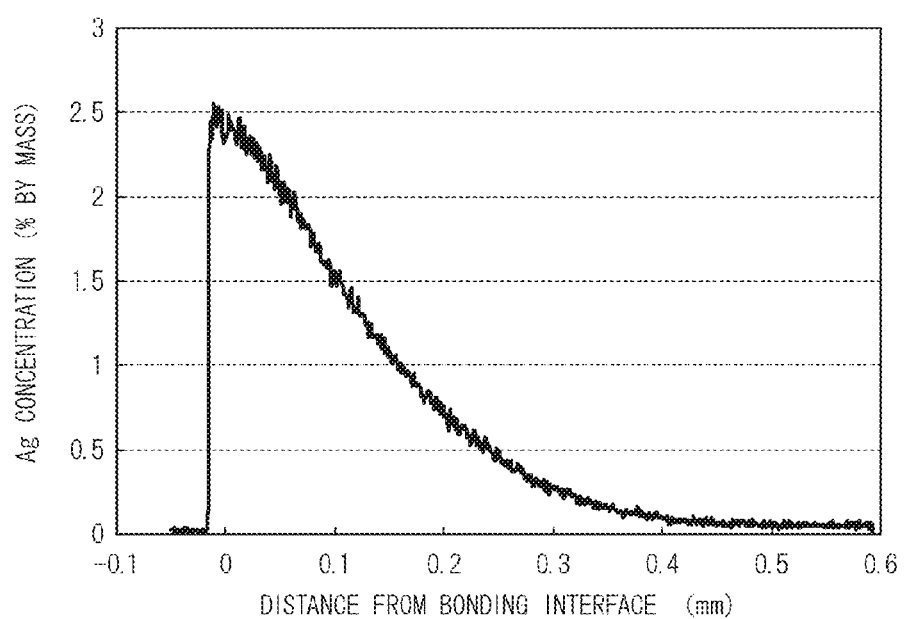

SUBSTRATE FOR POWER MODULE, SUBSTRATE WITH HEAT SINK FOR POWER MODULE, POWER MODULE, METHOD FOR PRODUCING SUBSTRATE FOR POWER MODULE, AND METHOD FOR PRODUCING SUBSTRATE WITH HEAT SINK FOR POWER MODULE

TECHNICAL FIELD

The present invention relates to a power module substrate to be used in semiconductor elements for controlling high voltages and large electric current, a power module substrate having a heat sink, a power module provided with the power module substrate, a method of producing the power module substrate, and a method of producing a power module substrate having a heat sink.

Priority is claimed on Japanese Patent Application No. 2009-243259, filed Oct. 22, 2009, Japanese Patent Application No. 2010-045747, filed Mar. 2, 2010, Japanese Patent Application No. 2010-091366, filed Apr. 12, 2010, and Japanese Patent Applications No. 2010-217590 and No. 2010-217591, filed Sep. 28, 2010, the contents of which are incorporated herein by reference.

BACKGROUND ART

The heat generation amount of a power element for supplying electric power is comparatively high among semiconductor elements. As a substrate which mounts the power element, as shown in Patent Document 1 for example, there is used a power module substrate such that an Al (aluminum) metal plate is bonded onto a ceramic substrate composed of AlN (aluminum nitride) via a brazing filler material.

Moreover, the metal plate serves as a circuit layer, and over the metal plate, there is mounted a power element (semiconductor element) via a soldering material.

Also, there is proposed a power module substrate having a heat sink such that a metal plate made of Al or the like is bonded on the underside surface of a ceramic substrate, thereby forming a metal layer, and a heat sink is bonded on the metal layer.

Moreover, as a means of forming a circuit layer, there is a method in which a metal plate is bonded onto a ceramic substrate, and then a circuit pattern is formed on the metal plate. Furthermore, as disclosed in Patent Document 2 for example, there is a method in which a metal piece which is preliminarily formed in a circuit pattern shape is bonded onto a ceramic substrate.

Here, in order to obtain superior bonding strength between the metal plate and the ceramic substrate, for example, Patent Document 3 discloses surface roughness of the ceramic substrate being less than 0.5 μm.

However, in the case of bonding a metal plate on a ceramic substrate, there is an inconvenience in that a sufficiently high level of bonding strength cannot be obtained if surface roughness of the ceramic substrate is simply reduced, and the level of reliability cannot be improved. For example, even when a dry honing process was performed on the surface of a ceramic substrate using $Al_2O_3$ particles, and the surface roughness was made Ra=0.2 μm, interfacial peeling occurred during the peeling test in some cases. Moreover, even when surface roughness was made Ra=0.1 μm by means of a polishing method, interfacial peeling occurred in some cases.

In particular, recently, while the size and thickness of power modules are being reduced, the usage environment thereof is becoming more severe. Moreover, the amount of heat generation from electronic components to be mounted such as semiconductor element tends to increase, and there is a need for arranging a power module substrate over a heat sink. In this case, the power module substrate is restrained by the heat sink, and therefore, a high level of shearing force acts on the bonding interface between the metal plate and the ceramic substrate when a thermal cycle load is being applied. For this reason, more than ever before, there is a demand for increased bonding strength between a ceramic substrate and a metal plate, and for increased reliability thereof.

PRIOR ART DOCUMENTS

Patent Documents

[Patent Document 1] Japanese Unexamined Patent Application, First Publication No. 2003-086744
[Patent Document 2] Japanese Unexamined Patent Application, First Publication No. 2008-311294
[Patent Document 3] Japanese Unexamined Patent Application, First Publication No. H03-234045

DISCLOSURE OF INVENTION

Means for Solving the Problem

An aspect of the power module substrate of the present invention is a power module substrate comprising a ceramic substrate, and a metal plate which contains aluminum or an aluminum alloy, and which is stacked and bonded on a surface of the ceramic substrate, wherein one or more additional elements selected from Ag, Zn, Ge, Mg, Ca, Ga, and Li are solid-solubilized in the metal plate, and the Ag concentration in the metal plate in the vicinity of the interface with the ceramic substrate is greater than or equal to 0.05% by mass and less than or equal to 10% by mass, or the total concentration of Zn, Ge, Mg, Ca, Ga, and Li in the metal plate in the vicinity of the interface with the ceramic substrate is greater than or equal to 0.01% by mass and less than or equal to 5% by mass.

In the power module substrate of this configuration, a bonding interface side portion of the metal plate is strengthened by solid solution strengthening. As a result, breakage at the metal plate portion can be prevented, and the level of bonding reliability can be improved.

Here, since the Ag concentration in the metal plate in the vicinity of the interface with the ceramic substrate is greater than or equal to 0.05% by mass, or the total concentration of Zn, Ge, Mg, Ca, Ga, and Li is greater than or equal to 0.01% by mass, the bonding interface side portion of the metal plate can be strengthened by solid solution strengthening reliably. Moreover, since the Ag concentration in the metal plate in the vicinity of the interface with the ceramic substrate is less than or equal to 10% by mass, or the total concentration of Zn, Ge, Mg, Ca, Ga, and Li is less than or equal to 5% by mass, it is possible to prevent an excessive increase in the bonding interface strength of the metal plate. Further, when a thermal cycle load is applied to the power module substrate, thermal stress can be absorbed by the metal plate, and cracks in the ceramic substrate can be prevented.

In an aspect of the power module substrate of the present invention, in addition to Ag, one or more elements selected from Zn, Ge, Mg, Ca, Ga, and Li may be solid-solubilized in the metal plate, and the total concentration of Ag, Zn, Ge, Mg, Ca, Ga, and Li in the metal plate in the vicinity of the interface with the ceramic substrate may be greater than or equal to 0.05% by mass and less than or equal to 10% by mass.

In this case, the bonding interface side portion of the metal plate is strengthened by solid solution strengthening reliably. Therefore, breakage at the metal plate portion can be prevented, and the level of bonding reliability can be improved.

Here, since the total concentration of Ag, Zn, Ge, Mg, Ca, Ga, and Li in the metal plate in the vicinity of the interface with the ceramic substrate is greater than or equal to 0.05% by mass, the bonding interface side portion of the metal plate can be strengthened by solid solution strengthening reliably. Moreover, since the total concentration of Ag, Zn, Ge, Mg, Ca, Ga, and Li in the metal plate in the vicinity of the interface with the ceramic substrate is less than or equal to 10% by mass, it is possible to prevent an excessive increase in the bonding interface strength of the metal plate.

In an aspect of the power module substrate of the present invention: the ceramic substrate may be composed of AlN or $Si_3N_4$; an oxygen high concentration part having an oxygen concentration higher than those in the metal plate and the ceramic substrate may be formed in the bonding interface between the metal plate and the ceramic substrate; and the thickness of the oxygen high concentration part may be less than or equal to 4 nm. In a case where the additional element is Ag, the high oxygen concentration part has a concentration two or more times the oxygen concentration in the crystal grain of the ceramic substrate.

In this case, with oxygen present in the bonding interface, the strength level of bonding between the ceramic substrate composed of AlN or $Si_3N_4$, and the metal plate containing aluminum is increased. Furthermore, since the thickness of the oxygen high concentration part is less than or equal to 4 nm, crack occurrence in the oxygen high concentration part associated with the stress exerted when a thermal cycle load is being applied, is suppressed.

Here, the oxygen concentration in the crystal grain of the ceramic substrate refers to the oxygen concentration in a portion of the ceramic substrate distanced from the bonding interface by a certain distance (for example, 5 nm).

In an aspect of the power module substrate of the present invention, in the bonding interface between the metal plate and the ceramic substrate, there may be formed an additional element high concentration part in which the concentration of the additional element is two or more times the concentration of the additional element in the metal plate.

In this case, with atoms of the additional element present in the vicinity of the interface, the level of bonding strength between the ceramic substrate and the metal plate can be improved.

The concentration of the additional element in the metal plate is the concentration of the additional element in a portion of the metal plate distanced from the bonding interface by a certain distance (for example, 5 nm or more).

In an aspect of the power module substrate of the present invention: the ceramic substrate may be composed of AlN; and the mass ratio of Al, the additional element, O, and N obtained by analyzing the bonding interface including the additional element high concentration part by means of an energy dispersive X-ray analysis method may be as follows: Al:additional element:O:N=50 to 90% by mass:1 to 30% by mass:1 to 10% by mass:25% by mass or less.

Alternatively, in an aspect of the power module substrate of the present invention: the ceramic substrate may be composed of $Si_3N_4$; and the mass ratio of Al, Si, the additional element, O, and N obtained by analyzing the bonding interface including the additional element high concentration part by means of an energy dispersive X-ray analysis method may be as follows: Al:Si:additional element:O:N=15 to 45% by mass:15 to 45% by mass:1 to 30% by mass:1 to 10% by mass:25% by mass or less.

Furthermore, in an aspect of the power module substrate of the present invention: the ceramic substrate may be composed of $Al_2O_3$; and the mass ratio of Al, the additional element, and O obtained by analyzing the bonding interface including the additional element high concentration part by means of an energy dispersive X-ray analysis method may be as follows: Al:additional element:O=50 to 90% by mass:1 to 30% by mass:45% by mass or less.

If the mass ratio of the additional element atoms present in the bonding interface exceeds 30% by mass, reaction products from Al and the additional element are excessively produced, and these reaction products may inhibit bonding. Furthermore, these reaction products may strengthen the metal plate in the vicinity of the bonding interface more than necessary, and stress may act on the ceramic substrate when a thermal cycle load is applied. As a result, the ceramic substrate may break. On the other hand, if the mass ratio of the additional element atoms is less than 1% by mass, the additional element atoms may not sufficiently improve the level of bonding strength. Therefore, the preferred mass ratio of the additional element atoms in the bonding interface is in a range of 1 to 30% by mass.

Here, when conducting an analysis using an energy dispersive X-ray analysis method, due to the extremely small spot diameter, measurements are made at several points (for example, 10 to 100 points) on the bonding interface, and then the average value is calculated. Moreover, when conducting the measurement, the measurement is not to be made on the bonding interface between the crystal grain boundary of the metal plate and the ceramic substrate, and it is to be made only on the bonding interface between the crystal grains and the ceramic substrate.

Analytical values obtained in the energy dispersive X-ray analysis method in the present specification were obtained, using an energy dispersive X-ray fluorescence spectrometer, NORAN System 7, product of Thermo Fisher Scientific K.K., mounted on an electron microscope, JEM-2010F, product of JEOL Ltd., at an acceleration voltage of 200 kV.

An aspect of the power module substrate having a heat sink of the present invention comprises: the ceramic substrate; a first metal plate which is bonded on one of the surfaces of the ceramic substrate, and which contains aluminum or an aluminum alloy; a second metal plate which is bonded on the other surface of the ceramic substrate, and which contains aluminum or an aluminum alloy; and a heat sink bonded on the surface of the second metal plate, which is the opposite side of the surface bonded with the ceramic substrate. In the second metal plate and in the heat sink, there are solid-solubilized one or more additional elements selected from Ag, Zn, Ge, Mg, Ca, Ga, and Li. The Ag concentration in the second metal plate and in the heat sink in the vicinity of the interface is greater than or equal to 0.05% by mass and less than or equal to 10% by mass, or the total concentration of Ag, Zn, Ge, Mg, Ca, Ga, and Li in the second metal plate and in the heat sink in the vicinity of the interface is greater than or equal to 0.01% by mass and less than or equal to 5% by mass.

According to the power module substrate having a heat sink configured in this manner, since one or more additional elements selected from Ag, Zn, Ge, Mg, Ca, Ga, and Li are solid-solubilized in the second metal plate and in the heat sink, the bonding interface side portion of each of the second metal plate and the heat sink is strengthened by solid solution strengthening.

Since the Ag concentration in the second metal plate and in the heat sink in the vicinity of the bonding interface is greater than or equal to 0.05% by mass, or the total concentration of Zn, Ge, Mg, Ca, Ga, and Li is greater than or equal to 0.01% by mass, the bonding interface side portion of the second metal plate and of the heat sink can be strengthened by solid solution strengthening reliably. Moreover, since the Ag concentration in the second metal plate and in the heat sink in the vicinity of the bonding interface is less than or equal to 10% by mass, or the total concentration of Zn, Ge, Mg, Ca, Ga, and Li is less than or equal to 5% by mass, an excessive increase in the strength of the bonding interface between the second metal plate and the heat sink can be prevented, and thermal distortion can be absorbed by the second metal plate.

In an aspect of the power module substrate having a heat sink of the present invention, in addition to Ag, one or more elements selected from Zn, Ge, Mg, Ca, Ga, and Li may be solid-solubilized in the second metal plate and in the heat sink, and the total concentration of Ag, Zn, Ge, Mg, Ca, Ga, and Li in the second metal plate and in the heat sink in the vicinity of the bonding interface may be greater than or equal to 0.05% by mass and less than or equal to 10% by mass.

In this case, the bonding interface side portions of the second metal plate and of the heat sink are strengthened by solid solution strengthening. As a result, breakage in the second metal plate and the heat sink can be prevented, and the level of bonding reliability can be improved.

Here, since the total concentration of Ag, Zn, Ge, Mg, Ca, Ga, and Li in the second metal plate and in the heat sink in the vicinity of the bonding interface is greater than or equal to 0.05% by mass, the bonding interface side portion of the second metal plate and of the heat sink can be strengthened by solid solution strengthening reliably. Moreover, since the total concentration of Ag, Zn, Ge, Mg, Ca, Ga, and Li in the second metal plate and in the heat sink in the vicinity of the bonding interface is less than or equal to 10% by mass, an excessive increase in the strength of the bonding interface between the second metal plate and the heat sink can be prevented.

An aspect of the power module of the present invention is characterized in that it comprises a power module substrate, which is an aspect of the present invention, and an electronic component mounted on the power module substrate.

According to the power module of this configuration, even in a case where the strength of bonding between the ceramic substrate and metal plate is high and the usage environment thereof is severe, the level of reliability thereof can be improved significantly.

An aspect of the method of producing a power module substrate of the present invention is a method of producing a power module substrate, which comprises a ceramic substrate, and a metal plate which is stacked and bonded on a surface of the ceramic substrate and which contains aluminum or an aluminum alloy. This production method includes: a fixation step for fixing one or more additional elements selected from Ag, Zn, Ge, Mg, Ca, Ga, and Li at least on either one of the bonding surface of the ceramic substrate and the bonding surface of the metal plate, thereby form a fixation layer containing these elements; a stacking step for stacking the ceramic substrate and the metal plate via the fixation layer; a heat application step for heating the stacked ceramic substrate and metal plate while pressure is being applied thereto in the stacked direction, to thereby form a molten metal region on the interface between the ceramic substrate and the metal plate; and a solidification step for solidifying the molten metal region to thereby bond the ceramic substrate and the metal plate with each other. In the stacking step, the additional elements are interposed in a range of greater than or equal to 0.01 mg/cm$^2$ and less than or equal to 10 mg/cm$^2$ in the interface between the ceramic substrate and the metal plate. In the heat application step, the additional elements are diffused toward the metal plate, and thereby, the molten metal region is formed on the interface between the ceramic substrate and the metal plate.

According to the method of producing a power module substrate configured in this manner, one or more additional elements selected from Ag, Zn, Ge, Mg, Ca, Ga, and Li are interposed in the bonding interface between the metal plate and the ceramic substrate. Here, since elements such as Ag, Zn, Ge, Mg, Ca, Ga, and Li lower the melting point of aluminum, a molten metal region can be formed on the interface between the metal plate and the ceramic substrate even under comparatively low temperature conditions.

Therefore, even if the bonding is performed under bonding conditions of a comparatively low temperature and a short period of time, the ceramic substrate and the metal plate can be strongly bonded with each other.

Moreover, there is no need for using a thin film of brazing filler material, and it is possible, at low cost, to produce a power module substrate having a metal plate and ceramic substrate reliably bonded with each other.

Since the ceramic substrate and the metal plate can be bonded with each other without using a thin film of brazing filler material, there is no need for performing operations for positioning a brazing filler material film. Therefore, for example, even in a case where a metal piece preliminarily formed in a circuit pattern shape is bonded on a ceramic substrate, problems associated with position displacement or the like can be prevented.

Moreover, in the stacking step, since the fixation amount of the additional elements interposed in the interface between the ceramic substrate and the metal plate is greater than or equal to 0.01 mg/cm$^2$, a molten metal region can be reliably formed on the interface between the ceramic substrate and the metal plate, and the ceramic substrate and the metal plate can be strongly bonded with each other.

Furthermore, since the fixation amount of the addition elements interposed in the interface between the ceramic substrate and the metal plate is less than or equal to 10 mg/cm$^2$, cracks can be prevented in the fixation layer, and a molten metal region can be reliably formed on the interface between the ceramic substrate and the metal plate. Furthermore, it is possible to prevent excessive diffusion of the additional elements toward the metal plate side, which causes an excessive increase in the strength of the metal plate in the vicinity of the interface. Accordingly, when a thermal cycle load is applied to the power module substrate, thermal stress can be absorbed by the metal plate, and cracks in the ceramic substrate can be prevented.

Furthermore, in the stacking step, the additional elements are interposed in a range of greater than or equal to 0.01 mg/cm$^2$ and less than or equal to 10 mg/cm$^2$ in the interface between the ceramic substrate and the metal plate. Therefore, it is possible to produce a power module substrate in which the Ag concentration in the metal plate in the vicinity of the interface with the ceramic substrate is greater than or equal to 0.05% by mass and less than or equal to 10% by mass, or the total concentration of Zn, Ge, Mg, Ca, Ga, and Li is greater than or equal to 0.01% by mass and less than or equal to 5% by mass.

In addition, since a fixation layer is formed directly on the metal plate and the ceramic substrate, an oxide layer is formed only on the surface of the metal plate. Accordingly, compared with those cases where there is used a thin film of brazing filler material having an oxide layer formed on both sides thereof, the total thickness of the oxide layer, which is present on the interface between the metal plate and the substrate, is thinner, and therefore, the yield rate of initial bonding can be improved.

Although the configuration is provided in a manner such that the additional elements are directly fixed at least on either one of the bonding surface of the ceramic substrate and the bonding surface of the metal plate, it is preferable that the additional elements are fixed on the bonding surface of the metal plate in terms of productivity.

Moreover, the additional elements, respectively, may be fixed separately at least on either one of the bonding surface of the ceramic substrate and the bonding surface of the metal plate, to thereby form a plurality of additional element layers.

In an aspect of the method of producing a power module substrate of the present invention, in the fixation step, Al may be fixed together with the additional elements.

In this case, since Al is fixed together with the additional elements, the fixation layer to be formed contains Al. Accordingly, in the heat application step, a molten metal region can be reliably formed by preferentially melting the fixation layer, and the ceramic substrate and the metal plate can be strongly bonded with each other. Moreover, oxidization of oxidatively active elements such as Mg, Ca, and Li can be prevented. In order to fix Al together with the additional elements, the additional elements and Al may be vapor-deposited at the same time. Sputtering may also be performed, using an alloy of the additional elements and Al as a target. Moreover, Al and additional elements may be stacked.

In an aspect of the method of producing a power module substrate of the present invention, the fixation step is preferably such that an Ag paste is applied at least on either one of the bonding surface of the ceramic substrate and the bonding surface of the metal plate to thereby form the fixation layer.

In this case, by applying an Ag paste, the fixation layer can be formed more reliably. Moreover, since Ag does not get oxidized even when the Ag paste is heated and sintered in air atmosphere, a fixation layer containing Ag can be easily formed.

When using an Ag paste, it is preferable that the Ag paste is applied on the ceramic substrate side in order to prevent oxidization of the metal plate when heated in air. Moreover, the configuration may be such that the metal plate and the ceramic substrate in a state of having an Ag paste applied thereon are stacked preliminarily, and then the Ag paste is sintered when heating the stacked ceramic substrate and the metal plate.

An aspect of the method of producing a power module substrate having a heat sink of the present invention, is a method of producing a power module substrate having a heat sink, which comprises: a ceramic substrate; a first metal plate which is bonded on one of the surfaces of the ceramic substrate, and which contains aluminum or an aluminum alloy; a second metal plate which is bonded on the other surface of the ceramic substrate, and which contains aluminum or an aluminum alloy; and a heat sink bonded on the surface of the second metal plate, which is the opposite side of the surface bonded with the ceramic substrate. This production method comprises: a ceramic substrate bonding step for respectively bonding the ceramic substrate and the first metal plate, and the ceramic substrate and the second metal plate, with each other; and a heat sink bonding step for bonding the heat sink on one surface of the second metal plate. In the heat sink bonding step, there are further provided: an additional element layer formation step for fixing one or more additional elements selected from Ag, Zn, Ge, Mg, Ca, Ga, and Li at least on either one of the bonding surface of the second metal plate and the bonding surface of the heat sink, to thereby form an additional element layer; a heat sink stacking step for stacking the second metal plate and the heat sink via the additional element layer; a heat sink heat application step for heating the stacked second metal plate and heat sink while pressure is being applied thereto in the stacked direction, to thereby form a molten metal region on the interface between the second metal plate and the heat sink; and a molten metal solidification step for solidifying the molten metal region to thereby bond the second metal plate and the heat sink with each other. In the heat sink heat application step, the additional elements of the additional element layer are diffused toward the second metal plate and the heat sink, and thereby, the molten metal region is formed on the interface between the second metal plate and the heat sink.

In the method of producing a power module substrate having a heat sink configured in this manner, one or more additional elements selected from Ag, Zn, Ge, Mg, Ca, Ga, and Li are interposed in the bonding interface between the second metal plate and the heat sink. Since elements such as these additional elements lower the melting point of aluminum, a molten metal region can be formed on the interface between the heat sink and the second metal plate even under comparatively low temperature conditions.

Therefore, even if the bonding is performed under bonding conditions of a comparatively low temperature and a short period of time, the heat sink and the second metal plate can be strongly bonded with each other.

Moreover, there is no need for using a thin film of Al—Si based brazing filler material, production of which can be difficult, and it is possible, at low cost, to produce a power module substrate having a heat sink with a second metal plate and a heat sink reliably bonded with each other.

Furthermore, since the additional elements are directly fixed at least on either one of the bonding surface of the heat sink and the bonding surface of the second metal plate without using a thin film of brazing filler material, there is no need for performing operations for positioning a brazing filler material film.

In addition, in those cases where the additional elements are directly fixed on the bonding surface of the heat sink and on the bonding surface of the second metal plate, an oxide layer is formed only on the surfaces of the second metal plate and the heat sink. Accordingly, the total thickness of the oxide layers present on the interface between the second metal plate and the heat sink becomes thin, and as a result, the yield rate of initial bonding is improved.

In an aspect of the method of producing a power module substrate having a heat sink of the present invention, the ceramic substrate bonding step and the heat sink bonding step may be performed at the same time.

In this case, by performing the ceramic substrate bonding step and the heat sink bonding step at the same time, the cost required for bonding can be reduced significantly. Moreover, since there is no need for performing heat application and cooling repeatedly, it is possible to reduce warpage of the power module substrate having a heat sink.

In an aspect of the method of producing a power module substrate having a heat sink of the present invention, in the additional element layer formation step, Al may be fixed together with the additional elements.

In this case, in the heat sink heat application step, a molten metal region can be reliably formed by preferentially melting the additional element layer, and the heat sink and the second metal plate can be strongly bonded with each other. Moreover, oxidization of oxidatively active elements such as Mg, Ca, and Li can be prevented. In order to fix Al together with the additional elements, the additional elements and Al may be vapor-deposited at the same time. Sputtering may also be performed, using an alloy of the additional elements and Al as a target. Moreover, Al and additional elements may be stacked.

In an aspect of the power module substrate having a heat sink and the production method thereof described above of the present invention, the thickness of the second metal plate may be greater than that of the first metal plate.

In this case, the rigidity on the side where the heat sink is provided may be made higher than that on the opposite side thereof. Thereby, it is possible to suppress warpage of the power module substrate having a heat sink.

Furthermore, in an aspect of the power module substrate having a heat sink and the production method thereof of the present invention, the second metal plate may be configured with a plurality of stacked metal plates.

In this case, thermal distortion attributed to a difference in the thermal expansion coefficient between the heat sink and the ceramic substrate can be sufficiently absorbed by the second metal plate, and cracks in the ceramic substrate can be suppressed.

Moreover, in an aspect of the method of producing a power module substrate or the method of producing a power module substrate having a heat sink described above of the present invention, the fixation step may be performed in a manner such that the additional elements are fixed on the bonding surface of any one of the ceramic substrate, the metal plate, the heat sink, and the second metal plate, by means of vapor deposition, CVD, sputtering, or cold spraying, or by applying a paste or ink which a powder is dispersed therein.

In this case, the additional elements can be reliably interposed on the bonding interface. Moreover, the fixation amount of the additional elements can be adjusted at a high level of precision, and the ceramic substrate and the metal plate, or the heat sink and the second metal plate can be strongly bonded with each other.

When using a paste containing the additional elements, it is preferable that the Ag paste is applied on the ceramic substrate side in order to prevent oxidization of the metal plate when heated in air. Moreover, the configuration may be such that the metal plate and the ceramic substrate in a state of having a paste containing the additional elements applied thereon are stacked preliminarily, and then the paste containing the additional elements is sintered when heating the stacked ceramic substrate and the metal plate while pressure is being applied thereto in the stacked direction.

Effect of the Invention

According to the present invention, it is possible to provide: a power module substrate with a high level of thermal cycle reliability, in which a metal plate and a ceramic substrate are reliably bonded with each other; a power module substrate having a heat sink; a power module provided with the power module substrate; a method of producing the power module substrate; and a method of producing a power module substrate having a heat sink.

BRIEF DESCRIPTION OF THE DRAWINGS

FIG. 2 is an explanatory diagram showing an Ag concentration distribution and a Ge concentration distribution of a circuit layer and a metal layer of the power module substrate of the first embodiment of the present invention.

FIG. 13 is an explanatory diagram showing an Ag concentration distribution of a circuit layer and a metal layer of the power module substrate of the third embodiment of the present invention.

BEST MODE FOR CARRYING OUT THE INVENTION

Hereunder, embodiments of the present invention are described, with reference to the accompanying drawings.

First, a first embodiment of the present invention is described, using FIG. 1 to FIG. 6.

Figure 1:
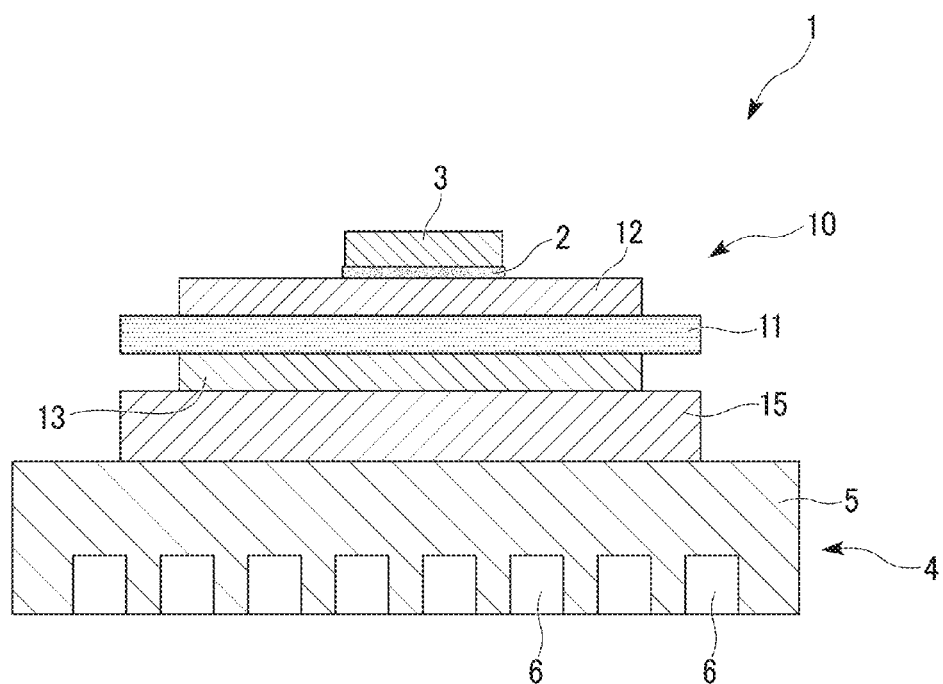
FIG. 1 is a schematic explanatory diagram of a power module which uses a power module substrate of a first embodiment of the present invention.

A power module 1 shown in FIG. 1 is provided with; a power module substrate 10 having a circuit layer 12 arranged thereon, a semiconductor chip 3 which is bonded via a solder layer 2 on a surface of the circuit layer 12, and a heat sink 4. Here, the solder layer 2, for example, is a Sn—Ag based, Sn—In based, or Sn—Ag—Cu based solder material. In the present embodiment, between the circuit layer 12 and the solder layer 2, there is provided a Ni-plating layer (not shown in the figure).

The power module substrate 10 is provided with; a ceramic substrate 11, the circuit layer 12 arranged on one of the surfaces of the ceramic substrate 11 (the upper surface in FIG. 1), and a metal layer 13 arranged on the other surface of the ceramic substrate 11 (the lower surface in FIG. 1).

The ceramic substrate 11 is to prevent electrical connection between the circuit layer 12 and the metal layer 13, and is composed of AlN (aluminum nitride), which is a highly insulative material. Moreover, the thickness of the ceramic substrate 11 is in a range of 0.2 to 1.5 mm, and in the present embodiment, it is 0.635 mm. In the present embodiment, as shown in FIG. 1, the width of the ceramic substrate 11 (the length in the left-right direction in FIG. 1) is greater than the width of the circuit layer 12 and the metal layer 13.

The circuit layer 12 is formed by bonding a metal plate 22 having conductivity onto one of the surfaces of the ceramic substrate 11. In the present embodiment, the metal plate 22, which serves as the circuit layer 12, is of a rolled plate composed of aluminum having a purity of 99.99% or more (so-called 4N aluminum).

The metal layer 13 is formed by bonding a metal plate 23 on the other surface of the ceramic substrate 11. In the present embodiment, the metal plate 23, which serves as the metal layer 13, is of a rolled plate composed of aluminum having a purity of 99.99% or more (so-called 4N aluminum).

The heat sink 4 is to cool the power module substrate 10 described above. The heat sink 4 is provided with a top plate part 5 to be bonded with the power module substrate 10, and flow passages 6 for supplying a cooling medium (for example cooling water) therethrough. The top plate part 5 of the heat sink 4 is configured preferably with a material having superior heat conductivity, and in the present embodiment, it is configured with A6063 (aluminum alloy).

Moreover, in the present embodiment, between the top plate part 5 of the heat sink 4 and the metal layer 13, there is provided a buffer layer 15. The buffer layer 15 contains aluminum, an aluminum alloy, or a composite material containing aluminum.

As shown in FIG. 2, on each bonding interface 30 between the ceramic substrate 11 and the circuit layer 12 (metal plate 22), and between the ceramic substrate 11 and the metal layer 13 (metal plate 23), there are solid-solubilized, in addition to Ag, one or more elements selected from Zn, Ge, Mg, Ca, Ga, and Li as additional elements in the circuit layer 12 (metal plate 22) and metal layer 13 (metal plate 23).

In the vicinity of each bonding interface 30 of the circuit layer 12 and the metal layer 13, there is formed a concentration gradient layer 33 in which the concentration of the one or more elements selected from Ag, Zn, Ge, Mg, Ca, Ga, and Li gradually decreases with moving away from the bonding interface 30 in the stacked direction. The total of Ag concentration and the concentration of the one or more elements selected from Zn, Ge, Mg, Ca, Ga, and Li in the circuit layer 12 and the metal layer 13 in the vicinity of the bonding interface 30 is in a range of greater than or equal to 0.05% by mass and less than or equal to 10% by mass.

In the present embodiment, as the additional elements, Ge, in addition to Ag, is solid-solubilized, and the total of the Ag concentration and the Ge concentration in the circuit layer 12 and the metal layer 13 in the vicinity of the bonding interface 30 is greater than or equal to 0.05% by mass and less than or equal to 10% by mass.

The Ag concentration and the Ge concentration in the circuit layer 12 and the metal layer 13 in the vicinity of the bonding interface 30 are average values of measurements made at five points located at 50 μm from the bonding interface 30 by means of EPMA analysis (spot diameter 30 μm). Moreover, the graph of FIG. 2 is found in a manner such that a line analysis is conducted in the stacked direction in the center portion of the circuit layer 12 (metal plate 22) and the metal layer 13 (metal plate 23), while taking the concentrations at the above positions away from the bonding interface 30 by 50 μm as a reference.

Figure 3:
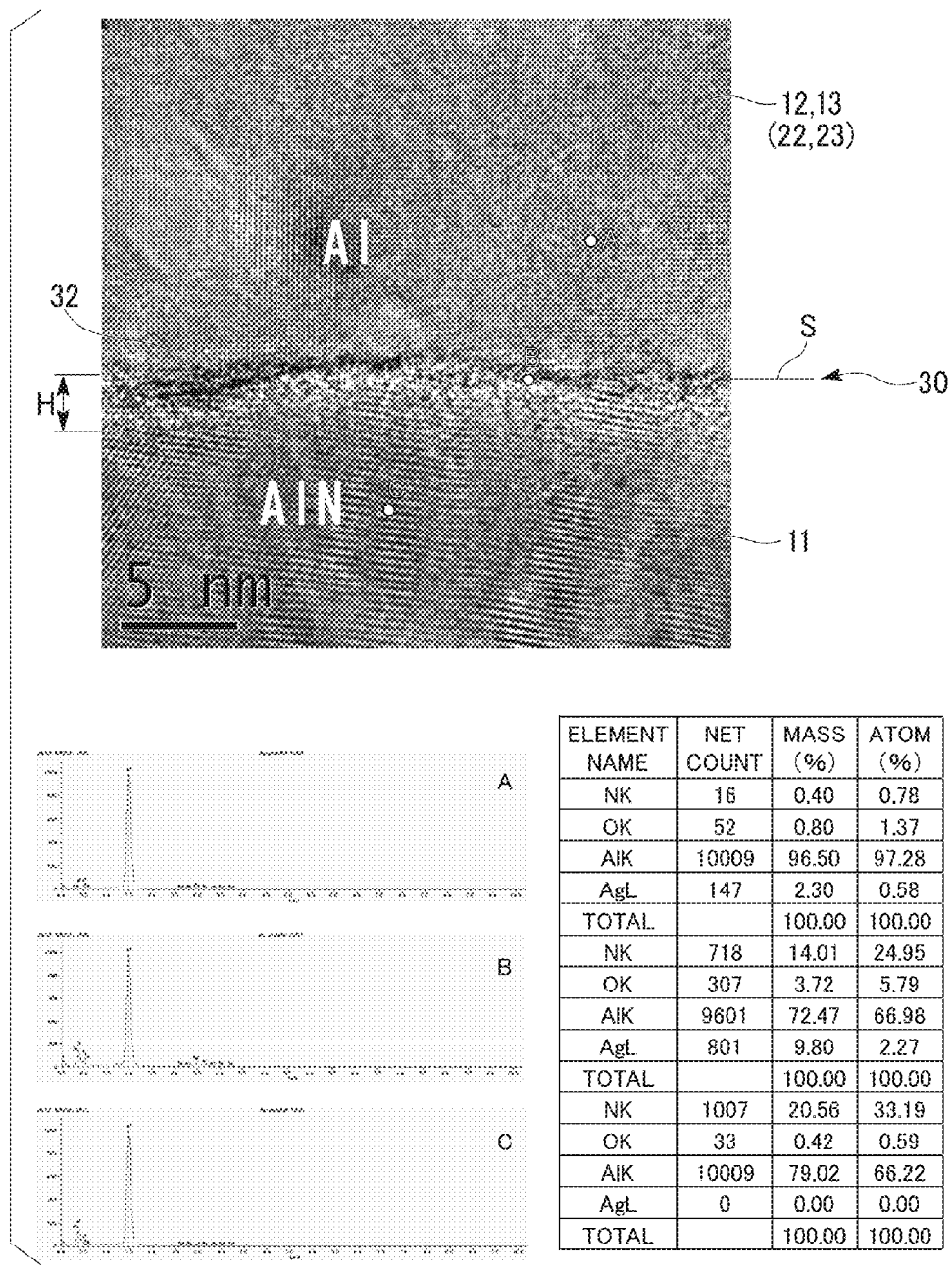
FIG. 3 is a TEM observation image of a bonding interface between the circuit layer and metal layer of the power module substrate according to the first embodiment of the present invention (metal plate), and a ceramic substrate.

Furthermore, when each bonding interface 30 between the ceramic substrate 11 and the circuit layer 12 (metal plate 22), and between the ceramic substrate 11 and the metal layer 13 (metal plate 23), is observed with a transmission electron microscope, an Ag high concentration part 32 in which Ag is concentrated in the bonding interface 30 is observed as shown in FIG. 3. In the Ag high concentration part 32, the Ag concentration is two or more times the Ag concentration in the circuit layer 12 (metal plate 22) and the metal layer 13 (metal plate 23). The thickness H of the Ag high concentration part 32 is less than or equal to 4 nm.

Furthermore, in the Ag high concentration part 32, the concentration of oxygen is higher than that the oxygen concentration in the ceramic substrate 11.

In the bonding interface 30 observed here, as shown in FIG. 3, the center part between the interface side end part of the lattice image of the circuit layer 12 (metal plate 22) and the metal layer 13 (metal plate 23), and the bonding interface side end part of the lattice image of the ceramic substrate 11, is taken as a reference plane S. Moreover, the Ag concentration in the circuit layer 12 (metal plate 22) and the metal layer 13 (metal plate 23) refers to the Ag concentration in a portion (point A in FIG. 3), distanced by a certain distance (5 nm or more in the present embodiment) from the bonding interface 30, of the circuit layer 12 (metal plate 22) and the metal layer 13 (metal plate 23).

Moreover, the oxygen concentration in the ceramic substrate 11 refers to the oxygen concentration within a crystal grain in a portion (point C in FIG. 3), distanced by a certain distance (5 nm or more in the present embodiment) from the bonding interface 30, of the ceramic substrate 11.

Furthermore, the mass ratio of Al, Ag, O, and N when the bonding interface 30 (point B in FIG. 3) is analyzed by means of energy dispersive X-ray analysis (EDS) is Al:Ag:O:N=50 to 90% by mass:1 to 30% by mass:1 to 10% by mass:25% by mass or less. The spot diameter when conducting the analysis by means of EDS is 1 to 4 nm. The bonding interface 30 is measured at several points (20 points in the present embodiment, for example), and the average value thereof is calculated. Moreover, the measurement is not to be made on the bonding surface 30 between the crystal grain boundary of the metal plates 22 and 23, which constitute the circuit layer 12 and the metal layer 13, and the ceramic substrate 11, and the measurement is to be made only on the bonding interface 30 between the crystal grains of the metal plates 22 and 23, which constitute the circuit layer 12 and the metal layer 13, and the ceramic substrate 11.

Figure 4:
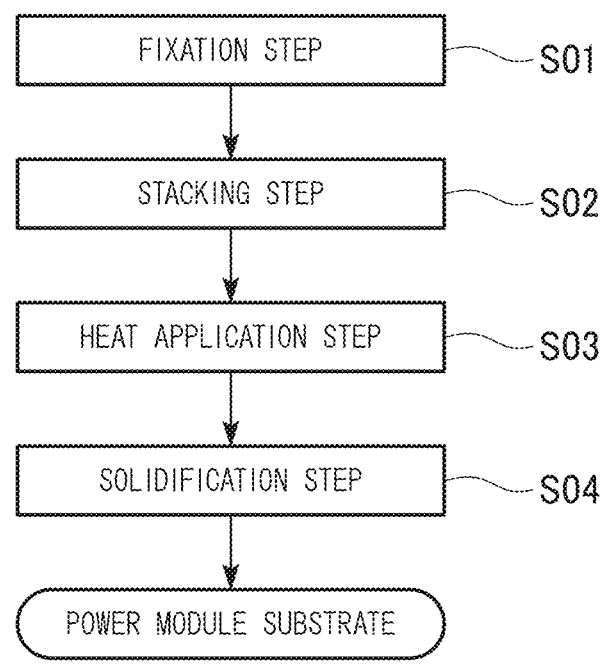
FIG. 4 is a flow chart showing a method of producing a power module substrate according to the first embodiment of the present invention.
Figure 5:
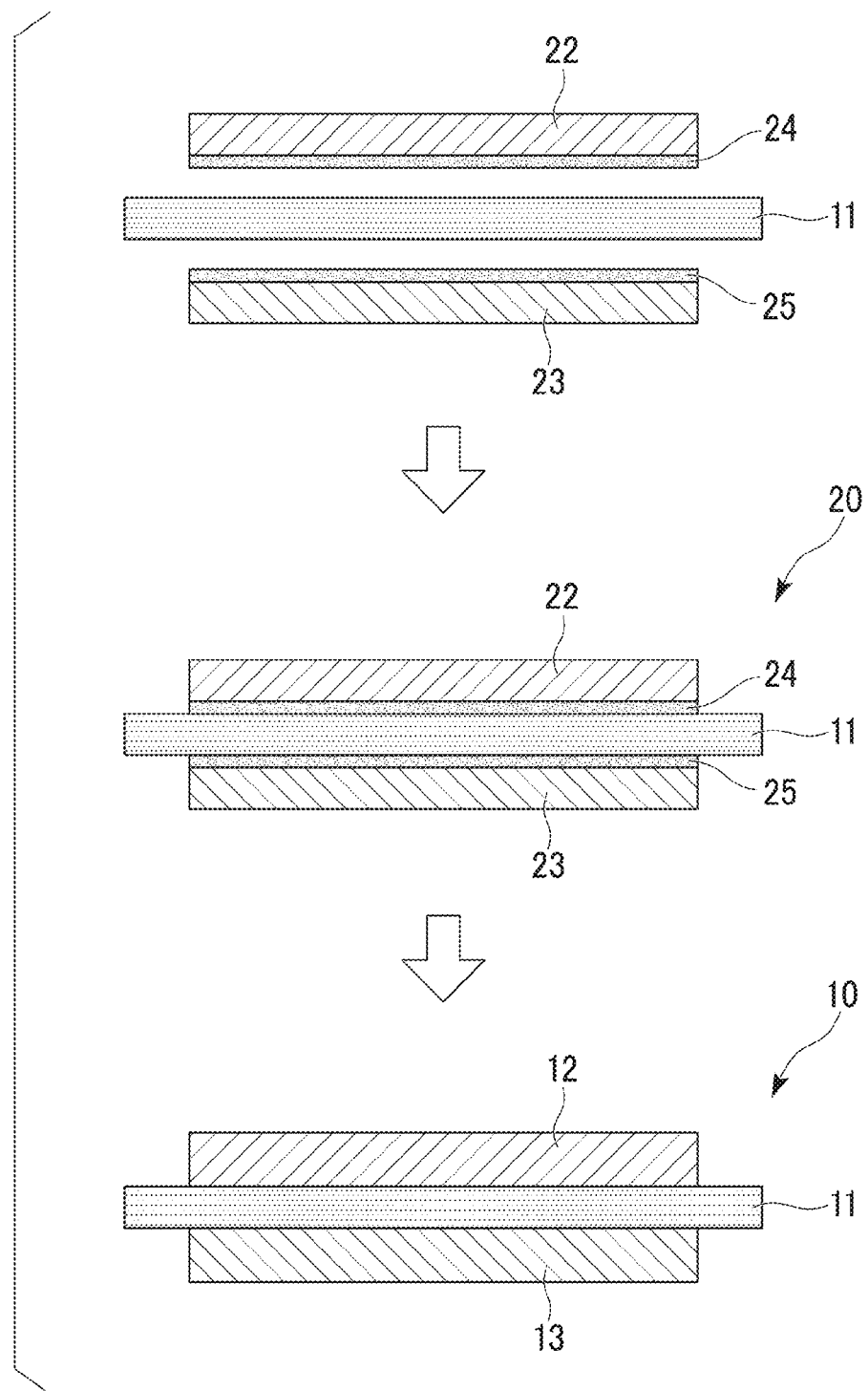
FIG. 5 is an explanatory diagram showing the method of producing a power module substrate according to the first embodiment of the present invention.
Figure 6:
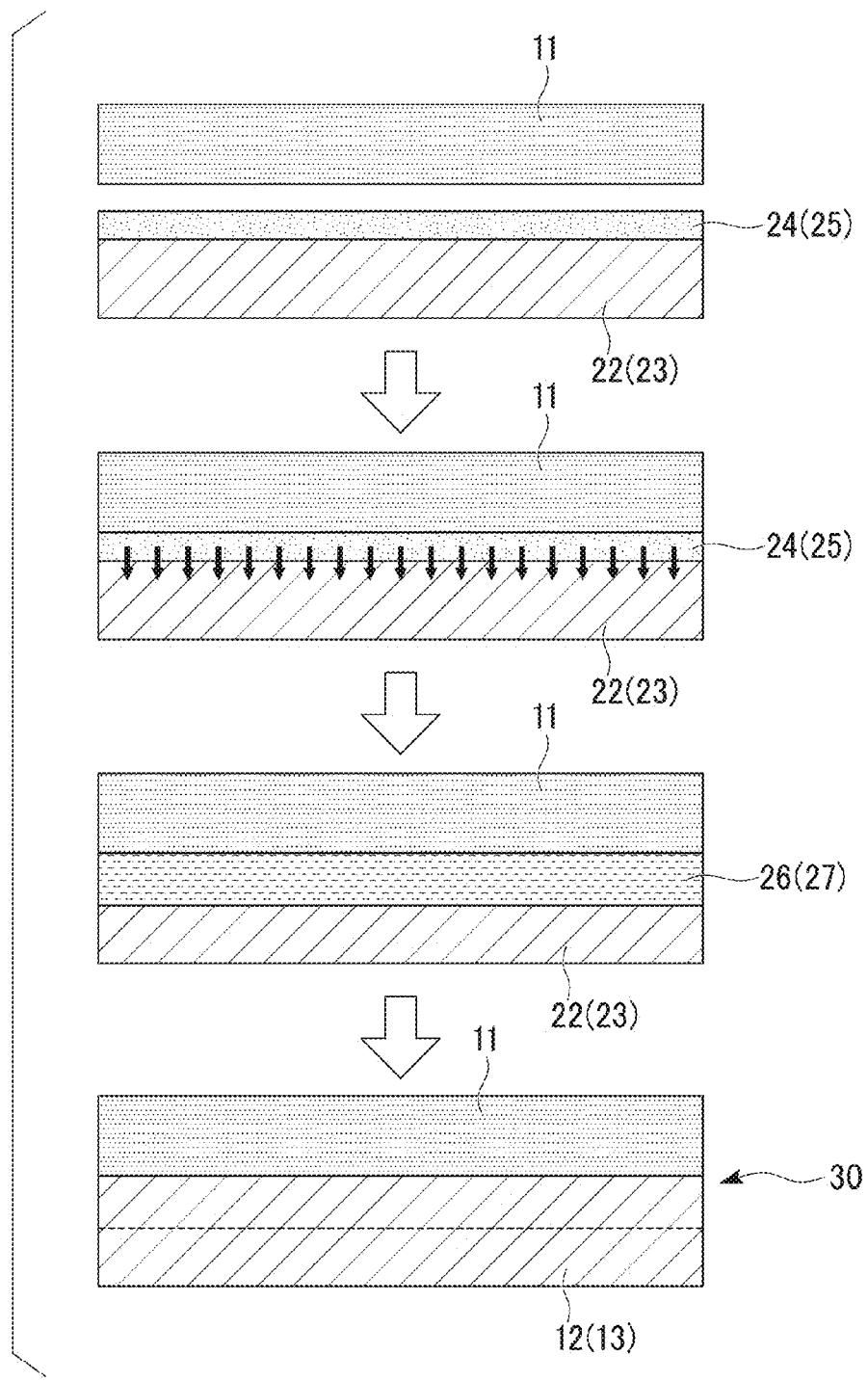
FIG. 6 is an explanatory diagram showing the vicinity of the bonding interface between the metal plate and the ceramic substrate in FIG. 5.

Hereunder, the method of producing the power module substrate 10, which is the first embodiment of the present invention, is described, with reference to FIG. 4 to FIG. 6.

(Fixation Step S01)

First, as shown in FIG. 5 and FIG. 6, as additional elements, one or more elements selected from Ag, Zn, Ge, Mg, Ca, Ga, and Li are fixed on each bonding surface of the metal plates 22 and 23 by means of sputtering, to thereby form fixation layers 24 and 25.

Here, in the present embodiment, Ag and Ge are used as additional elements. The amount of Ag in the fixation layers 24 and 25 is greater than or equal to 0.01 mg/cm$^2$ and less than or equal to 10 mg/cm$^2$. The amount of Ge is greater than or equal to 0.01 mg/cm$^2$ and less than or equal to 10 mg/cm$^2$.

(Stacking Step S02)

Next, as shown in FIG. 5, the metal plate 22 is stacked on one surface side of the ceramic substrate 11. Moreover, the metal plate 23 is stacked on the other surface side of the ceramic substrate 11. At this time, as shown in FIG. 5 and FIG. 6, the stack is made so that the surfaces of the metal plates 22 and 23 with the fixation layers 24 and 25 formed thereon face the ceramic substrate 11. That is to say, the fixation layer 24 (Ag and Ge) is interposed between the metal plate 22 and the ceramic substrate 11, and the fixation layer 25 (Ag and Ge) is interposed between the metal plate 23 and the ceramic substrate 11. A stacked body 20 is formed in this manner.

(Heat Application Step S03)

Next, the stacked body 20 formed in the stacking step S02 is placed into and heated in a vacuum heating furnace while pressure (pressure, 1 to 35 kgf/cm$^2$) is being applied thereto in the stacked direction thereof. Thereby, as shown in FIG. 6, a molten metal region 26 is formed on the interface between the metal plate 22 and the ceramic substrate 11, and a molten metal region 27 is formed on the interface between the metal plate 23 and the ceramic substrate 11. As shown in FIG. 6, Ag and Ge in the fixation layers 24 and 25 are diffused toward the metal plates 22 and 23. Consequently the Ag concentration and the Ge concentration in the metal plates 22 and 23 in the vicinity of the fixation layers 24 and 25 rise, and the melting point thereof is lowered. Thereby, these molten metal regions 26 and 27 are formed. In a case where the above pressure is less than 1 kgf/cm$^2$, bonding between the ceramic substrate 11 and the metal plates 22 and 23 may not be performed well. Moreover, if the above pressure exceeds 35 kgf/cm$^2$, the metal plates 22 and 23 may deform. Therefore, the above pressure to be applied is preferably in a range of 1 to 35 kgf/cm$^2$.

Here, in the present embodiment, the pressure within the vacuum heating furnace is in a range of $10^{-3}$ to $10^{-6}$ Pa, and the heat application temperature is in a range of greater than or equal to 550° C. and less than or equal to 650° C.

(Solidification Step S04)

Next, in the state where the molten metal regions 26 and 27 have been formed, the temperature is maintained constant. Consequently, Ag and Ge in the molten metal regions 26 and 27 are further diffused toward the metal plates 22 and 23. As a result, the Ag concentration and the Ge concentration in the portions that served as the molten metal regions 26 and 27 gradually decrease, and the melting point thereof rises. Consequently, solidification progresses while the temperature is maintained constant. That is to say, the ceramic substrate 11 and the metal plates 22 and 23 are bonded with each other by means of so-called diffusion bonding (transient liquid phase diffusion bonding). After solidification has progressed in this manner, cooling is performed to the normal temperature.

As a result, the metal plates 22 and 23, which serve as the circuit layer 12 and the metal layer 13, and the ceramic substrate 11 are bonded with each other, and the power module substrate 10 of the present embodiment is produced.

In the power module substrate 10 and the power module 1 of the present embodiment configured as described above, since there is provided the fixation step S01, in which Ge, in addition to Ag, is fixed on the bonding surface of the metal plates 22 and 23, then Ag and Ge are interposed on the bonding interface 30 between the ceramic substrate 11 and the metal plates 22 and 23. Here, since elements such as Ag and Ge lower the melting point of aluminum, a molten metal region can be formed on the interface between the metal plate and the ceramic substrate even under comparatively low temperature conditions.

Furthermore, since the ceramic substrate 11 and the circuit layer 12 (metal plate 22) and the metal layer 13 (metal plate 23) are bonded with each other by having Ag and Ge of the fixation layers 24 and 25 diffused toward the metal plates 22 and 23, the ceramic substrate 11 and the metal plates 22 and 23 can be strongly bonded with each other even if the bonding is performed under bonding conditions of comparatively low temperature and a short period of time.

Moreover, in the bonding interface 30 between the ceramic substrate 11 and the circuit layer 12 (metal plate 22), and between the ceramic substrate 11 and the metal layer 13 (metal plate 23), Ag and Ge are solid-solubilized in the circuit layer 12 (metal plate 22) and in the metal layer 13 (metal plate 23). The total of the Ag concentration and Ge concentration in the circuit layer 12 and the metal layer 13 respectively on the bonding interface 30 side is greater than or equal to 0.05% by mass and less than or equal to 10% by mass. Accordingly, the portion of the circuit layer 12 (metal plate 22) and the metal layer 13 (metal plate 23) on the bonding interface 30 side is strengthened by solid solution strengthening, and cracks in the circuit layer 12 (metal plate 22) and the metal layer 13 (metal plate 23) can be prevented.

Moreover, in the heat application step S03, Ag and Ge are sufficiently diffused toward the metal plates 22 and 23, and the metal plates 22 and 23 are strongly bonded with the ceramic substrate 11.

Furthermore, in the present embodiment, the ceramic substrate 11 is composed of AlN, and in each bonding interface 30 between the ceramic substrate 11 and the metal plates 22 and 23, which serve as the circuit layer 12 and the metal layer 13, there is formed an Ag high concentration part 32 having concentrated Ag therein. Since the Ag concentration in the Ag high concentration part 32 is two or more times the Ag concentration in the circuit layer 12 (metal plate 22) and the metal layer 13 (metal plate 23), it is possible, with Ag atoms present in the vicinity of the interface, to improve the bonding strength between the ceramic substrate and the metal plates. Furthermore, since the thickness of the Ag high concentration part 32 is less than or equal to 4 nm, crack occurrence in the Ag high concentration part 32 associated with the stress exerted when a thermal cycle load is being applied, is suppressed.

Furthermore, in the present embodiment, the mass ratio of Al, Ag, O, and N obtained by analyzing the bonding interface 30 by means of an energy dispersive X-ray analysis method is Al:Ag:O:N=50 to 90% by mass:1 to 30% by mass:1 to 10% by mass:25% by mass or less. As a result, the excessive production of reaction products from Al and Ag in the bonding interface 30, that inhibits bonding can be prevented, and the effect of improving bonding strength with Ag atoms can be achieved sufficiently. Moreover, the presence of a portion with a high level of oxygen concentration in the bonding interface 30 can be prevented, and crack occurrence when a thermal cycle load is being applied, is suppressed.

Moreover, since there is no need for using a thin film of Al—Si based brazing filler material, production of which can be difficult, the power module substrate 10 can be produced at low cost. Furthermore, there is no need for performing operations for positioning a brazing filler material film, and the ceramic substrate 11 can be reliably bonded with the metal plates 22 and 23. Therefore, the power module substrate 10 can be efficiently produced.

In addition, since the fixation layers 24 and 25 are formed on the bonding surface of the metal plates 22 and 23, the oxide layer interposed on the interface between the ceramic substrate 11 and the metal plates 22 and 23 is present only on the surface of the metal plates 22 and 23, and accordingly, initial bonding yield rate can be improved.

Next, a second embodiment of the present invention is described, with reference to FIG. 7 to FIG. 11.

Figure 7:
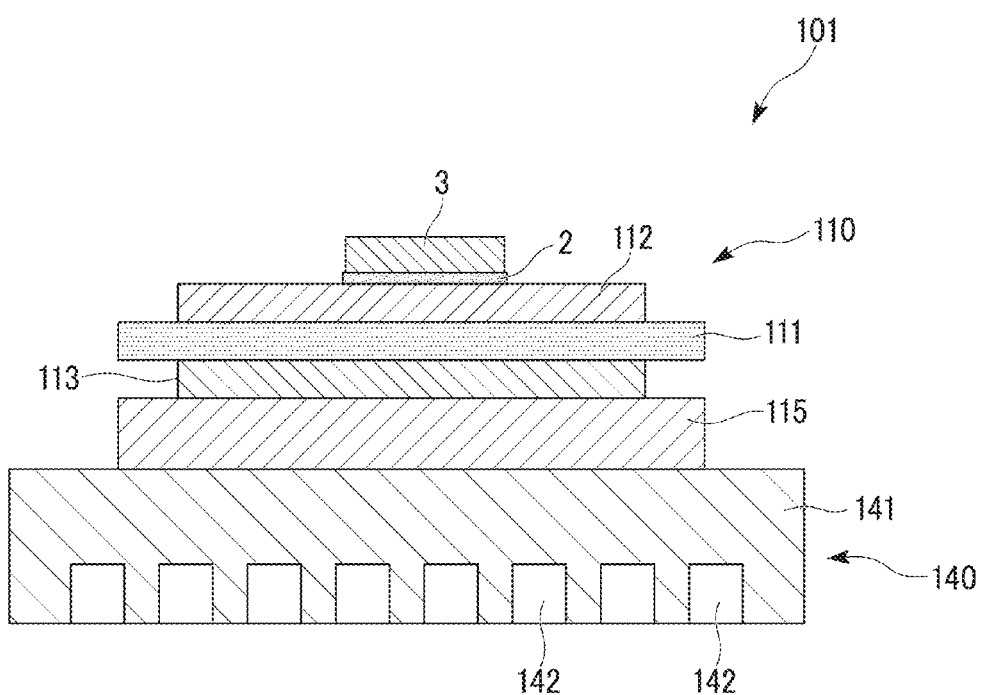
FIG. 7 is a schematic explanatory diagram of a power module which uses a power module substrate of a second embodiment of the present invention.

A power module 101 shown in FIG. 7 is provided with; a power module substrate 110 having a circuit layer 112 arranged thereon, a semiconductor chip 3 which is bonded via a solder layer 2 on a surface of the circuit layer 112, and a heat sink 140.

The power module substrate 110 is provided with; a ceramic substrate 111, the circuit layer 112 arranged on one of the surfaces of the ceramic substrate 111 (the upper surface in FIG. 7), and a metal layer 113 arranged on the other surface of the ceramic substrate 111 (the lower surface in FIG. 7).

The ceramic substrate 111 is composed of $Al_2O_3$ (alumina), which is a highly insulative material. Moreover, the thickness of the ceramic substrate 111 is in a range of 0.2 to 1.5 mm, and in the present embodiment, it is 0.635 mm.

The circuit layer 112 is formed by bonding a first metal plate 122 having conductivity onto one of the surfaces of the ceramic substrate 111.

The metal layer 113 is formed by bonding a second metal plate 123 on the other surface of the ceramic substrate 111.

In the present embodiment, the first metal plate 122 and the second metal plate 123 are of rolled plates each composed of aluminum having a purity of 99.99% or more.

The heat sink 140 is to cool the power module substrate 110 described above. The heat sink 140 is provided with a top plate part 141 to be bonded with the power module substrate 110, and flow passages 142 for supplying a cooling medium therethrough. The top plate part 141 of the heat sink 140 is configured preferably with a material having superior heat conductivity, and in the present embodiment, it is configured with A6063 (aluminum alloy).

In the present embodiment, between the top plate 141 of the heat sink 140 and the metal layer 113, there is provided a buffer layer 115 containing aluminum, an aluminum alloy, or a composite material containing aluminum (such as AlSiC).

Figure 8:
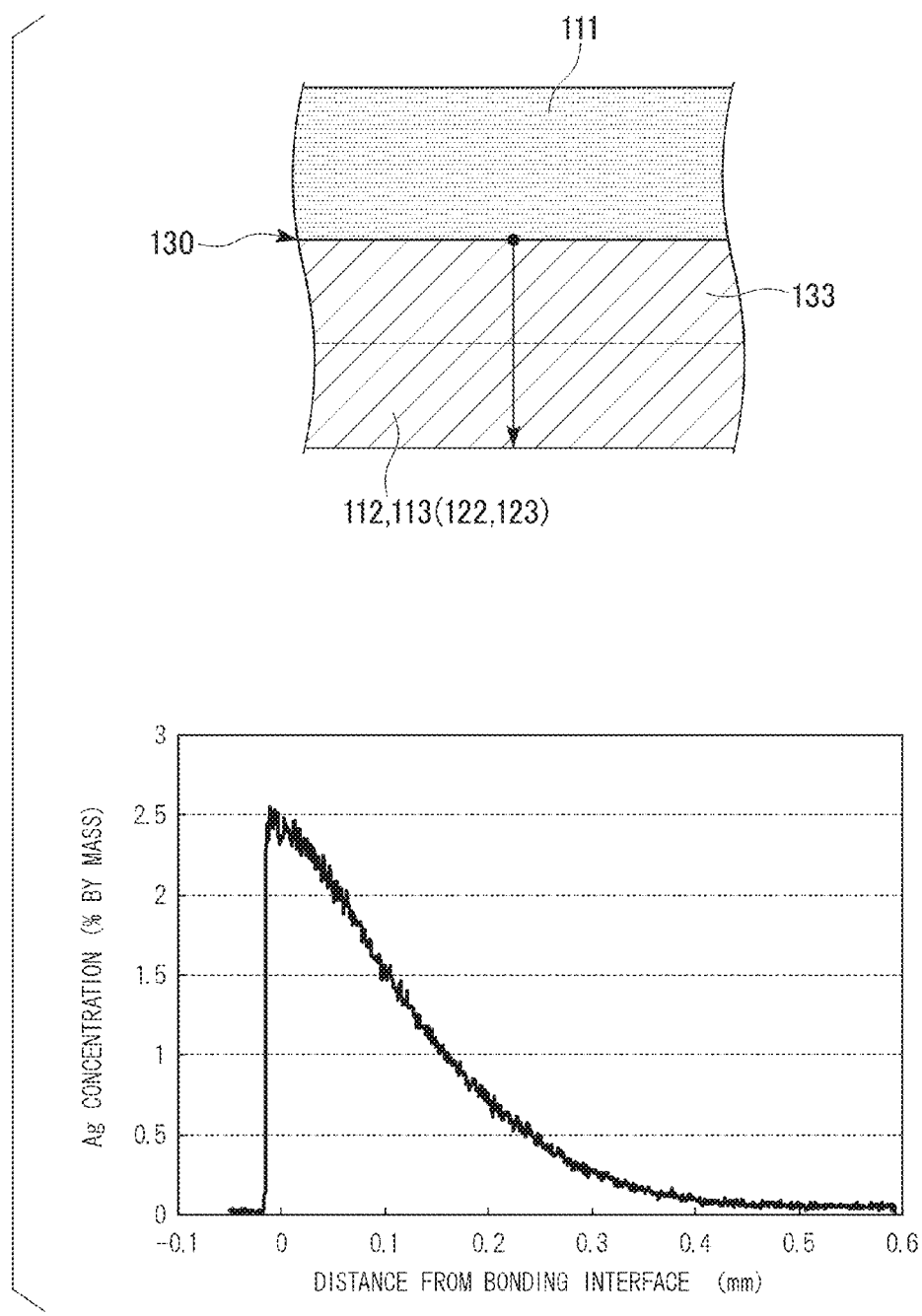
FIG. 8 is an explanatory diagram showing an Ag concentration distribution of a circuit layer and a metal layer of the power module substrate of the second embodiment of the present invention.

As shown in FIG. 8, in each bonding interface 130 between the ceramic substrate 111 and the circuit layer 112 (metal plate 122) and the metal layer 113 (metal plate 123), Ag is solid-solubilized in the circuit layer 112 (metal plate 122) and the metal layer 113 (metal plate 123).

To describe in detail, in the vicinity of each bonding interface 130 of the circuit layer 112 and the metal layer 113, there is formed a concentration gradient layer 133 in which the Ag concentration gradually decreases with moving away from the bonding interface 130 in the stacked direction. Here, the Ag concentration in the circuit layer 112 and the metal layer 113 in the vicinity of the bonding interface 130 is greater than or equal to 0.05% by mass and less than or equal to 10% by mass.

The Ag concentration in the circuit layer 112 and the metal layer 113 in the vicinity of the bonding interface 130 is an average value of measurements made at five points located at 50 μm from the bonding interface 130, by means of EPMA analysis (spot diameter 30 μm). Moreover, the graph of FIG. 8 is found in a manner such that a line analysis is conducted in the stacked direction in the center portion of the circuit layer 112 (metal plate 122) and the metal layer 113 (metal plate 123), while taking the concentrations at the above positions away from the bonding interface 130 by 50 μm as a reference.

Figure 9:
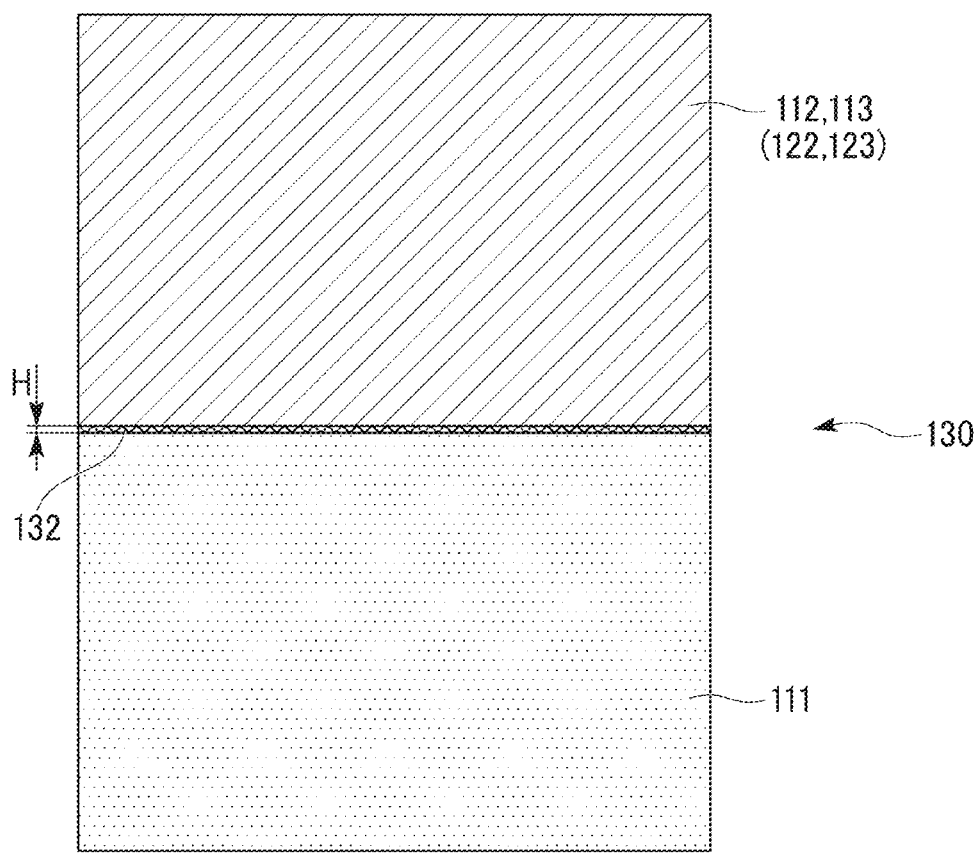
FIG. 9 is a schematic diagram of a bonding interface between the circuit layer and a ceramic substrate, and between the metal layer (metal plate) and the ceramic substrate of the power module substrate according to the second embodiment of the present invention.
Figure 10:
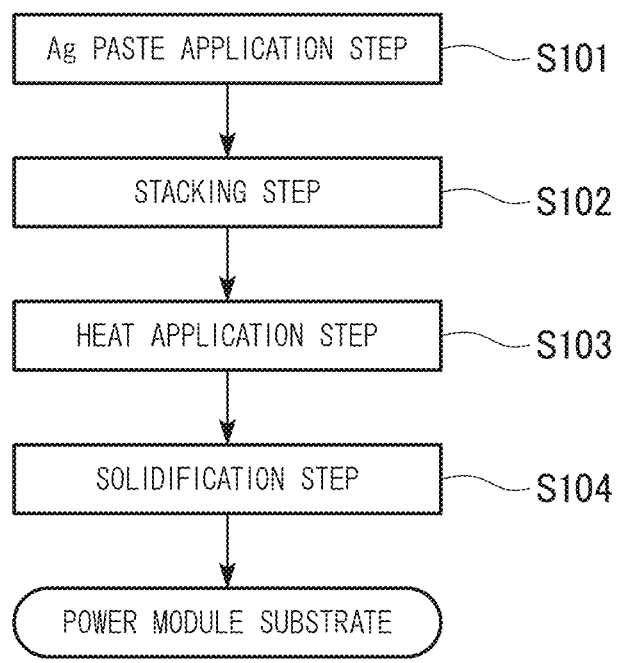
FIG. 10 is a flow chart showing a method of producing a power module substrate according to the second embodiment of the present invention.

Furthermore, when each bonding interface 130 between the ceramic substrate 111, and the circuit layer 112 (metal plate 122) and the metal layer 113 (metal plate 123) is observed with a transmission electron microscope, an Ag high concentration part 132 in which Ag is concentrated in the bonding interface 130 is observed as shown in FIG. 9. In the Ag high concentration part 132, the Ag concentration is two or more times the Ag concentration in the circuit layer 112 (metal plate 122) and the metal layer 113 (metal plate 123). The thickness H of the Ag high concentration part 132 is less than or equal to 4 nm.

In the bonding interface 130 observed here, as shown in FIG. 9, the center part between the interface side end part of the lattice image of the circuit layer 112 (metal plate 122) and the metal layer 113 (metal plate 123), and the bonding interface side end part of the lattice image of the ceramic substrate 111, is taken as a reference plane S. Moreover, the Ag concentration in the circuit layer 112 (metal plate 122) and the metal layer 113 (metal plate 123) refers to the Ag concentration in a portion, distanced by a certain distance (5 nm or more in the present embodiment) from the bonding interface 130, of the circuit layer 112 (metal plate 122) and the metal layer 113 (metal plate 123).

Furthermore, the mass ratio of Al, Ag, and O when the bonding interface 130 is analyzed by means of energy dispersive X-ray analysis (EDS) is Al:Ag:O=50 to 90% by mass:1 to 30% by mass:45% by mass or less. The spot diameter when conducting the analysis by means of EDS is 1 to 4 nm. The bonding interface 130 is measured at several points (20 points in the present embodiment, for example), and the average value thereof is calculated. Moreover, the measurement is not to be made on the bonding surface 130 between the ceramic substrate 111 and the crystal grain boundary of the metal plates 122 and 123, which constitute the circuit layer 112 and the metal layer 113, and the measurement is to be made only on the bonding interface 130 between the ceramic substrate 111 and the crystal grains of the metal plates 122 and 123, which constitute the circuit layer 112 and the metal layer 113.

Hereunder, a method of producing the power module substrate configured as described above is described, with reference to FIG. 10 and FIG. 11.

(Ag Paste Application Step S101)

Figure 11:
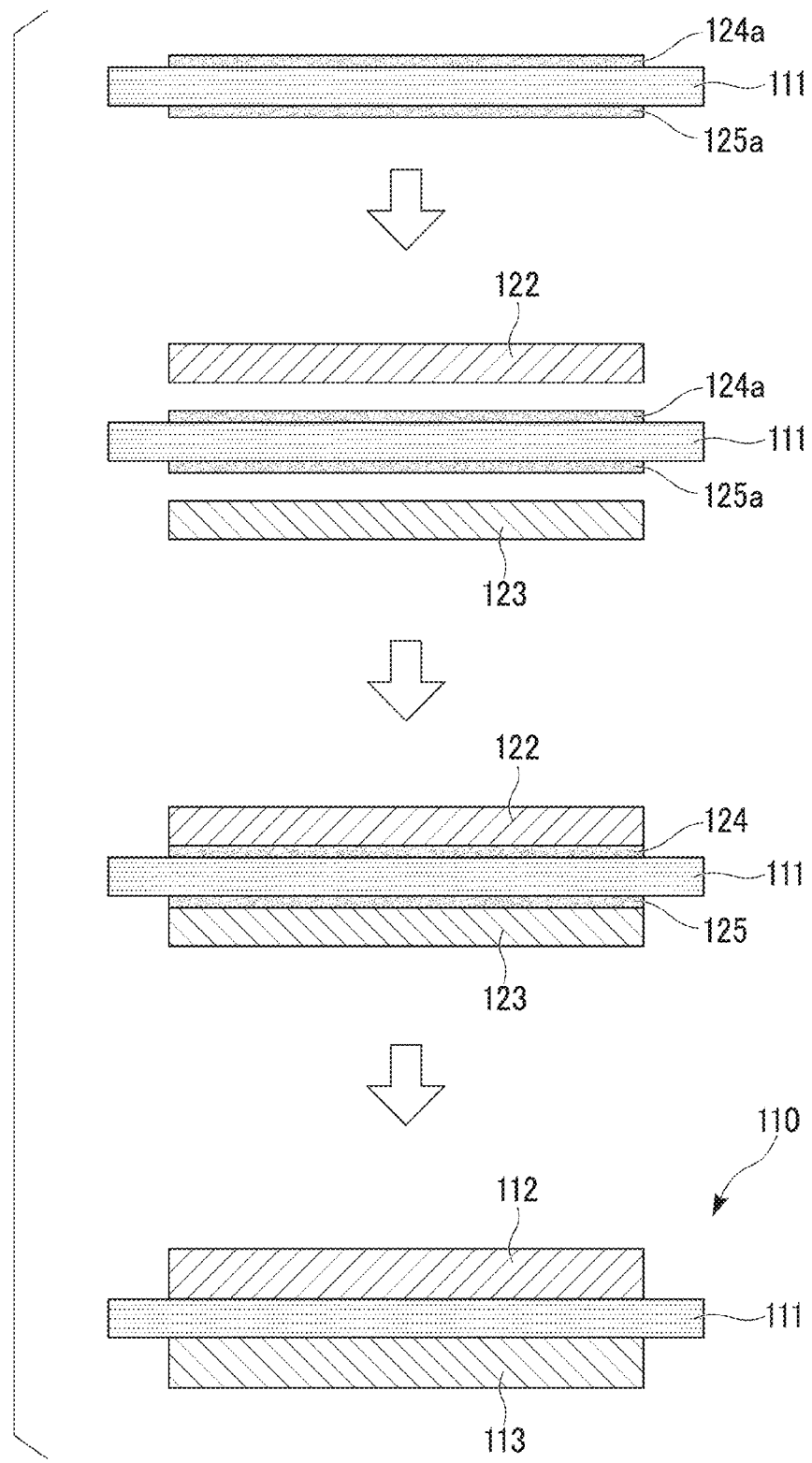
FIG. 11 is an explanatory diagram showing the method of producing a power module substrate according to the second embodiment of the present invention.

First, as shown in FIG. 11, an Ag paste is applied on one surface and the other surface of the ceramic substrate 111 by means of screen printing, to thereby form Ag paste layers 124a and 125a. The thicknesses of the Ag paste layers 124a and 125a are approximately 0.02 to 200 µm after being dried.

After having heated these Ag paste layers 124a and 125a to 150 to 200° C. and removed the solvent, they are sintered at 300 to 500° C. to sinter a decomposed Ag paste layer.

The Ag paste used here contains Ag powder, a resin, a solvent, and a dispersant. The amount of the contained Ag powder is greater than or equal to 60% by mass and less than or equal to 90% by mass of the entire Ag paste, and the remainders thereof are the resin, the solvent, and the dispersant. The amount of the contained Ag powder is 85% by mass of the entire Ag paste.

Moreover, in the present embodiment, the viscosity of the Ag paste is adjusted to be greater than or equal to 10 Pa·s and less than or equal to 500 Pa·s, or more preferably greater than or equal to 50 Pa·s and less than or equal to 300 Pa·s.

The grain diameter of the Ag powder is greater than or equal to 0.05 µm and less than or equal to 1.0 µm, and Ag powder with an average grain diameter of 0.8 µm is used in the present embodiment.

A solvent with a boiling point of 200° C. or higher is suitable, and for example, α-terpineol, butyl carbitol acetate, diethylene glycol dibutyl ether, or the like may be applied. In the present embodiment, diethylene glycol dibutyl ether is used.

The resin is to adjust the viscosity of the Ag paste, and a resin which is decomposed at 500° C. or higher is suitable. For example, an acrylic resin, an alkyd resin, or the like may be applied. In the present embodiment, ethyl cellulose is used.

Moreover, in the present embodiment, a dicarboxylic acid based dispersant is added. The Ag paste may also be configured without adding a dispersant.

(Stacking Step S102)

Next, the metal plate 122 is stacked on the one surface side of the ceramic substrate 111. Also, the metal plate 123 is stacked on the other surface side of the ceramic substrate 111.

(Heat Application Step S103)

Next, the metal plate 122, the ceramic substrate 111, and the metal plate 123 are placed into and heated in a vacuum heating furnace while pressure (pressure, 1 to 35 kgf/cm$^2$) is being applied thereto in the stacked direction thereof. At this time, during the course of increasing the temperature, when the temperature is 400 to 500° C., the resin within the decomposed Ag paste is removed, and Ag sintered layers 124 and 125 are formed. These Ag sintered layers 124 and 125 serve as Ag fixation layers in the present embodiment.

Moreover, by applying heat further, Ag in the Ag sintered layers 124 and 125 is diffused toward the metal plates 122 and 123, and a molten metal region is formed in each interface between the ceramic substrate 111 and the metal plates 122 and 123. Here, in the present embodiment, the pressure within the vacuum heating furnace is greater than or equal to $10^{-6}$ Pa and less than or equal to $10^{-3}$ Pa, and the heat application temperature is greater than or equal to 600° C. and less than or equal to 650° C.

(Solidification Step S104)

Next, the temperature is maintained constant in the state where the molten metal region has been formed, and Ag in the molten metal region is further diffused toward the metal plates 122 and 123. As a result, the Ag concentration in the portion that served as the molten metal region gradually decreases and the melting point thereof rises. Consequently, solidification progresses while the temperature is maintained constant. That is to say, the ceramic substrate 111 and the metal plates 122 and 123 are bonded with each other by means of so-called diffusion bonding (transient liquid phase diffusion bonding). After solidification has progressed in this manner, cooling is performed to the normal temperature.

In this manner, the power module substrate 110 is produced.

In the power module substrate 110 and the power module 101 of the present embodiment configured as described above, the ceramic substrate 111 and the circuit layer 112 (metal plate 122) are bonded with each other by having Ag in the Ag sintered layer 124 formed on the one surface of the ceramic substrate 111 diffused toward the metal plate 122. Moreover, Ag in the Ag sintered layer 125 formed on the other surface of the ceramic substrate 111 is diffused toward the metal plate 123, and thereby the ceramic substrate 111 and the metal layer 113 (metal plate 123) are bonded with each other. Therefore, even if the bonding is performed under bonding conditions of a comparatively low temperature and a short period of time, the ceramic substrate 111 and the metal plates 122 and 123 can be strongly bonded with each other.

Furthermore, in the bonding interface 130 between the ceramic substrate 111 and the circuit layer 112, and in the bonding interface 130 between the ceramic substrate 111 and the metal layer 113, Ag is solid-solubilized in the circuit layer 112 and the metal layer 113. Since the Ag concentration in the circuit layer 112 and the metal layer 113 respectively on the bonding interface 130 side is greater than or equal to 0.05% by mass and less than or equal to 10% by mass, the bonding interface 130 side portions of the circuit layer 112 and the metal layer 113 are solid-solubilized, and cracks in the circuit layer 112 and the metal layer 113 can be prevented.

Furthermore, in the present embodiment, the ceramic substrate 111 is composed of $Al_2O_3$, and in each bonding interface 130 between the ceramic substrate 111 and the metal plates 122 and 123, which serve as the circuit layer 112 and the metal layer 113, there is formed an Ag high concentration part 132 having concentrated Ag therein. Since the Ag concentration in the Ag high concentration part 132 is two or more times the Ag concentration in the circuit layer 112 and the metal layer 113, it is possible, with Ag atoms present in the vicinity of the interface, to improve the bonding strength between the ceramic substrate and the metal plates. Furthermore, since the thickness of the Ag high concentration part 132 is less than or equal to 4 nm, crack occurrence in the Ag high concentration part 132 associated with the stress exerted when a thermal cycle load is being applied, is suppressed.

Furthermore, in the present embodiment, the mass ratio of Al, Ag, and O obtained by analyzing the bonding interface 130 by means of an energy dispersive X-ray analysis method is Al:Ag:O=50 to 90% by mass:1 to 30% by mass:45% by mass or less. As a result, the excessive production of reaction products from Al and Ag in the bonding interface 130, that inhibits bonding can be prevented. Moreover, the effect of improving the bonding strength with Ag atoms can be sufficiently achieved.

Moreover, in the present embodiment, since the Ag sintered layers 124 and 125, which are the sintered Ag paste layers 124a and 125a, serve as Ag fixation layers, Ag can be reliably interposed between the ceramic substrate 111 and the metal plates 122 and 123. Moreover, since Ag does not get oxidized even when the Ag paste is heated and sintered in air atmosphere, the Ag sintered layers 124 and 125 can be comparatively easily formed.

Next, a third embodiment of the present invention is described, with reference to FIG. 12 to FIG. 17.

Figure 12:
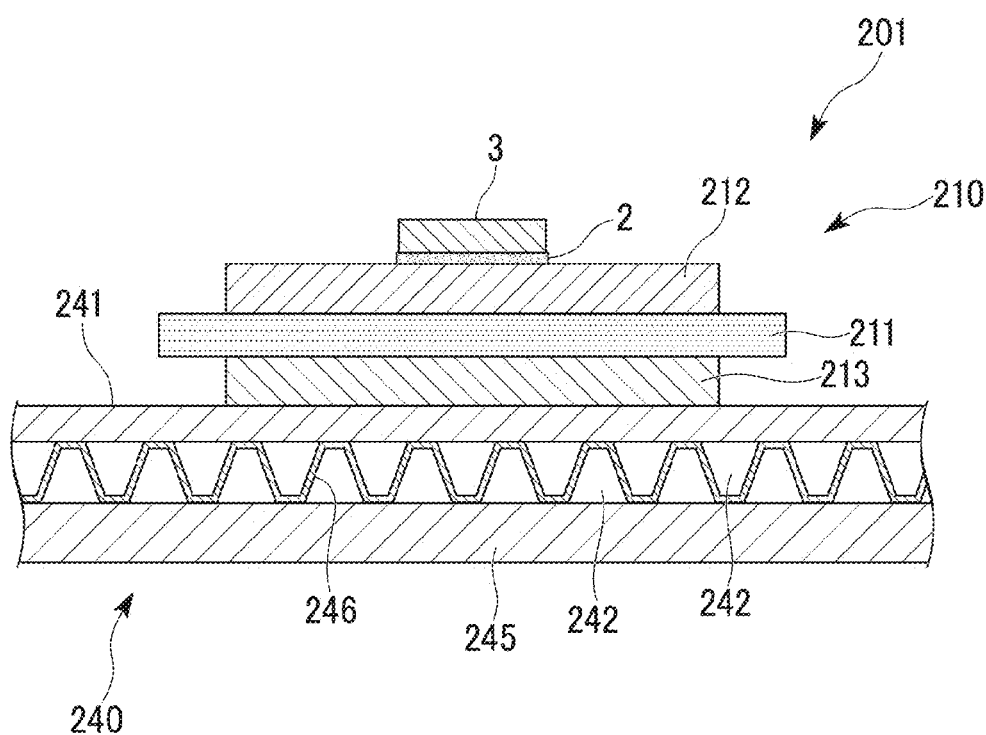
FIG. 12 is a schematic explanatory diagram of a power module which uses a power module substrate of a third embodiment of the present invention.

A power module 201 shown in FIG. 12 is provided with; a power module substrate 210 having a circuit layer 212 arranged thereon, a semiconductor chip 3 which is bonded via a solder layer 2 on a surface of the circuit layer 212, and a heat sink 240.

The power module substrate 210 is provided with; a ceramic substrate 211, the circuit layer 212 arranged on one of the surfaces of the ceramic substrate 211 (the upper surface in FIG. 12), and a metal layer 213 arranged on the other surface of the ceramic substrate 211 (the lower surface in FIG. 12).

The ceramic substrate 211 is composed of $Si_3N_4$ (silicon nitride), which is a highly insulative material. Moreover, the thickness of the ceramic substrate 211 is in a range of 0.2 to 1.5 mm, and in the present embodiment, it is 0.32 mm.

The circuit layer 212 is formed by bonding a first metal plate 222 having conductivity onto one of the surfaces of the ceramic substrate 211.

The metal layer 213 is formed by bonding a second metal plate 223 on the other surface of the ceramic substrate 211.

In the present embodiment, the first metal plate 222 and the second metal plate 223 are of rolled plates each composed of aluminum having a purity of 99.99% or more.

The heat sink 240 is provided with; a top plate part 241 to be bonded with the power module substrate 210, a bottom plate part 245 arranged opposing to the top plate part 241, and corrugated fins 246 placed between the top plate part 241 and the bottom plate part 245. The top plate part 241, the bottom plate part 245, and the corrugated fins 246 define flow passages 242 for supplying a cooling medium therethrough.

Figure 17:
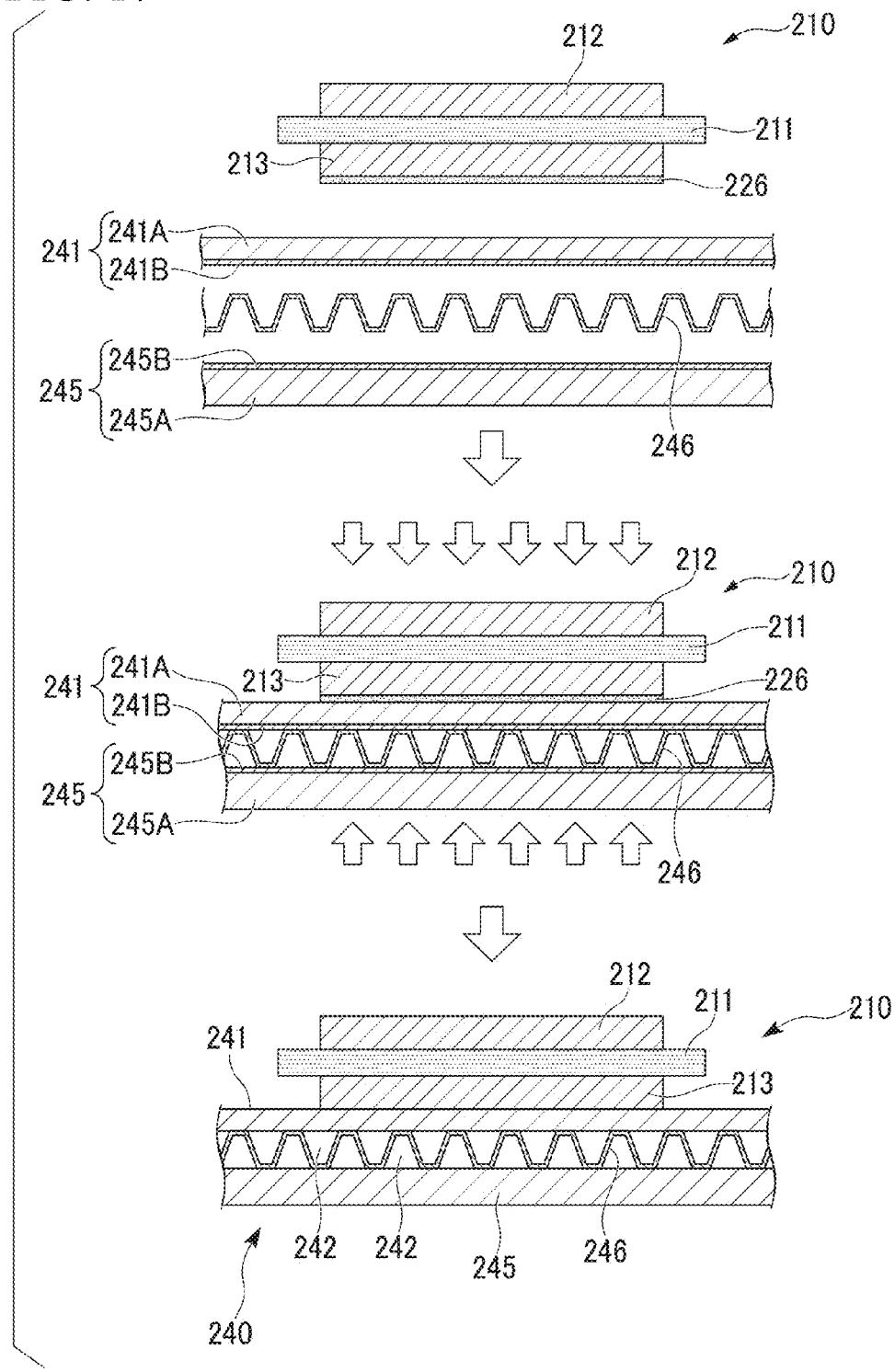
FIG. 17 is an explanatory diagram showing the method of producing a power module substrate having a heat sink, provided with the power module substrate according to the third embodiment of the present invention.

The heat sink 240 is configured such that the top plate part 241 and the corrugated fins 246, and the corrugated fins 246 and the bottom plate part 245 are respectively brazed to each other. In the present embodiment, as shown in FIG. 17, the top plate part 241 and the bottom plate part 245 are respectively configured with a stacked aluminum plate, in which base layers 241A and 245A, and bonding layers 241B and 245B each composed of a material with a melting point lower than that of base layers 241A and 245A are stacked. Furthermore, the top plate part 241 and the bottom plate part 245 are arranged so that the bonding layers 241B and 245B face the corrugated fin 246 side.

In the present embodiment, the base layers 241A and 245A are composed of an A3003 alloy, and the bonding layers 241B and 245B are composed of an A4045 alloy.

As shown in FIG. 13, in each bonding interface 230 between the ceramic substrate 211 and the circuit layer 212 (metal plate 222) and the metal layer 213 (metal plate 223), Ag is solid-solubilized in the circuit layer 212 (metal plate 222) and the metal layer 213 (metal plate 223).

To describe in detail, in the vicinity of each bonding interface 230 of the circuit layer 212 and the metal layer 213, there is formed a concentration gradient layer 233 in which the Ag concentration gradually decreases with moving away from the bonding interface 230 in the stacked direction. Here, the Ag concentration in the circuit layer 212 and the metal layer 213 in the vicinity of the bonding interface 230 is greater than or equal to 0.05% by mass and less than or equal to 10% by mass.

The Ag concentration in the circuit layer 212 and the metal layer 213 in the vicinity of the bonding interface 230 is an average value of measurements made at five points located at 50 μm from the bonding interface 230, by means of EPMA analysis (spot diameter 30 μm). The graph of FIG. 13 is found in a manner such that a line analysis is conducted in the stacked direction in the center portion of the circuit layer 212 (metal plate 222) and the metal layer 213 (metal plate 223), while taking the concentrations at the above positions away from the bonding interface 230 by 50 μm as a reference.

Figure 14:
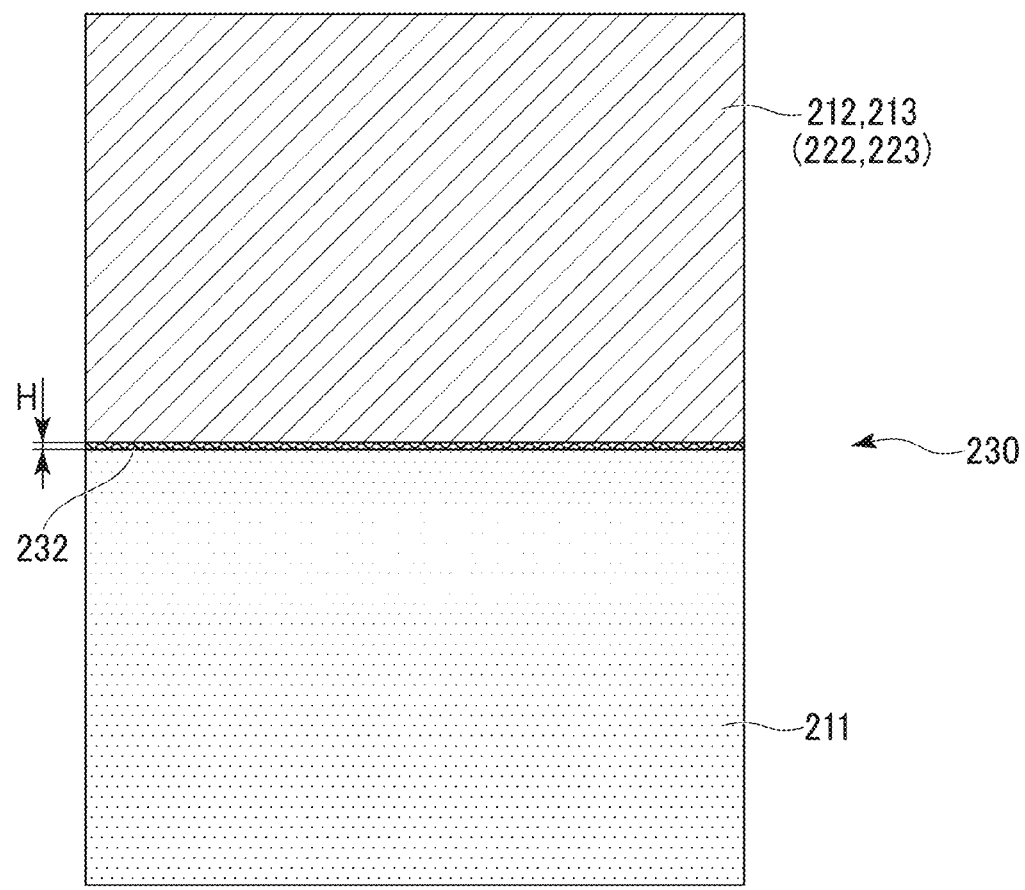
FIG. 14 is a schematic diagram of a bonding interface between the circuit layer and a ceramic substrate, and between a metal layer (metal plate) and the ceramic substrate of the power module substrate according to the third embodiment of the present invention.
Figure 15:
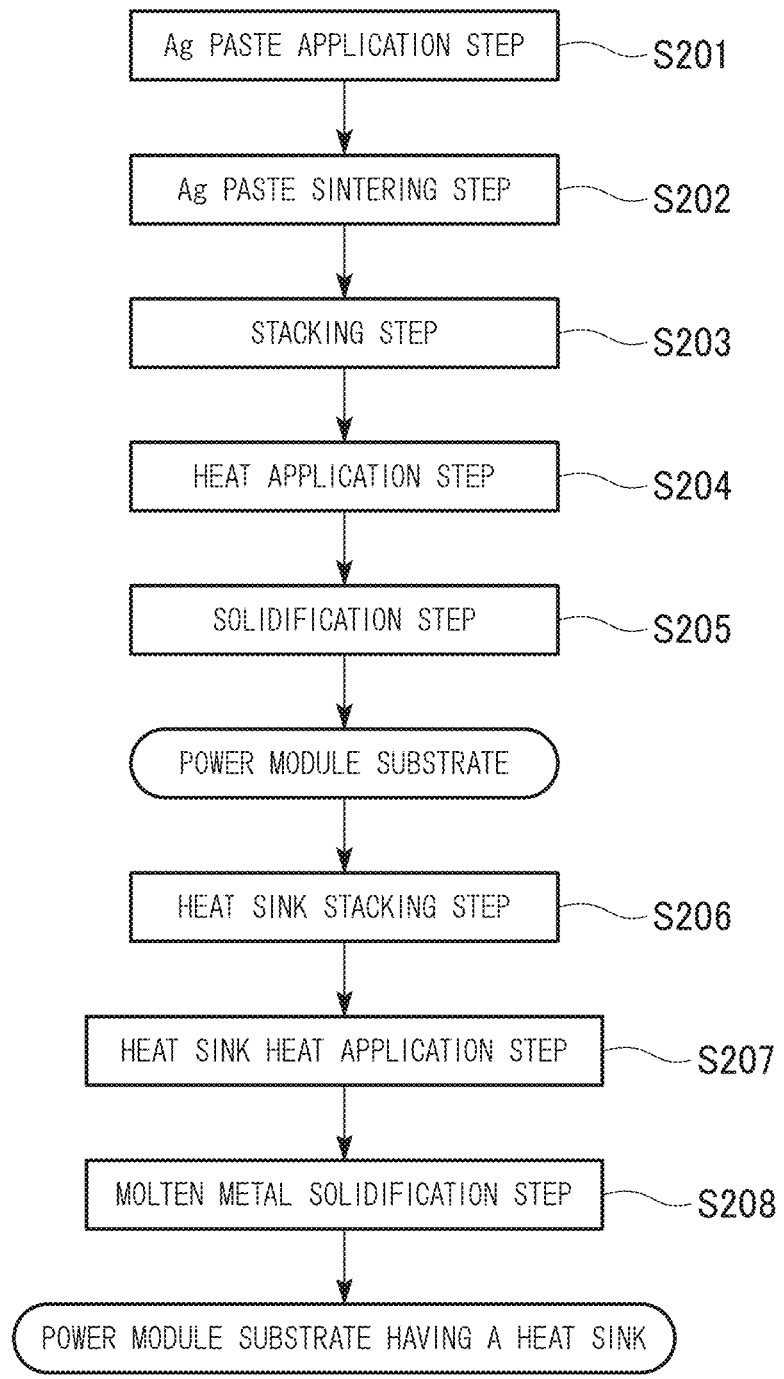
FIG. 15 is a flow chart showing a method of producing a power module substrate according to the third embodiment of the present invention.

When each bonding interface 230 between the ceramic substrate 211, and the circuit layer 212 (metal plate 222) and the metal layer 213 (metal plate 223) is observed with a transmission electron microscope, an Ag high concentration part 232 in which Ag is concentrated in the bonding interface 230 is observed as shown in FIG. 14. In the Ag high concentration part 232, the Ag concentration is two or more times the Ag concentration in the circuit layer 212 (metal plate 222) and the metal layer 213 (metal plate 223). The thickness H of the Ag high concentration part 232 is less than or equal to 4 nm.

Furthermore, in the Ag high concentration part 232, the concentration of oxygen is higher than that the oxygen concentration in the ceramic substrate 211.

In the bonding interface 230 observed here, as shown in FIG. 14, the center part between the interface side end part of the lattice image of the circuit layer 212 (metal plate 222) and the metal layer 213 (metal plate 223), and the bonding interface side end part of the lattice image of the ceramic substrate 211, is taken as a reference plane S. Moreover, the Ag concentration in the circuit layer 212 (metal plate 222) and the metal layer 213 (metal plate 223) refers to the Ag concentration in a portion, distanced by a certain distance (5 nm or more in the present embodiment) from the bonding interface 230, of the circuit layer 212 (metal plate 222) and the metal layer 213 (metal plate 223).

Moreover, the oxygen concentration in the ceramic substrate 211 refers to the oxygen concentration within a crystal grain in a portion, distanced from by a certain distance (5 nm or more in the present embodiment) from the bonding interface 230, of the ceramic substrate 211.

Furthermore, the mass ratio of Al, Si, Ag, O, and N when the bonding interface 230 is analyzed by means of energy dispersive X-ray analysis (EDS) is Al:Si:Ag:O:N=15 to 45% by mass:15 to 45% by mass:1 to 30% by mass:1 to 10% by mass:25% by mass or less. The spot diameter when conducting the analysis by means of EDS is 1 to 4 nm. The bonding interface 230 is measured at several points (20 points in the present embodiment, for example), and the average value thereof is calculated. Moreover, the measurement is not to be made on the bonding surface 230 between the ceramic substrate 211 and the crystal grain boundary of the metal plates 222 and 223, which constitute the circuit layer 212 and the metal layer 213, and the measurement is to be made only on the bonding interface 230 between the ceramic substrate 211 and the crystal grains of the metal plates 222 and 223, which constitute the circuit layer 212 and the metal layer 213.

Hereunder, a method of producing the power module substrate having a heat sink configured as described above is described, with reference to FIG. 15 and FIG. 17.

(Ag Paste Application Step S201)

Figure 16:
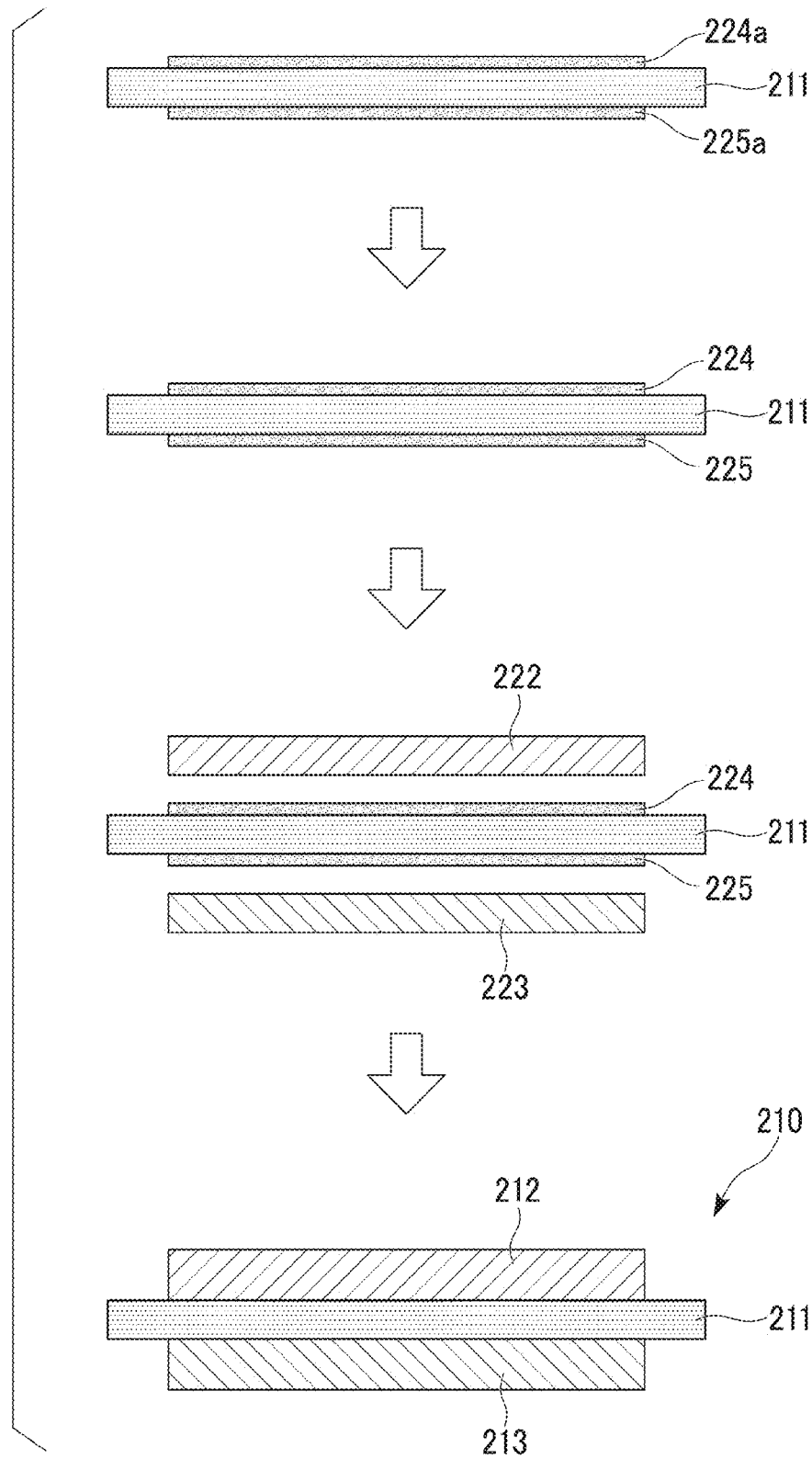
FIG. 16 is an explanatory diagram showing the method of producing a power module substrate according to the third embodiment of the present invention.

First, as shown in FIG. 16, an Ag paste is applied on one surface and the other surface of the ceramic substrate 211 by means of slot-die coating or ink-jet printing, to thereby form Ag paste layers 224a and 225a. The thicknesses of the Ag paste layers 224a and 225a are approximately 0.02 to 200 µm after being dried.

The Ag paste used here contains Ag powder, a solvent, and a dispersant. The amount of contained Ag powder is greater than or equal to 60% by mass and less than or equal to 90% by mass of the entire Ag paste, and the remainders thereof are the solvent and the dispersant. In the present embodiment, the amount of the contained Ag powder is 85% by mass of the entire Ag paste.

In the present embodiment, the viscosity of the Ag paste is adjusted to be greater than or equal to 10 Pa·s and less than or equal to 500 Pa·s, or more preferably greater than or equal to 50 Pa·s and less than or equal to 300 Pa·s.

The grain diameter of the Ag powder is greater than or equal to 0.02 µm and less than or equal to 0.04 µm, and Ag powder with an average grain diameter of 0.03 µm is used in the present embodiment.

A solvent with a boiling point of 200° C. or higher is suitable. For example, α-terpineol, butyl carbitol acetate, diethylene glycol dibutyl ether, or the like may be applied. In the present embodiment, diethylene glycol dibutyl ether is used.

Moreover, in the present embodiment, a dicarboxylic acid based dispersant is added. The Ag paste may also be configured without adding a dispersant.

(Ag Paste Sintering Step S202)

Next, the ceramic substrate 211 with the Ag paste layers 224a and 225a formed thereon is heated to 150 to 200° C. in air atmosphere, to thereby form Ag sintered layers 224 and 225. These Ag sintered layers 224 and 225 serve as Ag fixation layers in the present embodiment.

(Stacking Step S203)

Next, the metal plate 222 is stacked on the one surface side of the ceramic substrate 211. Also, the metal plate 223 is stacked on the other surface side of the ceramic substrate 211.

(Heat Application Step S204)

Next, the metal plate 222, the ceramic substrate 211, and the metal plate 223 are placed into and heated in a vacuum heating furnace while pressure (pressure, 1 to 35 kgf/cm$^2$) is being applied thereto in the stacked direction thereof. Consequently, Ag in the Ag sintered layers 224 and 225 is diffused toward the metal plates 222 and 223, and as a result, a molten metal region is formed on the interface between the ceramic substrate 211 and the metal plates 222 and 223.

Here, in the present embodiment, the pressure within the vacuum heating furnace is greater than or equal to $10^{-6}$ Pa and less than or equal to $10^{-3}$ Pa, and the heat application temperature is greater than or equal to 600° C. and less than or equal to 650° C.

(Solidification Step S205)

Next, the temperature is maintained constant in the state where the molten metal region has been formed, and Ag in the molten metal region is diffused toward the metal plates 222 and 223. As a result, the Ag concentration in the portion that served as the molten metal region gradually decreases and the melting point thereof rises. Consequently, solidification progresses while the temperature is maintained constant. That is to say, the ceramic substrate 211 and the metal plates 222 and 223 are bonded with each other by means of so-called diffusion bonding (transient liquid phase diffusion bonding). After solidification has progressed in this manner, cooling is performed to the normal temperature.

In this manner, the power module substrate 210 is produced.

(Heat Sink Stacking Step S206)

Next, the top plate part 241, the corrugated fins 246, and the bottom plate part 245 are stacked on the other surface side of the metal layer 213 of the power module substrate 210. At this time, between the metal layer 213 and the top plate part 241, there is interposed an Ag fixation layer 226. In the present embodiment, the Ag fixation layer 226 is formed on the other surface of the metal layer 213 by means of sputtering or plating, or by screen-printing an Ag paste thereon.

Moreover, the top plate part 241 and the bottom plate part 245 are stacked so that the bonding layer 241B of the top plate part 241 and the bonding layer 245B of the bottom plate part 245 face the corrugated fin 246 side.

(Heat Sink Heat Application Step S207)

Next, the stacked power module substrate 210, the top plate part 241, the corrugated fins 246, and the bottom plate part 245 are placed into and heated in an atmosphere heating furnace while pressure (pressure, 1 to 35 kgf/cm$^2$) is being applied thereto in the stacked direction thereof. As a result of Ag in the Ag fixation layer 226 being diffused toward the metal layer 213 and the top plate part 241, a molten metal region is formed between the metal layer 213 and the top plate part 241 of the heat sink 240. At the same time, a molten metal region is formed between the top plate part 241 and the corrugated fins 246, and the bottom plate part 245 and the corrugated fins 246, as a result of the bonding layers 241B and 245B being melted.

Here, in the present embodiment, the interior of the atmosphere heating furnace is of a nitrogen gas atmosphere, and the heat application temperature is within a range of greater than or equal to 550° C. and less than or equal to 630° C.

(Molten Metal Solidification Step S208)

As a result of cooling these, the molten metal region formed between the metal layer 213 and the top plate part 241 of the heat sink 240 is solidified, and the metal layer 213 and the top plate part 241 are bonded with each other. Moreover, each molten metal region formed between the top plate part 241 and the corrugated fins 246, and between the bottom plate part 245 and the corrugated fins 246, is solidified, and thereby the top plate part 241 and the corrugated fins 246, and the bottom plate part 245 and the corrugated fins 246 are bonded with each other.

The top plate part 241, the corrugated fins 246, and the bottom plate part 245 are brazed to each other in this manner, thereby forming the heat sink 240. The heat sink 240 and the power module substrate 210 are bonded with each other, to thereby produce a power module substrate having a heat sink.

In the power module substrate 210 and the power module 201 of the present embodiment configured as described above, Ag in the Ag sintered layers 224 and 225 formed on the one surface and on the other surface of the ceramic substrate 211 is diffused toward the metal plates 222 and 223 to thereby bond the ceramic substrate 211 with the circuit layer 212 (metal plate 222) and with the metal layer 213 (metal plate 223). Therefore, the ceramic substrate 211 and the metal plates 222 and 223 can be strongly bonded with each other even if the bonding is performed under bonding conditions of a comparatively low temperature and a short period of time.

Moreover, in the present embodiment, the Ag high concentration part 232, in which Ag is concentrated, is formed in each bonding interface 230 between the ceramic substrate 211 and the metal plates 222 and 223 serving as the circuit layer 212 and the metal layer 213. Also, the Ag concentration in the Ag high concentration part 232 is two or more times the Ag concentration in the circuit layer 212 and the metal layer 213. Therefore, with Ag atoms in the vicinity of the interface, the level of bonding strength between the ceramic substrate 211 and the metal plates 222 and 223 can be improved. Furthermore, since the thickness of the Ag high concentration part 232 is less than or equal to 4 nm, crack occurrence in the Ag high concentration part 232 associated with the stress exerted when a thermal cycle load is being applied, is suppressed.

Furthermore, in the present embodiment, the mass ratio of Al, Si, Ag, O, and N obtained by analyzing the bonding interface 230 by means of an energy dispersive X-ray analysis method is Al:Si:Ag:O:N=15 to 45% by mass:15 to 45% by mass:1 to 30% by mass:1 to 10% by mass:25% by mass or less. As a result, the excessive production of reaction products from Al and Ag in the bonding interface 230, that inhibits bonding can be prevented. Moreover, the effect of improving the bonding strength with Ag atoms can be sufficiently achieved. Furthermore, the presence of a portion with a high level of oxygen concentration in the bonding interface 230 can be prevented, and crack occurrence when a thermal cycle load is being applied, is suppressed.

Moreover, in the present embodiment, since the Ag sintered layers 224 and 225, which are the sintered Ag paste layers 224a and 225a, serve as Ag fixation layers, Ag can be reliably interposed between the ceramic substrate 211 and the metal plates 222 and 223. Moreover, since Ag does not get oxidized even when the Ag paste is heated and sintered in air atmosphere, the Ag sintered layers 224 and 225 can be comparatively easily formed.

In addition, in the present embodiment, an Ag paste of Ag grains with a grain diameter greater than or equal to 0.02 μm and less than or equal to 0.04 μm, which contains no resin, is used. Therefore, the Ag sintered layers 224 and 225 can be formed by having the Ag paste layers 224a and 225a sintered at a low temperature, approximately 200° C.

Next, a fourth embodiment of the present invention is described, with reference to FIG. 18 to FIG. 22.

Figure 18:
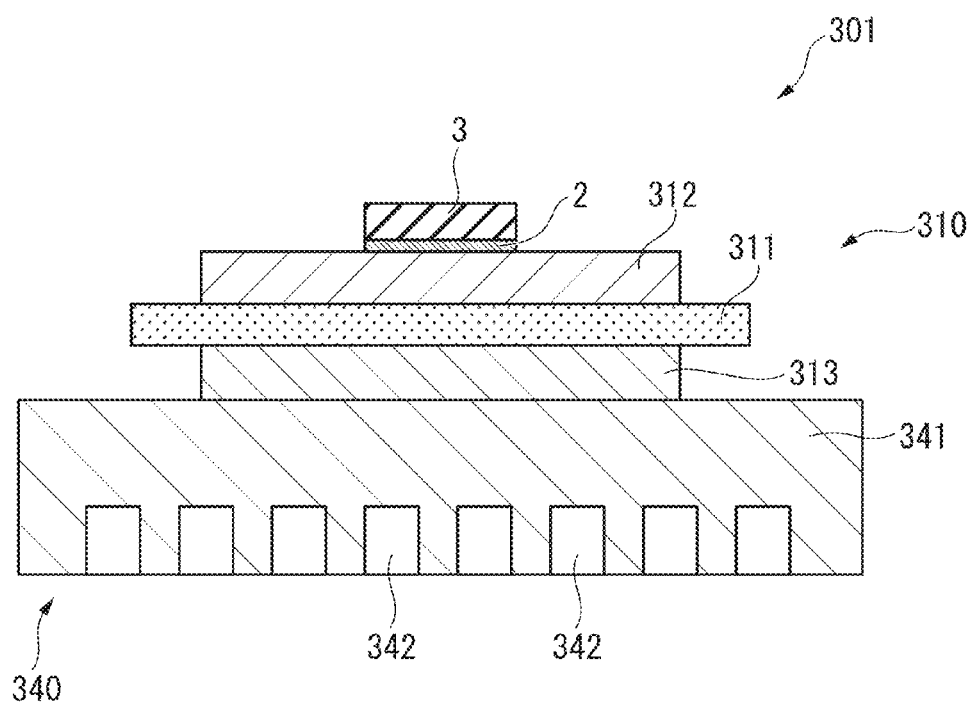
FIG. 18 is a schematic explanatory diagram of a power module which uses a power module substrate having a heat sink of a fourth embodiment of the present invention.

A power module 301 shown in FIG. 18 is provided with; a power module substrate 310 having a circuit layer 312 arranged thereon, a semiconductor chip 3 which is bonded via a solder layer 2 on a surface of the circuit layer 312, and a heat sink 340.

The power module substrate 310 is provided with; a ceramic substrate 311, the circuit layer 312 arranged on one of the surfaces of the ceramic substrate 311 (the upper surface in FIG. 18), and a metal layer 313 arranged on the other surface of the ceramic substrate 311 (the lower surface in FIG. 18).

The ceramic substrate 311 is composed of AlN (aluminum nitride), which is a highly insulative material. Moreover, the thickness of the ceramic substrate 311 is in a range of 0.2 to 1.5 mm, and in the present embodiment, it is 0.635 mm.

The circuit layer 312 is formed by bonding a first metal plate 322 having conductivity onto one of the surfaces of the ceramic substrate 311.

The metal layer 313 is formed by bonding a second metal plate 323 on the other surface of the ceramic substrate 311.

In the present embodiment, the first metal plate 322 and the second metal plate 323 are of rolled plates each composed of aluminum having a purity of 99.99% or more.

The heat sink 340 is to cool the power module substrate 310 described above. The heat sink 340 is provided with a top plate part 341 to be bonded with the power module substrate 310, and flow passages 342 for supplying a cooling medium (for example cooling water) therethrough. The top plate part 341 of the heat sink 340 is configured preferably with a material having superior heat conductivity, and in the present embodiment, it is configured with A6063 (aluminum alloy).

In a bonding interface 330 between the second metal plate 323 (metal layer 313) and the heat sink 340, Ag is solid-solubilized in the metal layer 313 (second metal plate 323) and the heat sink 340.

Figure 19:
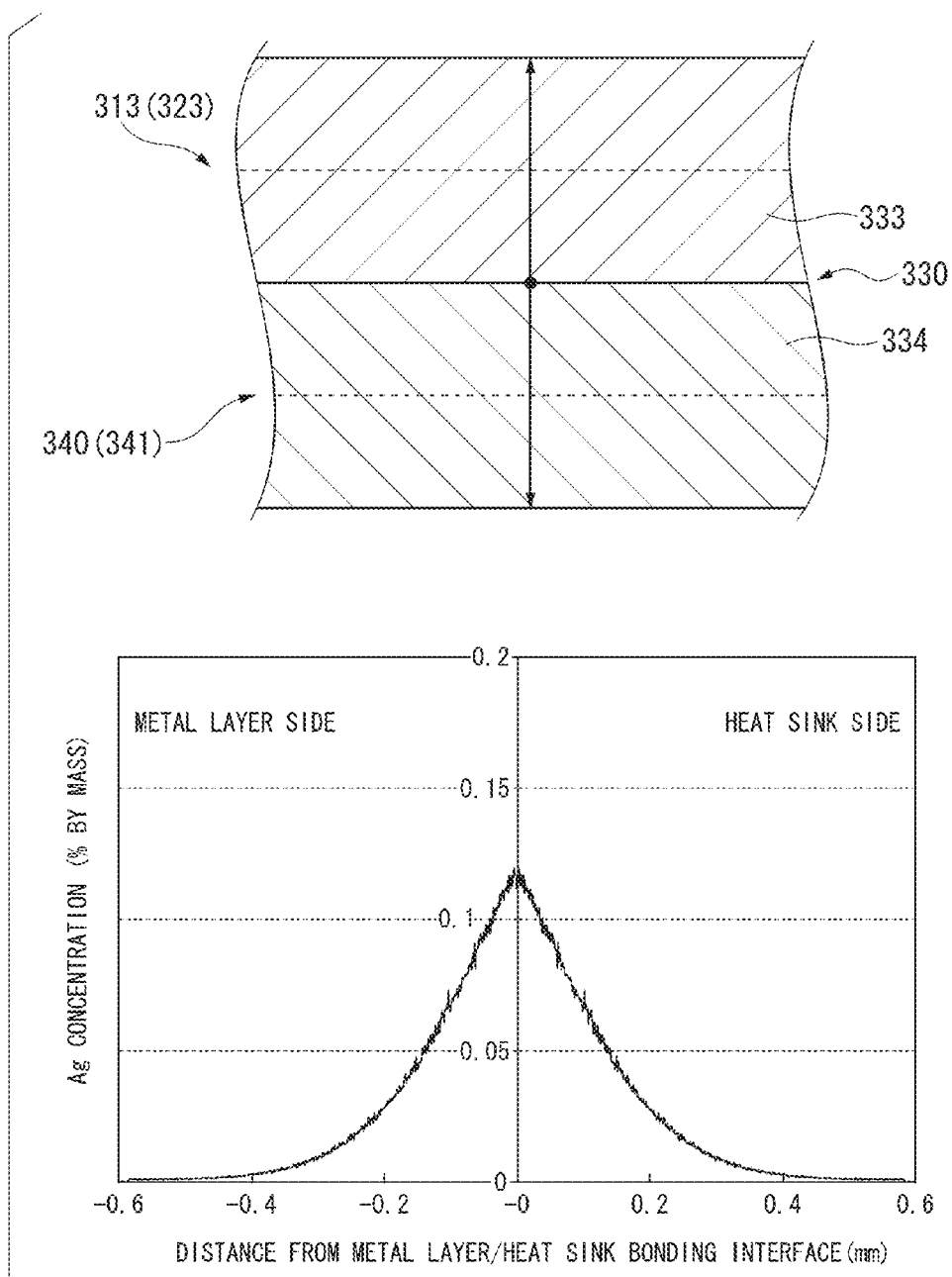
FIG. 19 is an explanatory diagram showing an Ag concentration distribution of the metal layer and heat sink of the power module substrate having a heat sink of the fourth embodiment of the present invention.
Figure 20:
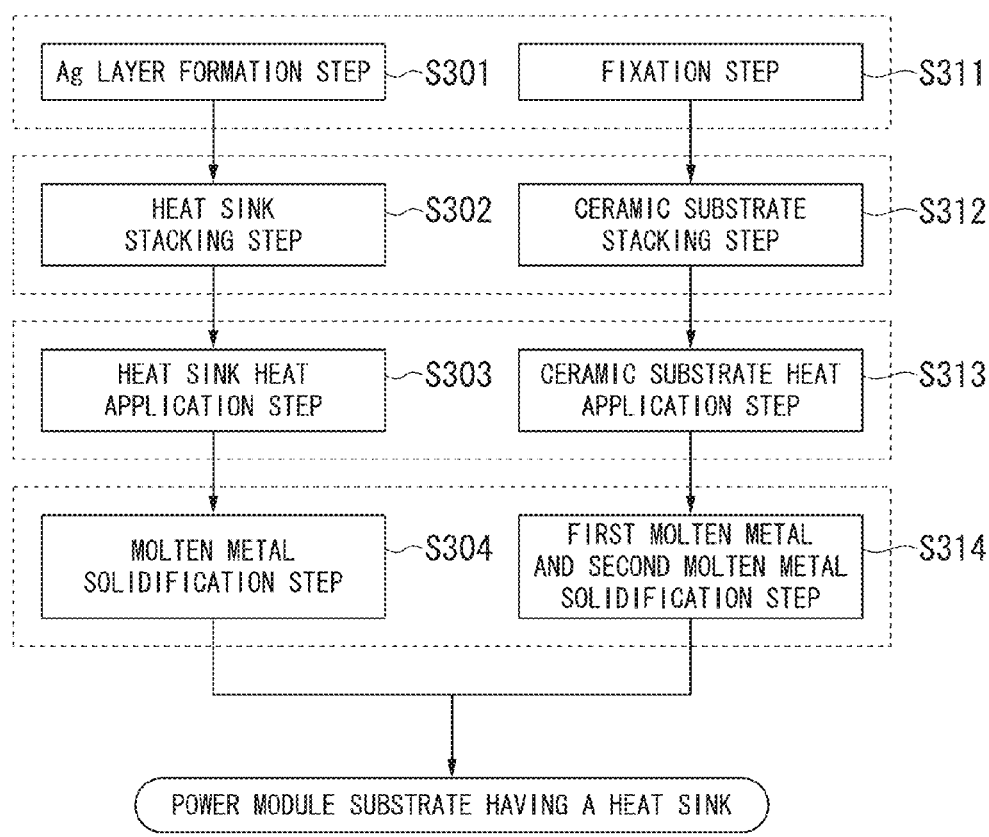
FIG. 20 is a flow chart of a method of producing a power module substrate having a heat sink according to the fourth embodiment of the present invention.

To describe in detail, as shown in FIG. 19, in the vicinity of the bonding interface 330 of the metal layer 313 and the heat sink 340, there are formed concentration gradient layers 333 and 334 in which the Ag concentration gradually decreases with moving away from the bonding interface 330 in the stacked direction. Here, the Ag concentration in the metal layer 313 and the heat sink 340 in the vicinity of the bonding interface 330 is greater than or equal to 0.05% by mass and less than or equal to 10% by mass.

The Ag concentration in the metal layer 313 and the heat sink 340 in the vicinity of the bonding interface 330 is an average value of measurements made at five points located at 50 μm from the bonding interface 330, by means of EPMA analysis (spot diameter 30 μm). Moreover, the graph of FIG. 19 is found in a manner such that a line analysis is conducted in the stacked direction in the widthwise center portion of the metal layer 313 (metal plate 323) and the heat sink 340 (top plate part 341), while taking the concentrations at the above positions away from the bonding interface 330 by 50 μm as a reference.

Hereunder, a method of producing the power module substrate having a heat sink configured as described above is described, with reference to FIG. 20 and FIG. 22.

(Ag Layer Formation Step S301/Fixation Step S311)

Figure 21:
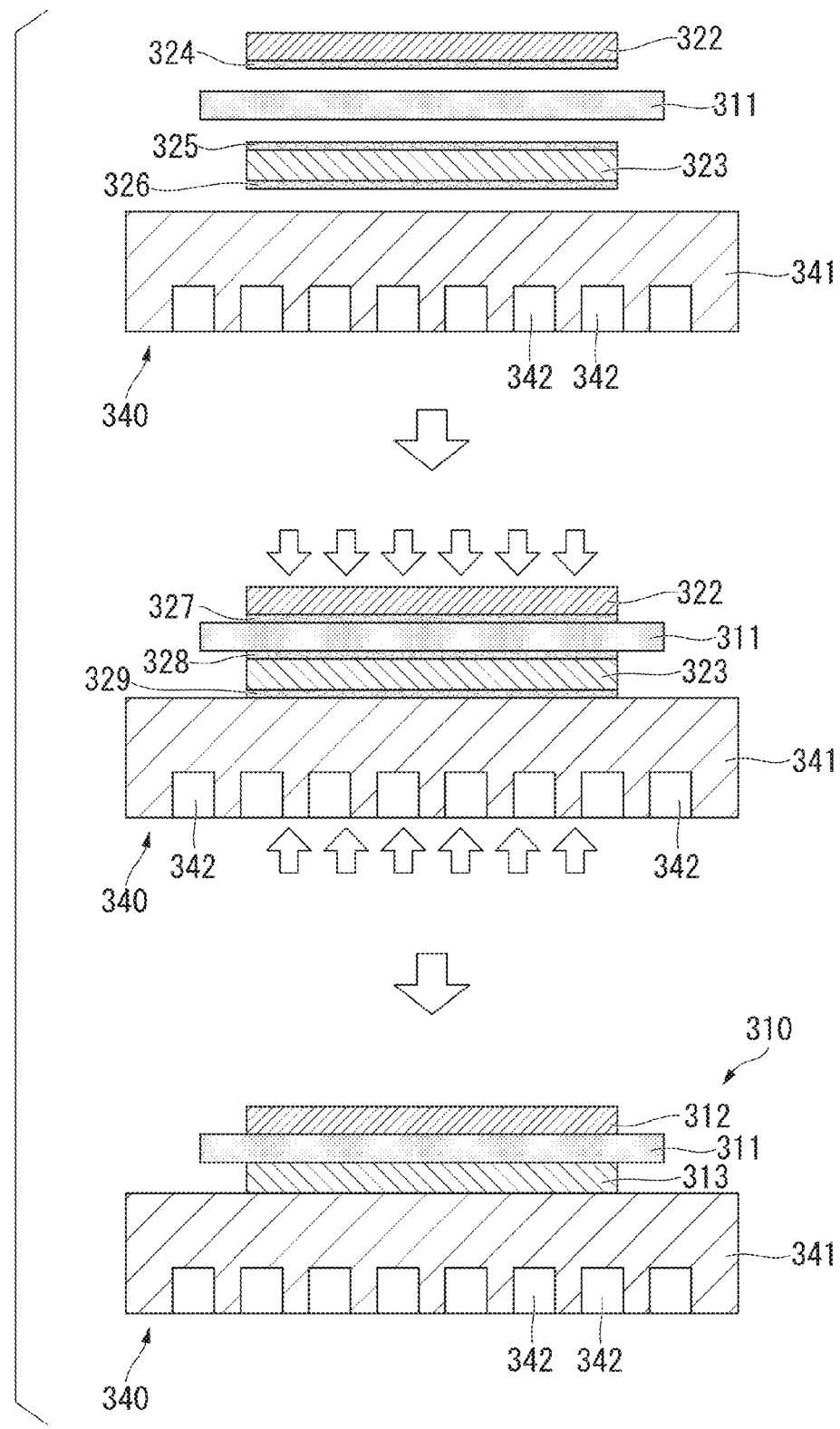
FIG. 21 is an explanatory diagram showing the method of producing a power module substrate having a heat sink according to the fourth embodiment of the present invention.

First, as shown in FIG. 21, Ag is fixed on one surface of the first metal plate 322, which serves as the circuit layer 312, by means of sputtering to thereby form a first Ag layer 324. Ag is fixed on one surface of the second metal plate 323, which serves as the metal layer 313, by means of sputtering to thereby form a second Ag layer 325 (fixation step S311).

Moreover, Ag is fixed on the other surface of the second metal plate 323, which serves as the metal layer 313, by means of sputtering to thereby form a second Ag layer 326 (Ag layer formation step S301).

Here, in the present embodiment, the amount of Ag in the first Ag layer 324, the second Ag layer 325, and the Ag layer 326 is greater than or equal to 0.01 mg/cm$^2$ and less than or equal to 10 mg/cm$^2$.

(Heat Sink Stacking Step S302/Ceramic Substrate Stacking Step S312)

Next, as shown in FIG. 21, the first metal plate 322 is stacked on one surface side of the ceramic substrate 311. Furthermore, the second metal plate 323 is stacked on the other surface side of the ceramic substrate 311 (ceramic substrate stacking step S312). At this time, as shown in FIG. 21, the first metal plate 322 and the second metal plate 323 are stacked so that the surfaces with the first Ag layer 324 of the first metal plate 322 and the second Ag layer 325 of the second metal plate 323 formed thereon respectively face the ceramic substrate 311.

Furthermore, the heat sink 340 is stacked on the other surface side of the second metal plate 323 (heat sink stacking step S302). At this time, as shown in FIG. 21, the second metal plate 323 and the heat sink 340 are stacked so that the surface with the Ag layer 326 of the second metal plate 323 formed thereon faces the heat sink 340.

That is to say, the first Ag layer 324 is interposed between the first metal plate 322 and the ceramic substrate 311, the second Ag layer 325 is interposed between the second metal plate 323 and the ceramic substrate 311, and the Ag layer 326 is interposed between the second metal plate 323 and the heat sink 340.

(Heat Sink Heat Application Step S303/Ceramic Substrate Heat Application Step S313)

Next, the first metal plate 322, the ceramic substrate 311, the second metal plate 323, and the heat sink 340 are placed into and heated in a vacuum heating furnace while pressure (pressure, 1 to 35 kgf/cm$^2$) is being applied thereto in the stacked direction thereof. Ag of the first Ag layer 324 is diffused toward the first metal plate 322, and thereby, a first molten metal region 327 is formed on the interface between the first metal plate 322 and the ceramic substrate 311. Ag of the second Ag layer 325 is diffused toward the second metal plate 323, and thereby, a second molten metal region 328 is formed on the interface between the first metal plate 323 and the ceramic substrate 311. (Ceramic Substrate Heat Application Step S313)

Figure 22:
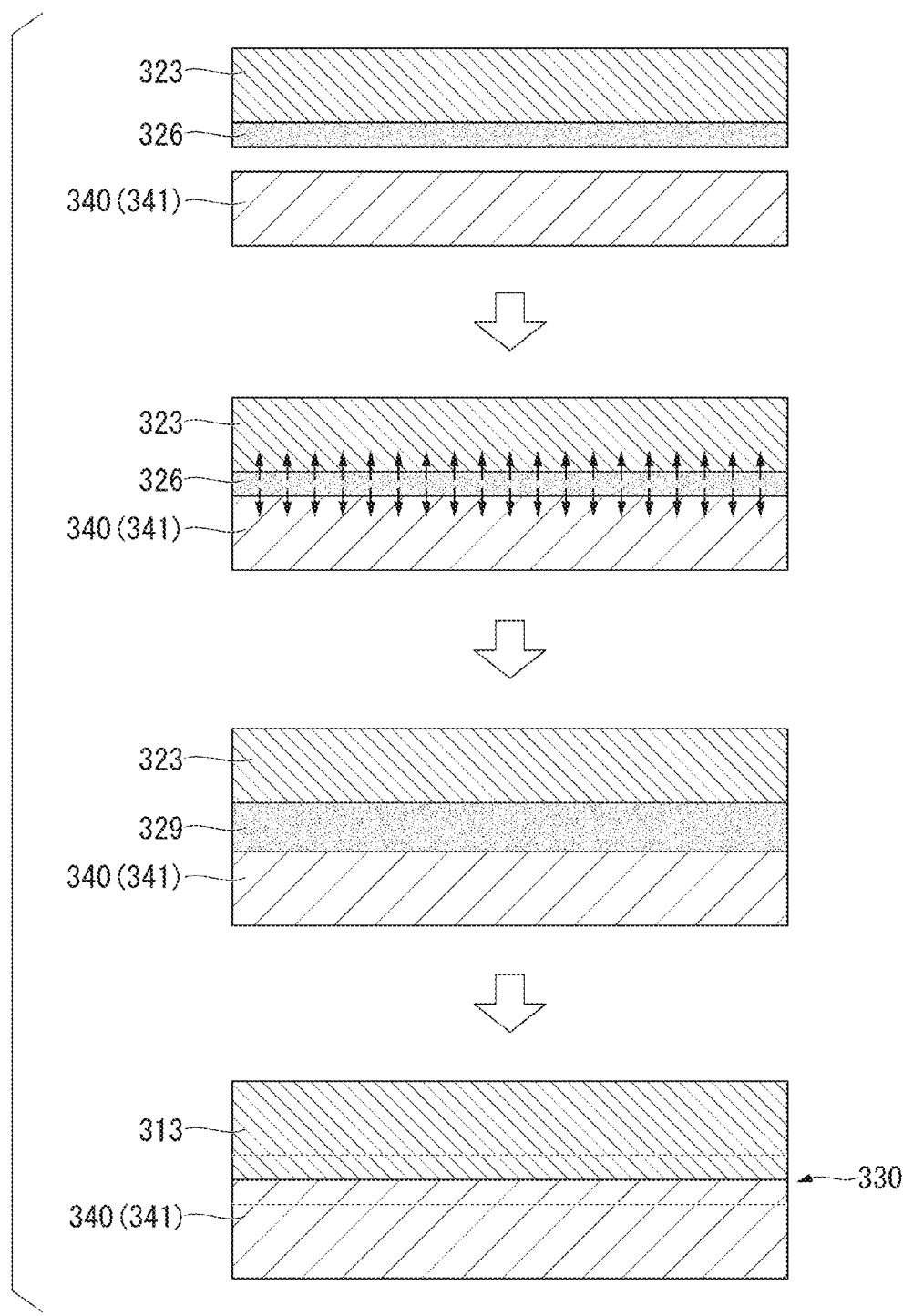
FIG. 22 is an explanatory diagram showing the vicinity of the bonding interface between the second metal plate (metal layer) and the heat sink in FIG. 21.

Also, at the same time, a molten metal region 329 is formed between the second metal plate 323 and the heat sink 340 (heat sink heat application step S303). As shown in FIG. 22, the molten metal region 329 is formed such that Ag of the Ag layer 326 is diffused toward the second metal plate 323 and the heat sink 340, and the Ag concentration in the second metal plate 323 and the heat sink 340 in the vicinity of the Ag layer 326 rises.

In the present embodiment, the pressure within the vacuum heating furnace is greater than or equal to 10$^{-6}$ Pa and less than or equal to 10$^{-3}$ Pa, and the heat application temperature is greater than or equal to 600° C. and less than or equal to 650° C.

(Molten Metal Solidification Step S304/First Molten Metal and Second Molten Metal Solidification Step S314)

Next, in the state where the molten metal region 329 has been formed, the temperature is maintained constant. Consequently, Ag in the molten metal region 329 is further diffused toward the second metal plate 323 and the heat sink 340. As a result, the Ag concentration in the portion that served as the molten metal region 329 gradually decreases and the melting point thereof rises. Consequently, solidification progresses while the temperature is maintained constant. That is to say, the ceramic substrate 340 and the second metal plate 323 are bonded with each other by means of so-called diffusion bonding (transient liquid phase diffusion bonding).

Similarly, Ag in the first molten metal region 327 is further diffused toward the first metal plate 322. Moreover, Ag in the second molten metal region 328 is further diffused toward the second metal plate 323. As a result, the Ag concentration in the portions that served as the first molten metal region 327 and the second molten metal region 328 gradually decreases and the melting point thereof rises. Consequently, solidification progresses while the temperature is maintained constant. As a result, the ceramic substrate 311 and the first metal plate 322, and the ceramic substrate 311 and the second metal plate 323 are bonded with each other. That is to say, the ceramic substrate 311, the first metal plate 322, and the second metal plate 323 are bonded with each other by means of so-called diffusion bonding (transient liquid phase diffusion bonding). After solidification has progressed in this manner, cooling is performed to the normal temperature.

In the manner described above, the first metal plate 322, which serves as the circuit layer 312, and the ceramic substrate 311 are bonded with each other. The second metal plate 323, which serves as the metal layer 313, is bonded with the ceramic substrate 311. The second metal plate 323 and the heat sink 340 are bonded with each other. Thereby, a power module substrate having a heat sink of the present embodiment is produced.

In the present embodiment configured as described above, Ag is interposed on the bonding interface 330 between the second metal plate 323 and the heat sink 340. Since the element Ag lowers the melting point of aluminum, the molten metal region 329 can be formed on the interface between the heat sink 340 and the second metal plate 323 under comparatively low temperature conditions. Therefore, even if the bonding is performed under bonding conditions of a comparatively low temperature and a short period of time, the heat sink 340 and the second metal plate 323 can be strongly bonded with each other.

Moreover, in the present embodiment, since Ag is also interposed on the bonding interface between the first metal plate 322 and the ceramic substrate 311, and on the bonding interface between the second metal plate 323 and the ceramic substrate 311, the ceramic substrate 311 and the first metal plate 322, and the ceramic substrate 311 and the second metal plate 323 can be strongly bonded with each other.

Furthermore, since the configuration is provided such that Ag in the Ag layer 326 formed on the bonding surface of the second metal plate 323 is diffused toward the second metal plate 323 and the heat sink 340 to thereby bond the heat sink 340 with the second metal plate 323 (metal layer 313), even if the bonding is performed under bonding conditions of a comparatively low temperature and a short period of time, the heat sink 340 and the second metal plate 323 can be strongly bonded with each other.

Moreover, in the present embodiment, the configuration is provided such that Ag in the first Ag layer 324 and the second Ag layer 325 formed on the bonding surface of the first metal plate 322 and the second metal plate 323 is diffused toward the first metal plate 322 and the second metal plate 323, to thereby bond the ceramic substrate 311 with the first metal plate 322 (circuit layer 312) and the second metal plate 323 (metal layer 313). Therefore, even if the bonding is performed under bonding conditions of a comparatively low temperature and a short period of time, the ceramic substrate 311 can be strongly bonded with the first metal plate 322 (circuit layer 312) and the second metal plate 323 (metal layer 313).

Furthermore, no brazing filler material film is used in bonding the heat sink 340 with the second metal plate 323, and bonding the ceramic substrate 311 with the first metal plate 322 and the second metal plate 323. Therefore, there is no need for performing operations for positioning a brazing filler material film. Therefore, a power module substrate having a heat sink of the present embodiment can be efficiently produced at low cost.

Moreover, in the present embodiment, the configuration is provided such that the bonding of the ceramic substrate 311 with the first metal plate 322 and the second metal plate 323, and the bonding of the second metal plate 323 with the heat sink 340 are performed at the same time. Therefore, the cost involved in these bonding operations can be reduced significantly. Furthermore, since there is no need for repeatedly performing heat application and cooling for the ceramic substrate 311, it is possible to reduce warpage of the power module substrate having a heat sink.

Furthermore, the Ag layer formation step S301 is configured such that Ag is fixed on the bonding surface of the second metal plate 323 by means of sputtering to thereby form the Ag layer 326. Therefore, Ag can be reliably interposed between the heat sink 340 and the second metal plate 323. Moreover, the amount of Ag to be fixed can be adjusted precisely, and the molten metal region 329 can be reliably formed, thereby enabling strong bonding of the heat sink 340 with the second metal plate 323.

Furthermore, in the power module substrate having a heat sink of the present embodiment, in the bonding interface 330 between the heat sink 340 and the second metal plate 323 (metal layer 313), Ag is solid-solubilized in the second metal plate 323 (metal layer 313) and in the heat sink 340. The Ag concentration respectively in the second metal plate 323 (metal layer 313) and the heat sink 340 is greater than or equal to 0.05% by mass and less than or equal to 10% by mass. Accordingly, the bonding interface 330 side portion of the second metal plate 323 (metal layer 313) and the heat sink 340 is strengthened by solid solution strengthening, and cracks in the second metal plate 323 (metal layer 313) and the heat sink 340 can be prevented. Therefore, it is possible to provide a highly reliable power module substrate having a heat sink.

Next, a fifth embodiment of the present invention is described, using FIG. 23 to FIG. 26.

The power module 401 is provided with; a power module substrate 410 having a circuit layer 412 arranged thereon, a semiconductor chip 3 which is bonded via a solder layer 2 on a surface of the circuit layer 412, and a heat sink 440.

Figure 23:
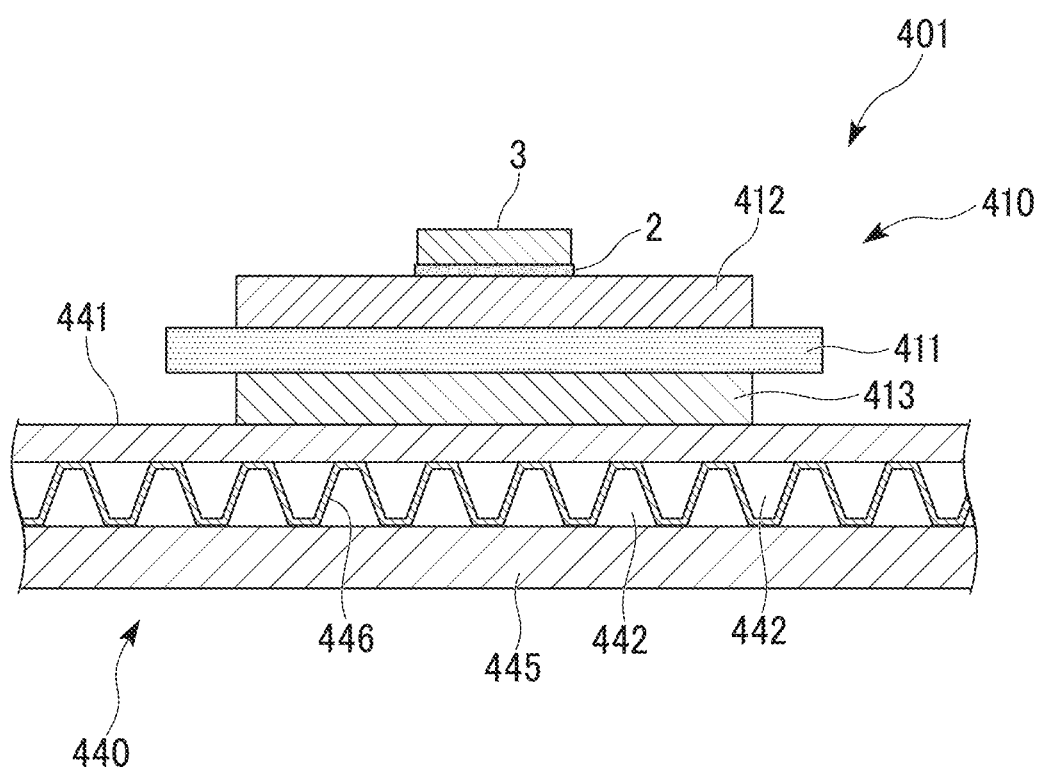
FIG. 23 is a schematic explanatory diagram of a power module which uses a power module substrate having a heat sink of a fifth embodiment of the present invention.
Figure 24:
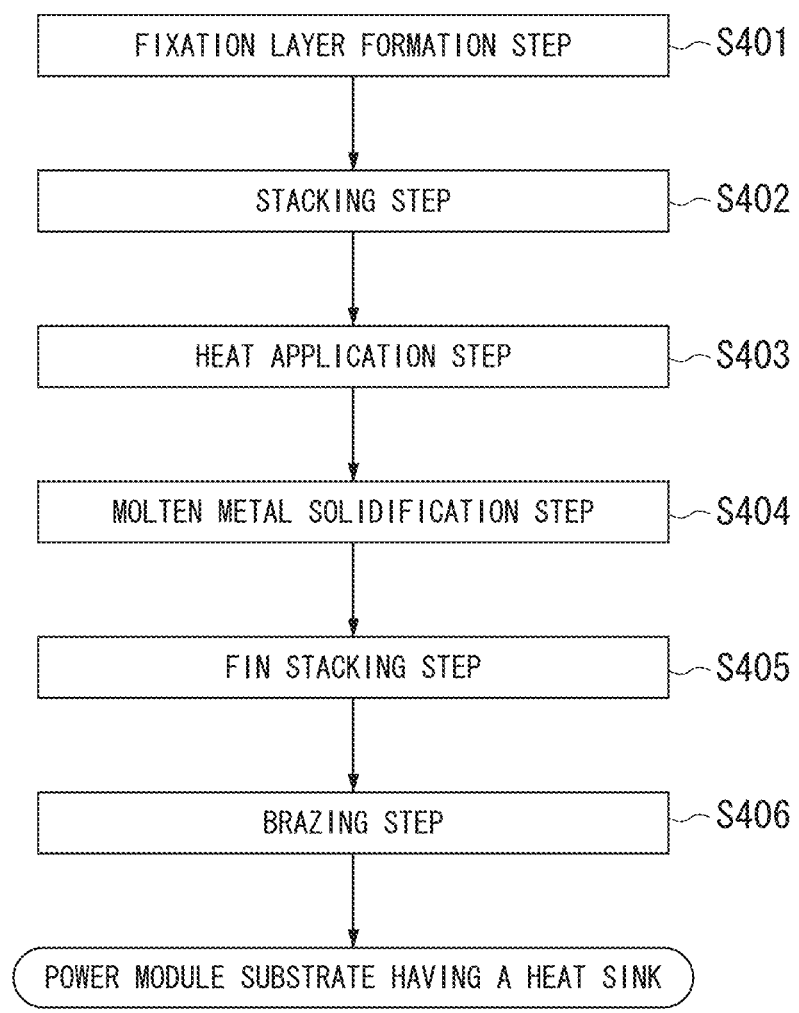
FIG. 24 is a flow chart of a method of producing a power module substrate having a heat sink according to the fifth embodiment of the present invention.

The power module substrate 410 is provided with; a ceramic substrate 411, the circuit layer 412 arranged on one of the surfaces of the ceramic substrate 411 (the upper surface in FIG. 23), and a metal layer 413 arranged on the other surface of the ceramic substrate 411 (the lower surface in FIG. 23). The ceramic substrate 411 is composed of AlN (aluminum nitride), which is a highly insulative material.

The circuit layer 412 is formed with a first metal plate 422 composed of an aluminum (so-called 4N aluminum) rolled plate having a purity of 99.99% or more being bonded with the ceramic substrate 411.

The metal layer 413 is formed with a second metal plate 423 composed of an aluminum (so-called 4N aluminum) rolled plate having a purity of 99.99% or more being bonded with the ceramic substrate 411.

The heat sink 440 is to cool the power module substrate 410 described above. The heat sink 440 is provided with; a top plate part 441 to be bonded with the power module substrate 410, a bottom plate part 445 arranged opposing to the top plate part 441, and corrugated fins 446 placed between the top plate part 441 and the bottom plate part 445. The top plate part 441, the bottom plate part 445, and the corrugated fins 446 define flow passages 442 for supplying a cooling medium therethrough.

Figure 26:
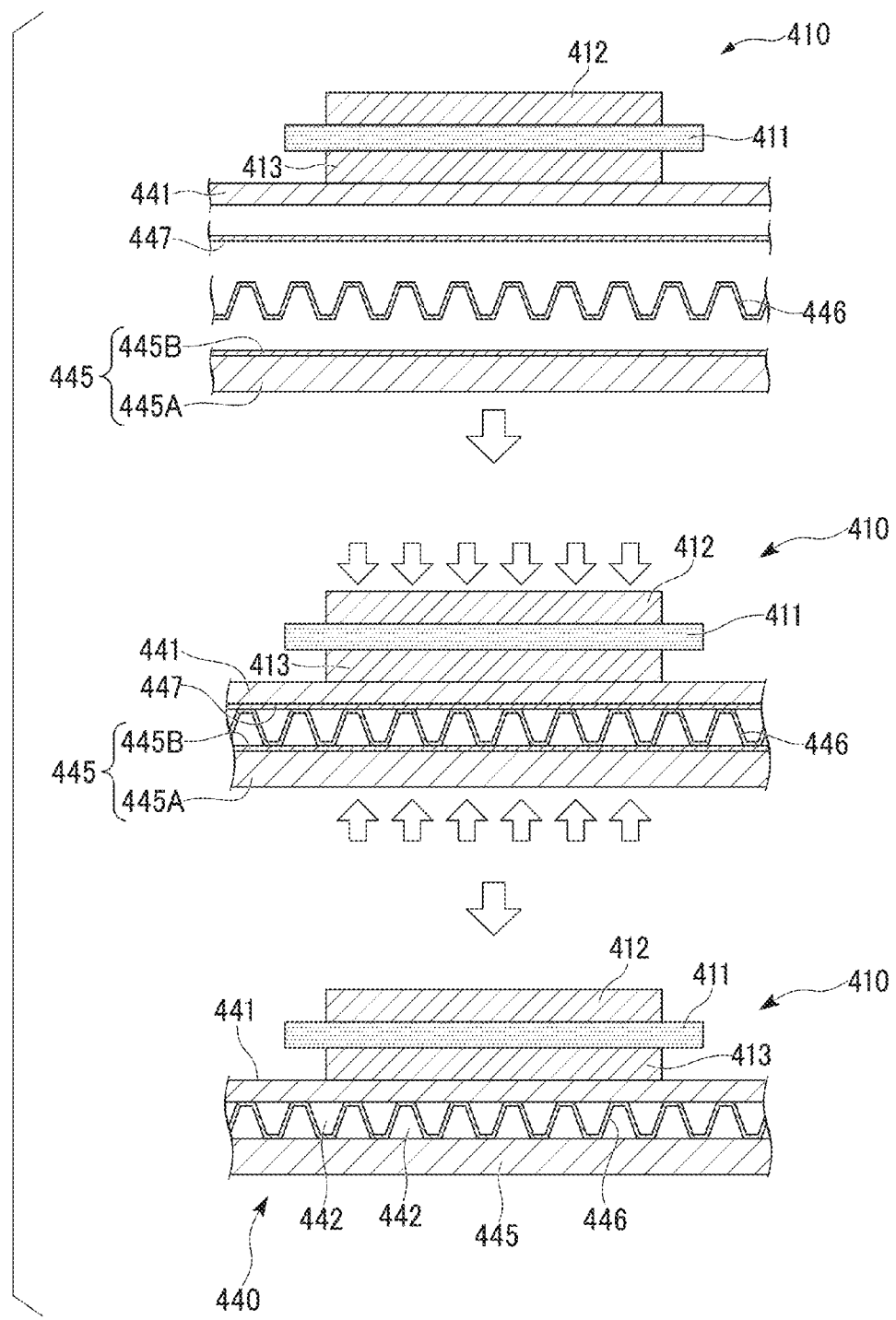
FIG. 26 is an explanatory diagram showing the method of producing a power module substrate having a heat sink according to the fifth embodiment of the present invention.

The heat sink 440 is configured such that the top plate part 441 and the corrugated fins 446, and the corrugated fins 446 and the bottom plate part 445 are respectively brazed to each other. In the present embodiment, as shown in FIG. 26, the bottom plate part 445 is configured with a stacked aluminum plate in which a base layer 445A and a bonding layer 445B composed of a material with a melting point lower than that of the base layer 445A are stacked. In the present embodiment, the base layer 445A is composed of an A3003 alloy, and the bonding layer 445B is composed of an A4045 alloy.

In the bonding interface between the top plate part 441 of the heat sink 440 and the second metal plate 423 (metal layer 413), Ag is solid-solubilized in the second metal plate 423 (metal layer 413) and the top plate part 441.

Moreover, Ag is solid-solubilized in the bonding interface between the first metal plate 422 (circuit layer 412) and the ceramic substrate 411, and in the bonding interface between the second metal plate 423 (metal layer 413) and the ceramic substrate 411.

Hereunder, a method of producing a power module substrate having a heat sink of the aforementioned configuration is described.

(Fixation Layer Formation Step S401)

Figure 25:
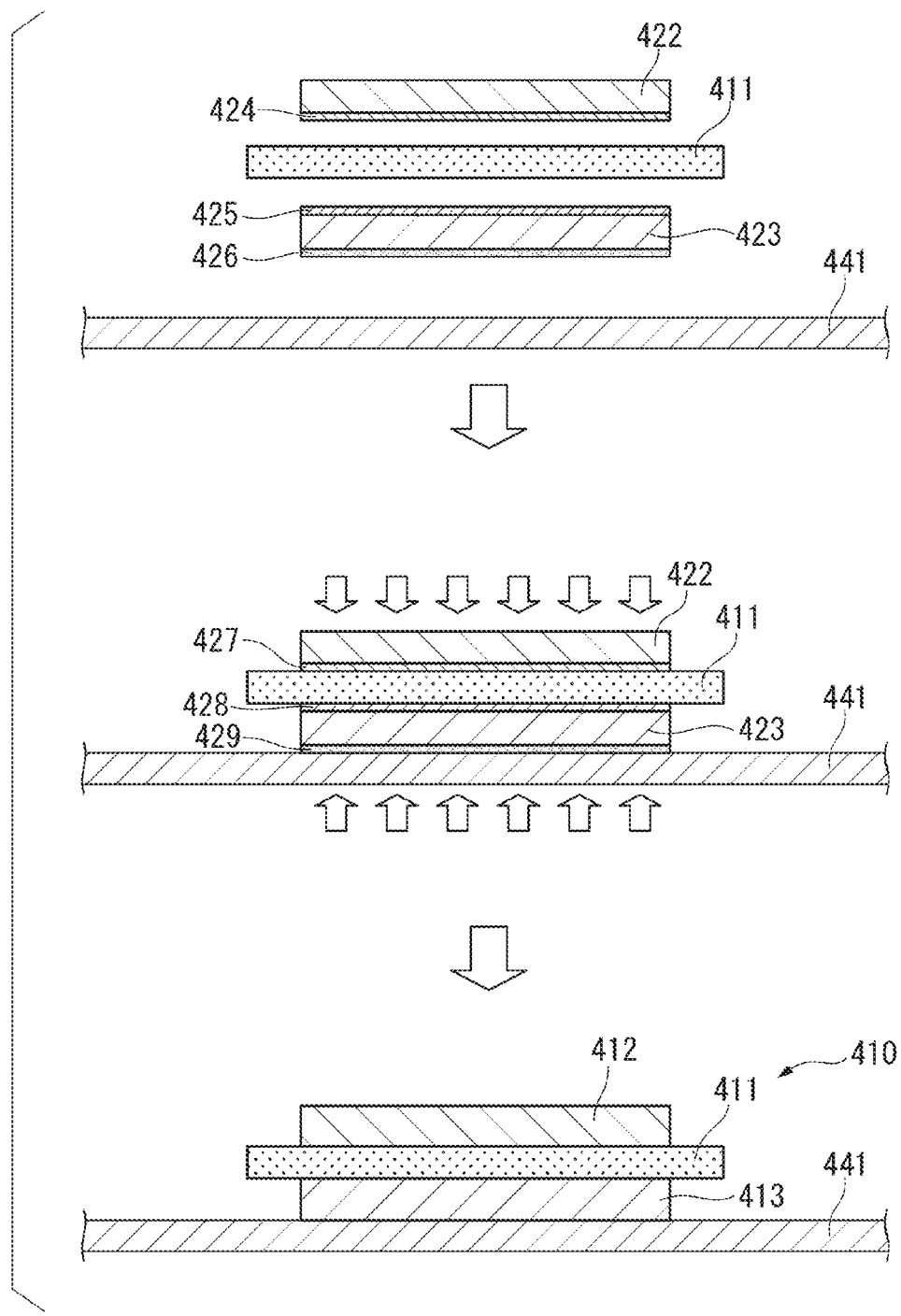
FIG. 25 is an explanatory diagram showing the method of producing a power module substrate having a heat sink according to the fifth embodiment of the present invention.

First, as shown in FIG. 25, Ag is fixed on one surface of the first metal plate 422, which serves as the circuit layer 412, by means of sputtering to thereby form a first Ag layer 424. Also, Ag is fixed on one surface of the second metal plate 423, which serves as the metal layer 413, by means of sputtering to thereby form a second Ag layer 425. Furthermore, Ag is fixed on the other surface of the second metal plate 423 by means of sputtering, to thereby form an Ag layer 426.

Here, in the present embodiment, the amount of Ag in the first Ag layer 424, the second Ag layer 425, and the Ag layer 426 is greater than or equal to 0.01 mg/cm$^2$ and less than or equal to 10 mg/cm$^2$.

(Stacking Step S402)

Next, the first metal plate 422 is stacked on the one surface side of the ceramic substrate 411. The second metal plate 423 is stacked on the other surface side of the ceramic substrate 411. At this time, as shown in FIG. 25, the first metal plate 422 and the second metal plate 423 are stacked so that the surfaces with the first Ag layer 424 of the first metal plate 422 and the second Ag layer 425 of the second metal plate 423 formed thereon respectively face the ceramic substrate 411.

Furthermore, the top plate part 441 is stacked and arranged on the surface side where the Ag layer 426 of the second metal plate 423 is formed.

(Heat Application Step S403)

Next, the first metal plate 422, the ceramic substrate 411, the second metal plate 423, and the top plate part 441 are placed into and heated in a vacuum heating furnace while pressure (pressure, 1 to 35 kgf/cm$^2$) is being applied thereto in the stacked direction thereof. Ag of the first Ag layer 424 is diffused toward the first metal plate 422, and thereby, a first molten metal region 427 is formed on the interface between the first metal plate 422 and the ceramic substrate 411. Also, Ag of the second Ag layer 425 is diffused toward the second metal plate 423, and thereby, a second molten metal region 428 is formed on the interface between the second metal plate 423 and the ceramic substrate 411. Furthermore, Ag of the Ag layer 426 is diffused toward the second metal plate 423 and the top plate part 441, and thereby a molten metal region 429 is formed between the second metal plate 423 and the top plate part 441.

Here, in the present embodiment, the pressure within the vacuum heating furnace is greater than or equal to 10$^{-6}$ Pa and less than or equal to 10$^{-3}$ Pa, and the heat application temperature is greater than or equal to 600° C. and less than or equal to 650° C.

(Molten Metal Solidification Step S404)

Next, in the state where the first molten metal region 427 and the second molten metal region 428 have been formed, the temperature is maintained constant. Ag in the first molten metal region 427 is diffused toward the first metal plate 422. Ag in the second molten metal region 428 is diffused toward the second metal plate 423. As a result, the Ag concentration in the portions that served as the first molten metal region 427 and the second molten metal region 428 gradually decreases and the melting point thereof rises. Consequently, solidification progresses while the temperature is maintained constant. As a result, the ceramic substrate 411 is bonded with the first metal plate 422 and the second metal plate 423.

Moreover, in the state where the molten metal region 429 has been formed, the temperature is maintained constant. Ag in the second molten metal region 429 is diffused toward the second metal plate 423 and the top plate part 441. The Ag concentration in the portion that served as the molten metal region 429 gradually decreases and the melting point thereof rises. Consequently, solidification progresses while the temperature is maintained constant. Thereby, the second metal plate 423 and the top plate part 441 are bonded with each other.

(Fin Stacking Step S405)

Next, as shown in FIG. 26, a brazing filler material film 447 (for example, low melting point aluminum alloy film such as Al-10% Si alloy foil), corrugated fins 446, and a bottom plate part 445 are stacked on the other surface side of the of the top plate part 441. At this time, the bottom plate part 445 is stacked so that the bonding layer 445B of the bottom plate part 445 faces the corrugated fins 446 side. Moreover, a flux (not shown in the figure) primarily composed of $KAlF_4$ for example is preliminarily interposed between the top plate part 441 and the corrugated fins 446, and between the bottom plate part 445 and the corrugated fins 446.

(Brazing Step S406)

Next, the top plate part 441, the corrugated fins 446, and the bottom plate part 445 are placed into and heated in an atmosphere heating furnace while pressure (pressure, 1 to 35 kgf/cm$^2$) is being applied thereto in the stacked direction thereof. Then, between the top plate part 441 and the corrugated fins 446, there is formed a molten metal layer with the melted brazing filler material film 447. Also, between the bottom plate part 445 and the corrugated fins 446, there is formed a molten metal layer with the melted banding layer 445B.

Here, in the present embodiment, the interior of the atmosphere heating furnace is of a nitrogen gas atmosphere, and the heat application temperature is within a range of greater than or equal to 550° C. and less than or equal to 630° C.

By cooling this, the molten metal layer formed between the top plate part 441 and the corrugated fins 446 is solidified, and thereby the top plate part 441 and the corrugated fins 446 are brazed to each other. Moreover, the molten metal layer formed between the bottom plate part 445 and the corrugated fins 446 is solidified, and thereby the bottom plate part 445 and the corrugated fins 446 are brazed to each other. At this time, an oxide layer is formed on the surface of the top plate part 441, the corrugated fins 446, and the bottom plate part 445. However, the above flux removes the oxide layers.

In this way, a power module substrate having a heat sink of the present embodiment is produced.

In the power module substrate having a heat sink and the method of producing a power module substrate having a heat sink according to the present embodiment configured as described above, Ag is fixed between the top plate part 441 of the heat sink 440 and the second metal plate 423 (metal layer 413), and the Ag is diffused toward the top plate part 441 and the second metal plate 423, to thereby bond the top plate part 441 of the heat sink 440 with the power module substrate 410. Therefore, the top plate part 441 of the heat sink 440 can be reliably bonded with the power module substrate 410 even under comparatively low temperature conditions.

Figure 27:
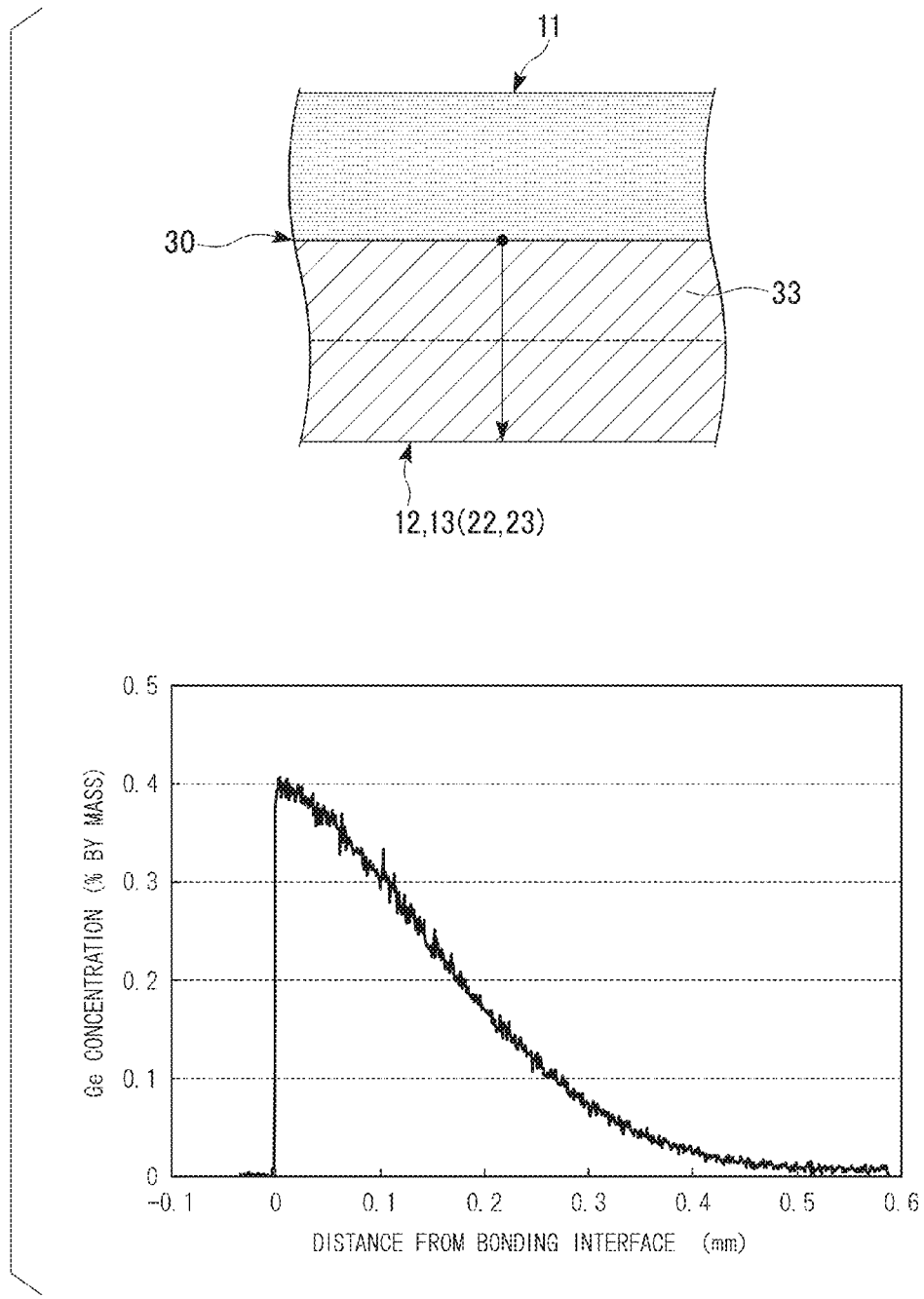
FIG. 27 is an explanatory diagram showing an additional element (Ge) concentration distribution of a circuit layer and a metal layer of a power module substrate of a sixth embodiment of the present invention.

Next, a sixth embodiment of the present invention is described, with reference to FIG. 1 and FIG. 27.

A power module according to the sixth embodiment is similar to that of the first embodiment, except it differs in additional elements which are solid-solubilized in a circuit layer 12 (metal plate 22) and a metal layer 13 (metal plate 23). Therefore, descriptions of common portions are omitted, and points of difference are described using FIG. 1 and the reference symbols thereof.

In a power module 1 according to the sixth embodiment, in FIG. 1, one or more additional elements selected from Zn, Ge, Mg, Ca, Ga, and Li are solid-solubilized in the circuit layer 12 (metal plate 22) and the metal layer 13 (metal plate 23) at a total concentration in a range of greater than or equal to 0.01% by mass and less than or equal to 5% by mass.

In the vicinity of each bonding interface 30 of the circuit layer 12 and the metal layer 13, there is formed a concentration gradient layer 33 in which the concentration of the additional element gradually decreases with moving away from the bonding interface 30 in the stacked direction. Here, in the present embodiment, Ge is used as an additional element, and the Ge concentration in the circuit layer 12 and the metal layer 13 in the vicinity of the bonding interface 30 is greater than or equal to 0.01% by mass and less than or equal to 5% by mass. FIG. 27 shows a concentration distribution of the additional element (Ge) in the circuit layer 12 and the metal layer 13.

Moreover, an additional element high concentration part, in which the additional element (Ge) is concentrated, is observed in the bonding interface 30.

In the additional element high concentration part, the concentration of the additional element (Ge concentration) is two or more times the concentration of the additional element (Ge concentration) in the circuit layer 12 (metal plate 22) and the metal layer 13 (metal plate 23). The thickness H of the additional element high concentration part is less than or equal to 4 nm.

Furthermore, in the additional element high concentration part, the concentration of oxygen is higher than that the oxygen concentration in the ceramic substrate 11.

Here, the concentration of the additional element (Ge concentration) is defined in a manner similar to that of the Ag concentration in the first embodiment, and the oxygen concentration is also similar to that of the first embodiment.

The mass ratio of Al, the additional element (Ge), O, and N when the bonding interface 30 is analyzed by means of energy dispersive X-ray analysis (EDS) is Al:additional element (Ge):O:N=50 to 90% by mass:1 to 30% by mass:1 to 10% by mass:25% by mass or less. Conditions of the EDS analysis are similar to those in the first embodiment.

The power module substrate 1 is produced in a method similar to that of the first embodiment. However, in its fixation step, the additional element (Ge) greater than or equal to 0.01 mg/cm$^2$ and less than or equal to 10 mg/cm$^2$ is fixed on the bonding surface of each of the metal plates 22 and 23 by means of sputtering.

In the present embodiment configured as described above, since Ge is such an element which lowers the melting point of aluminum, a molten metal region can be formed on the interface between the ceramic substrate 11 and the metal plates 22 and 23, even under comparatively low temperature conditions.

Furthermore, even if the ceramic substrate 11 is bonded with the circuit layer 12 (metal plate 22) and the metal layer 13 (metal plate 23) under bonding conditions of a comparatively low temperature and a short period of time, the ceramic substrate 11 can be strongly bonded with the metal plates 22 and 23.

Moreover, the bonding interface 30 between the ceramic substrate 11, and the circuit layer 12 (metal plate 22) and the metal layer 13 (metal plate 23) is strengthened by solid solution strengthening with Ge, and thereby cracks in the circuit layer 12 (metal plate 22) and the metal layer 13 (metal plate 23) can be prevented.

Furthermore, in the present embodiment, since the additional element high concentration part, in which the additional element (Ge) is concentrated, is formed in the bonding interface 30 between the ceramic substrate 11 and the metal plates 22 and 23, which serve as the circuit layer 12 and the metal layer 13, it is possible to improve the bonding strength between the ceramic substrate 11 and the metal plates 22 and 23. Moreover, since the thickness of the additional element high concentration part is less than or equal to 4 nm, crack occurrence in the additional element high concentration part associated with the stress exerted when a thermal cycle load is being applied, is suppressed.

Furthermore, in the present embodiment, since the mass ratio in the bonding interface 30 is Al:additional element (Ge):O:N=50 to 90% by mass:1 to 30% by mass:1 to 10% by mass:25% by mass or less, it is possible to prevent an excessive amount of the additional element in the bonding interface 30, that inhibits bonding. Moreover, the effect of improving the bonding strength with atoms of additional element atoms (Ge atoms) can be sufficiently achieved. Also, the presence of a portion with a high level of oxygen concentration in the bonding interface 30 can be prevented, and crack occurrence when a thermal cycle load is being applied, is suppressed.

Furthermore, since the configuration is provided such that a molten metal region is formed on the interface between the ceramic substrate 11 and the metal plates 22 and 23, there is no need for using an Al—Si based brazing filler thin film. Therefore, it is possible, at low cost, to produce a power module substrate 10 with the ceramic substrate 11 being reliably bonded with the metal plates 22 and 23.

Moreover, in the present embodiment, since the amount of Ge is greater than or equal to 0.01 mg/cm$^2$, a molten metal region can be reliably formed on the interface between the ceramic substrate 11 and the metal plates 22 and 23.

Furthermore, since the amount of Ge is less than or equal to 10 mg/cm$^2$, it is possible to prevent excessive diffusion of the additional element (Ge) toward the metal plates 22 and 23, which causes an excessive increase in the strength of the metal plates 22 and 23. Accordingly, when a thermal cycle load is applied to the power module substrate 10, thermal stress can be absorbed by the circuit layer 12 and the metal layer 13, and cracks in the ceramic substrate 11 can be prevented.

Moreover, there is no need for performing operations for positioning a brazing filler material film, and the power module substrate 10 can be produced efficiently.

In addition, since the fixation layers 24 and 25 are formed on the bonding surface of the metal plates 22 and 23, the oxide layer interposed on the interface between the ceramic substrate 11 and the metal plates 22 and 23 is present only on the surface of the metal plates 22 and 23, and accordingly, initial bonding yield rate can be improved.

Figure 28:
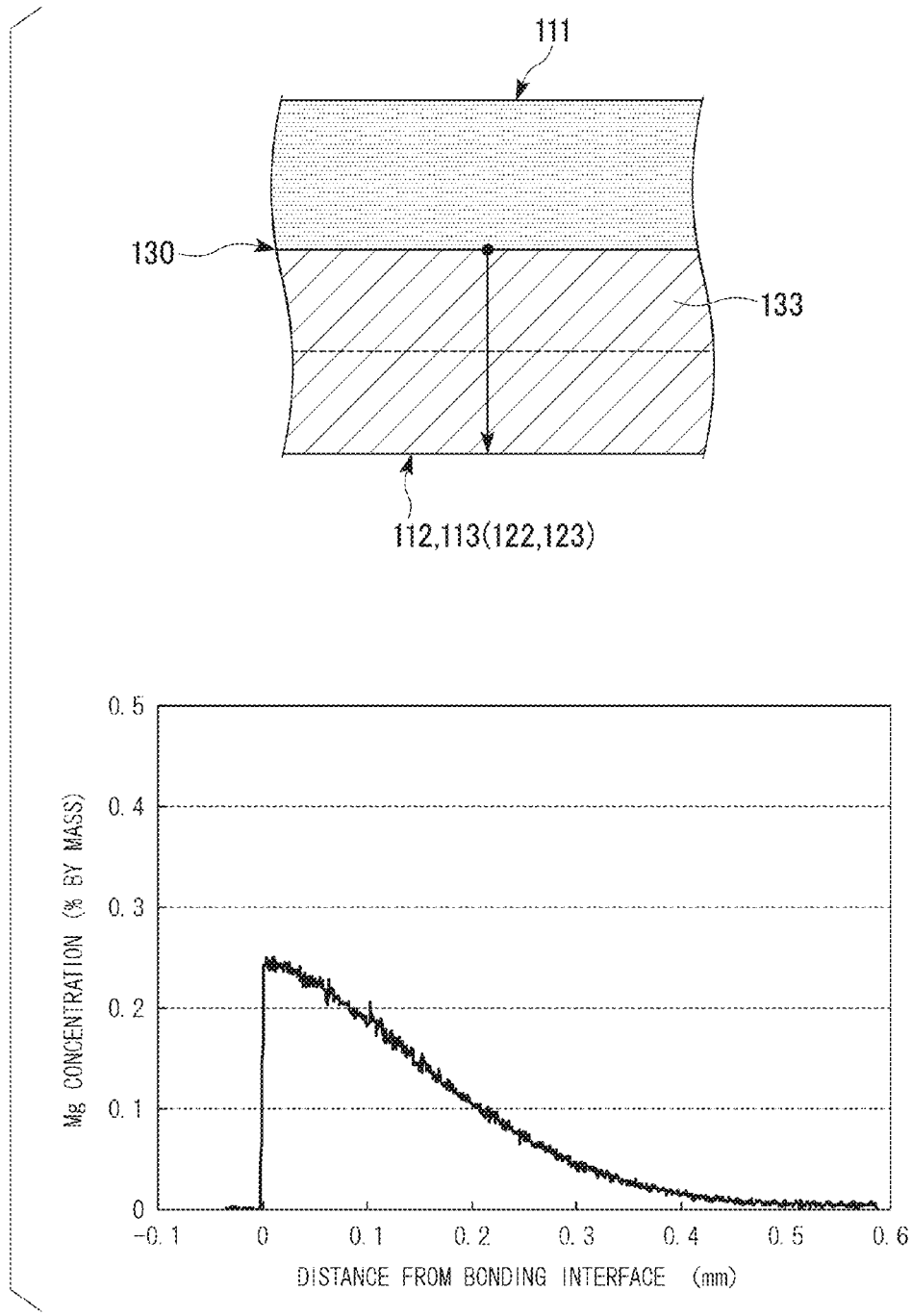
FIG. 28 is an explanatory diagram showing an additional element (Mg) concentration distribution of a circuit layer and a metal layer of a power module substrate of a seventh embodiment of the present invention.

Next, a seventh embodiment of the present invention is described, with reference to FIG. 7 and FIG. 28.

A power module according to the seventh embodiment is similar to that of the second embodiment, except it differs in additional elements which are solid-solubilized in a circuit layer 112 (metal plate 122) and a metal layer 113 (metal plate 123). Therefore, descriptions of common portions are omitted, and points of difference are described using FIG. 7 and the reference symbols thereof.

In a power module 101 according to the seventh embodiment, in FIG. 7, one or more additional elements selected from Ag, Zn, Ge, Mg, Ca, Ga, and Li are solid-solubilized in the circuit layer 112 (metal plate 122) and the metal layer 113 (metal plate 123) at a total concentration in a range of greater than or equal to 0.01% by mass and less than or equal to 5% by mass.

To describe in detail, in the vicinity of each bonding interface 130 of the circuit layer 112 and the metal layer 113, there is formed a concentration gradient layer 133 in which the additional element concentration gradually decreases with moving away from from the bonding interface 130 in the stacked direction.

Here, in the present embodiment, Mg is used as an additional element, and the Mg concentration in the circuit layer 112 and the metal layer 113 in the vicinity of the bonding interface 130 is greater than or equal to 0.01% by mass and less than or equal to 5% by mass. FIG. 28 shows a concentration distribution of the additional element (Mg) in the circuit layer 112 and the metal layer 113.

Moreover, an additional element high concentration part, in which the additional element (Mg) is concentrated, is observed in the bonding interface 130. In the additional element high concentration part, the concentration of the additional element (Mg concentration) is two or more times the concentration of the additional element (Mg concentration) in the circuit layer 112 (metal plate 122) and the metal layer 113 (metal plate 123). The thickness H of the additional element high concentration part is less than or equal to 4 nm.

Furthermore, the mass ratio of Al, the additional element (Mg), and O when the bonding interface 130 is analyzed by means of energy dispersive X-ray analysis (EDS) is Al:additional element (Mg):O=50 to 90% by mass:1 to 30% by mass:45% by mass or less. Conditions of the EDS analysis are similar to those in the second embodiment.

The power module substrate is produced in a method similar to that of the second embodiment. However, the Ag paste application step is replaced with a step in which the additional element (Mg) greater than or equal to 0.01 mg/cm2 and less than or equal to 10 mg/cm2 is fixed on one surface and the other surface of the ceramic substrate 111 by means of vapor deposition. Moreover, the heat application temperature in the heat application step is greater than or equal to 600° C. and less than or equal to 650° C.

In the present embodiment configured as described above, bonding is performed by having Mg fixed on the one surface and the other surface of the ceramic substrate 111 diffused toward the metal plates 122 and 123. Therefore, even if the bonding is performed under bonding conditions of a comparatively low temperature and a short period of time, the ceramic substrate 111 can be strongly bonded with the metal plates 122 and 123.

Moreover, Mg is strengthened by solid solution strengthening in the bonding interface 130 between the ceramic substrate 111, and the circuit layer 112 and the metal layer 113, and cracks in the circuit layer 112 and the metal layer 113 can be prevented.

Furthermore, in the present embodiment, since there is formed the additional element high concentration part, in which the additional element (Mg) is concentrated, it is possible, with atoms of the additional element (Mg atoms) present in the vicinity of the interface, to improve the strength of bonding between the ceramic substrate 111 and the metal plates 122 and 123. Moreover, since the thickness of the additional element high concentration part is less than or equal to 4 nm, crack occurrence in the additional element high concentration part associated with the stress exerted when a thermal cycle load is being applied, is suppressed.

Furthermore, in the present embodiment, since the mass ratio in the bonding interface 130 is Al:additional element (Mg):O=50 to 90% by mass:1 to 30% by mass:45% by mass or less, the excessive production of reaction products from Al and the additional element (Mg) in the bonding interface 130, that inhibits bonding can be prevented. Moreover, the effect of improving the bonding strength with atoms of the additional element (Mg atoms) can be sufficiently achieved.

Figure 29:
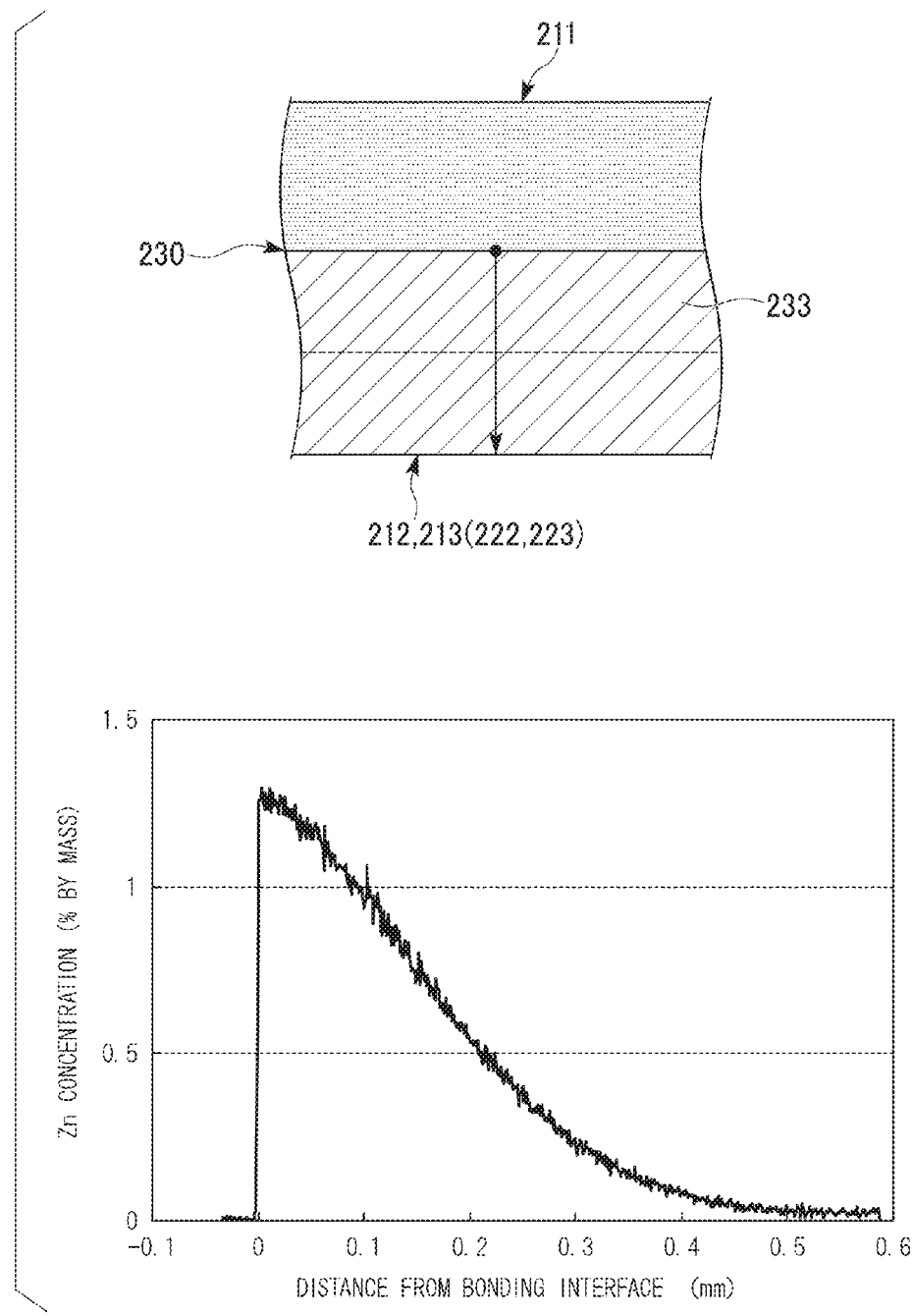
FIG. 29 is an explanatory diagram showing an additional element (Zn) concentration distribution of a circuit layer and a metal layer of a power module substrate of an eighth embodiment of the present invention.

Next, an eighth embodiment of the present invention is described, with reference FIG. 12 and FIG. 29.

A power module according to the eighth embodiment is similar to that of the third embodiment, except it differs in additional elements which are solid-solubilized in a circuit layer 212 (metal plate 222) and a metal layer 213 (metal plate 223). Therefore, descriptions of common portions are omitted, and points of difference are described using FIG. 12 and the reference symbols thereof.

In a power module 201 according to the eighth embodiment, in FIG. 12, one or more additional elements selected from Zn, Ge, Mg, Ca, Ga, and Li are solid-solubilized in the circuit layer 212 (metal plate 222) and the metal layer 213 (metal plate 223) at a total concentration in a range of greater than or equal to 0.01% by mass and less than or equal to 5% by mass.

To describe in detail, in the vicinity of each bonding interface 230 of the circuit layer 212 and the metal layer 213, there is formed a concentration gradient layer 233 in which the additional element concentration gradually decreases with moving away from the bonding interface 230 in the stacked direction.

In the present embodiment, Zn is used as an additional element, and the Zn concentration in the circuit layer 212 and the metal layer 213 in the vicinity of the bonding interface 230 is greater than or equal to 0.01% by mass and less than or equal to 5% by mass. FIG. 29 shows a concentration distribution of the additional element (Zn) in the circuit layer 212 and the metal layer 213.

Moreover, an additional element high concentration part, in which the additional element (Zn) is concentrated, is observed in the bonding interface 230. In the additional element high concentration part, the concentration of the additional element (Zn concentration) is two or more times the concentration of the additional element (Zn concentration) in the circuit layer 212 (metal plate 222) and the metal layer 213 (metal plate 223). The thickness H of the additional element high concentration part is less than or equal to 4 nm.

The oxygen concentration of the additional element high concentration part is higher than the oxygen concentration in the ceramic substrate 211.

Here, the concentration of the additional element (Zn concentration) is defined in a manner similar to that of the Ag concentration in the third embodiment, and the oxygen concentration is also similar to that of the third embodiment.

Furthermore, the mass ratio of Al, Si, the additional element (Zn), O, and N when the bonding interface 230 is analyzed by means of energy dispersive X-ray analysis (EDS) is Al:Si:additional element (Zn):O:N=15 to 45% by mass:15 to 45% by mass:1 to 30% by mass:1 to 10% by mass:25% by mass or less. Conditions of the EDS analysis are similar to those in the third embodiment.

The power module substrate 210 is produced in a method similar to that of the third embodiment. However, in the present embodiment, the Ag paste sintering step is replaced with a step in which the additional element (Zn) greater than or equal to 0.01 mg/cm$^2$ and less than or equal to 10 mg/cm$^2$ is fixed on the surface of the metal plates 222 and 223 by means of plating (plating step). Moreover, the heat application temperature in the heat application step is greater than or equal to 600° C. and less than or equal to 650° C. The thickness of the plating is within a range of 1 μm to 5 μm.

Moreover, in the heat sink stacking step, a fixation layer containing the additional element (Zn) is interposed between the metal layer 213 and the top plate part 241. In the present embodiment, the fixation layer is formed by performing sputtering and plating on the other surface of the metal layer 213.

In the power module substrate 210 and the power module 201 of the present embodiment configured as described above, bonding is performed by having the plated additional element (Zn) diffused toward the metal plates 222 and 223 side. Therefore, even if the bonding is performed under bonding conditions of a comparatively low temperature and a short period of time, the ceramic substrate 211 can be strongly bonded with the metal plates 222 and 223.

Furthermore, in the present embodiment, since there is formed the additional element high concentration part, in which the additional element (Zn) is concentrated, it is possible, with atoms of the additional element (Zn atoms) present in the vicinity of the interface, to improve the strength of bonding between the ceramic substrate 211 and the metal plates 222 and 223. Moreover, since the thickness of the additional element high concentration part is less than or equal to 4 nm, crack occurrence in the additional element high concentration part associated with the stress exerted when a thermal cycle load is being applied, is suppressed.

Furthermore, in the present embodiment, since the mass ratio in the bonding interface 230 is Al:Si:the additional element (Zn):O:N=15 to 45% by mass:15 to 45% by mass:1 to 30% by mass:1 to 10% by mass:25% by mass or less, the excessive production of reaction products from Al and the additional element (Zn) in the bonding interface 230, that inhibits bonding can be prevented, and the effect of improving the bonding strength with additional element atoms (Zn atoms) can be sufficiently achieved. Also, the presence of a portion with a high level of oxygen concentration in the bonding interface 230 can be prevented, and crack occurrence when a thermal cycle load is being applied, is suppressed.

Moreover, in the present embodiment, since the additional element (Zn) is fixed on the metal plates 222 and 223 by means of plating, the additional element (Zn) can be reliably interposed between the ceramic substrate 211 and the metal plates 222 and 223.

Figure 30:
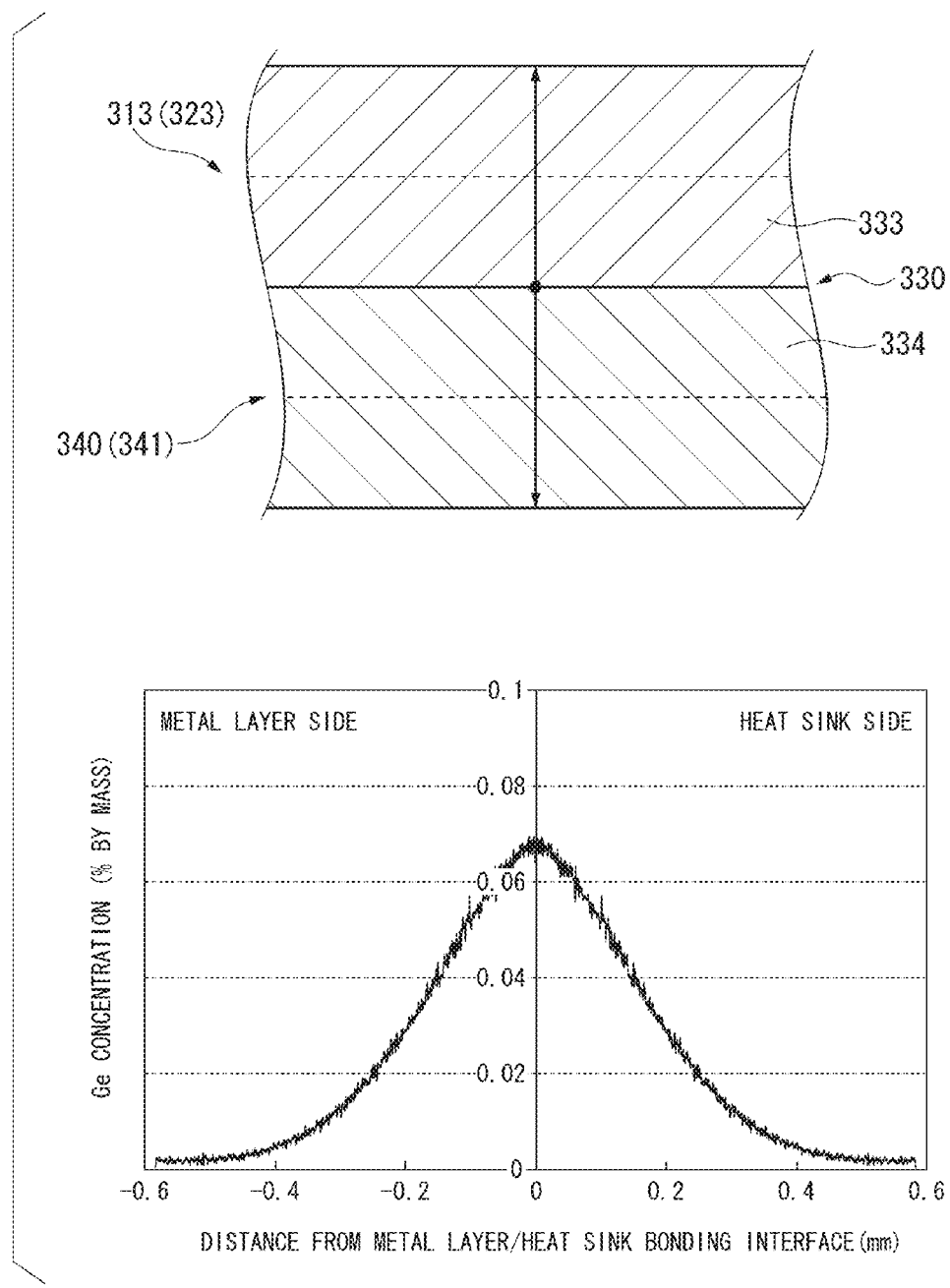
FIG. 30 is an explanatory diagram showing an additional element (Ge) concentration distribution of a metal layer and heat sink of a power module substrate having a heat sink of a ninth embodiment of the present invention.

Next, a ninth embodiment of the present invention is described, with reference to FIG. 18 and FIG. 30.

A power module according to the ninth embodiment is similar to that of the fourth embodiment, except it differs in additional elements which are solid-solubilized in a metal layer 313 (second metal plate 323) and a heat sink 340. Therefore, descriptions of common portions are omitted, and points of difference are described using FIG. 18 and the reference symbols thereof.

In a power module 301 according to the ninth embodiment, in FIG. 18, one or more additional elements selected from Zn, Ge, Mg, Ca, Ga, and Li are solid-solubilized in the metal layer 313 (second metal plate 323) and the heat sink 340 at a total concentration in a range of greater than or equal to 0.01% by mass and less than or equal to 5% by mass.

To describe in detail, in the vicinity of the bonding interface 330 between the metal layer 313 and the heat sink 340, there are formed concentration gradient layers 333 and 334 in which the additional element concentration gradually decreases with moving away from the bonding interface 330 in the stacked direction.

Here, in the present embodiment, Ge is used as an additional element, and the Ge concentration in the metal layer 313 and the heat sink 340 in the vicinity of the bonding interface 330 is greater than or equal to 0.01% by mass and less than or equal to 5% by mass. FIG. 30 shows a concentration distribution of the additional element (Ge) in the metal layer 313 and the heat sink 340.

A power module substrate having a heat sink of this configuration is produced, as with the fourth embodiment, by bonding the ceramic substrate 311 with the metal plates 322 and 323, and bonding the metal plate 323 and the heat sink 340 at the same time.

In the present embodiment configured as described above, since Ge is such an element which lowers the melting point of aluminum, even if the bonding is performed under bonding conditions of a comparatively low temperature and a short period of time, the heat sink 340 and the second metal plate 323 can be strongly bonded with each other.

Moreover, in the present embodiment, since Ge is interposed in the bonding interface, it is possible to strongly bond the ceramic substrate 311 with the first metal plate 322, and the ceramic substrate 311 with the second metal plate 323.

Furthermore, no brazing filler material film is used in bonding the heat sink 340 with the second metal plate 323, and bonding the ceramic substrate 311 with the first metal plate 322 and the second metal plate 323. Therefore, there is no need for performing operations for positioning a brazing filler material film. Therefore, a power module substrate having a heat sink of the present embodiment can be efficiently produced at low cost.

Moreover, in the present embodiment, the configuration is provided such that the bonding of the ceramic substrate 311 with the first metal plate 322 and the second metal plate 323, and the bonding of the second metal plate 323 with the heat sink 340 are performed at the same time. Therefore, the cost involved in these bonding operations can be reduced significantly. Furthermore, since there is no need for repeatedly performing heat application and cooling for the ceramic substrate 311, it is possible to reduce warpage of the power module substrate having a heat sink, and produce a high quality power module substrate having a heat sink.

Moreover, in the power module substrate having a heat sink according to the present embodiment, solid solution strengthening is performed with the additional element Ge, and cracks in the second metal plate 323 (metal layer 313) and the heat sink 340 can be prevented. Therefore, it is possible to provide a highly reliable power module substrate having a heat sink.

The embodiments of the present embodiment have been described. However, the present invention is not limited by these embodiments, and appropriate modifications may be made without departing from the technical idea of the invention.

For example, the metal plates which constitute the circuit layer and the metal layer have been described as being rolled plates composed of aluminum having a purity of 99.99% or more. However, it is not limited to this, and they may be composed of aluminum (2N aluminum) or an aluminum alloy having a purity of 99% or more.

Moreover, as the additional elements, use of Ag, Ge, Mg, and Zn has been described. However, it is not limited to this, and one or more additional elements selected from Ag, Zn, Ge, Mg, Ca, Ga, and Li may be used.

Furthermore, the additional elements have been described to be fixed by means of sputtering, paste application, and plating. However, it is not limited to this, and the additional elements may be fixed by means of vapor deposition, CVD, or cold spraying, or by applying an ink which a powder is dispersed therein.

Moreover, Al may be fixed along with Ag, Zn, Ge, Mg, Ca, Ga, and Li. In particular, when using oxidatively active elements such as Mg, Ca, and Li as additional elements, oxidation of these elements can be prevented by fixing them together with Al.

Furthermore, the heat sink has been described as being configured with aluminum. However, it may be configured with an aluminum alloy, a composite material containing aluminum, or the like. Furthermore, the heat sink has been described as having cooling medium flow passages. However, there is no particular limitation on the structure of the heat sink, and a heat sink of various types of configurations may be used.

Figure 31:
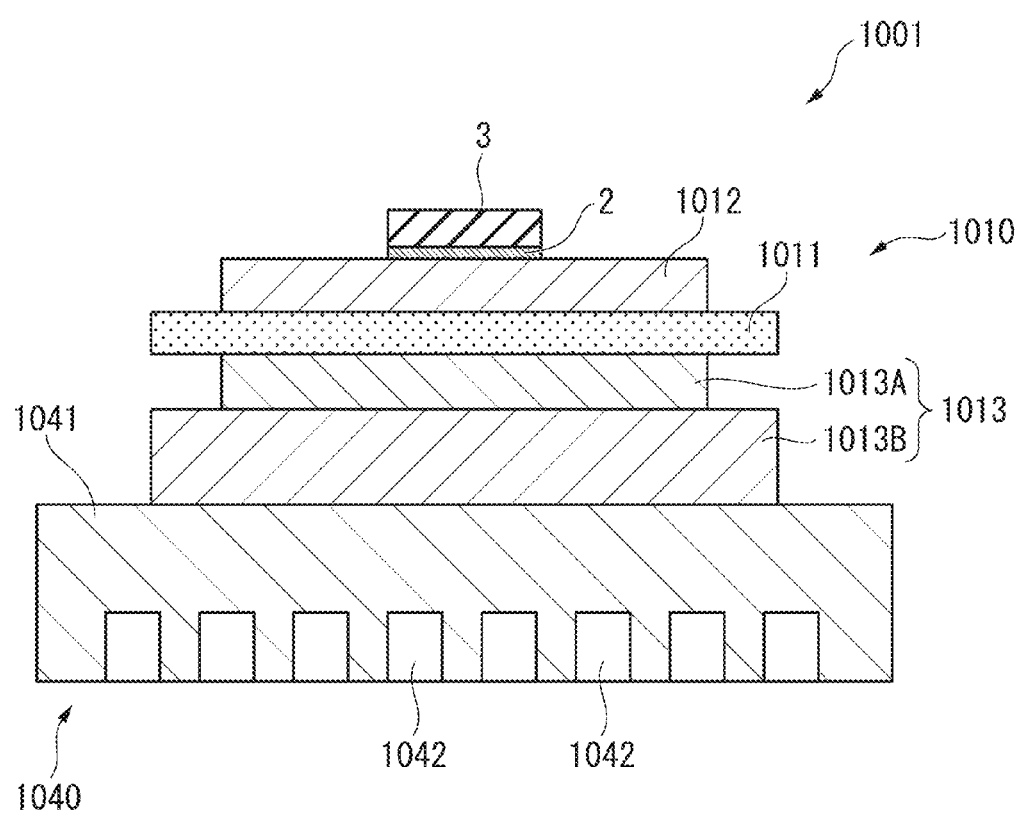
FIG. 31 is a schematic explanatory diagram of a power module which uses a power module substrate having a heat sink of another embodiment of the present invention.

Furthermore, as shown in FIG. 31, a metal layer 1013 may be of a structure with a plurality of metal plates 1013A and 1013B stacked together. In this case, the metal plate 1013A positioned on one side (upper side in FIG. 31) of the metal layer 1013 is bonded on a ceramic substrate 1011, and the metal plate 1013B positioned on the other side (lower side in FIG. 31) is bonded on a top plate part 1041 of a heat sink 1040. One or more additional elements selected from Ag, Zn, Ge, Mg, Ca, Ga, and Li are interposed between the metal plate 1013B positioned on the other side and the top plate part 1041 of the heat sink 1040, to thereby bond the metal plate 1013B positioned on the other side, with the top plate part 1041 of the heat sink 1040. Here, the metal layer 1013 may be configured by having the stacked metal plates 1013A and 1013B bonded with each other while the above additional element is interposed therebetween. Two metal plates 1013A and 1013B are stacked in FIG. 31. However, there is no limitation on the number of metal plates to be stacked. Moreover, the sizes and shapes of metal plates to be stacked may be different, or they may be adjusted to the same size and shape. Furthermore, the compositions of these metal plates may be different.

EXAMPLES

Example 1

A comparative experiment performed to verify the validity of the present invention is described.

A circuit layer containing 4N aluminum with thickness of 0.6 mm, and a metal layer containing 4N aluminum with thickness of 0.6 mm were bonded with a ceramic substrate composed of AlN with thickness of 0.635 mm, to produce a power module substrate.

Here, one or more additional elements selected from Ag, Zn, Ge, Mg, Ca, Ga, and Li were fixed on the bonding surface of the aluminum plates (4N aluminum) serving as the circuit layer and the metal layer, to thereby form fixation layers. Further, the metal plates and the ceramic substrate were stacked, and then heated and pressurized (temperature: 650° C., pressure: 4 kgf/cm$^2$, duration: 30 minutes), to thereby bond the metal plates with the ceramic substrate.

Then, various types of specimens with varied additional elements to be fixed were fabricated, and the concentration of the additional elements in the vicinity of the bonding interface (at a position 50 µm from the bonding interface) was analyzed by means of EPMA. Moreover, bonding reliability evaluation was conducted, using these specimens. As an evaluation of bonding reliability, bonding rates were compared after a thermal cycle (−45° C. to 125° C.) had been repeated 2,000 times. The results are shown in Table 1. The bonding rates were calculated using the following formula. Here, the initial bonding area refers to an area to be bonded prior to bonding.

Bonding rate=(initial bonding area−peeled area)/initial bonding area

TABLE 1

| | | FIXATION AMOUNT (mg/cm²) | | | | | | | | BONDING |
|---|---|---|---|---|---|---|---|---|---|---|
| | | Ag | Zn | Ge | Mg | Ca | Ga | Li | TOTAL | MASS % | RATE |
| EXAMPLES OF THE PRESENT INVENTION | 1 | 0.5250 | 1.0710 | — | — | — | — | — | 1.5960 | 2.468 | 91.1% |
| | 2 | 0.3500 | 0.7140 | 0.1970 | — | — | — | — | 1.2610 | 2.054 | 90.7% |
| | 3 | 0.2625 | 0.5355 | 0.1478 | 0.0870 | — | — | — | 1.0328 | 1.774 | 91.1% |
| | 4 | 0.2625 | 0.5355 | 0.1478 | — | 0.1155 | — | — | 1.0613 | 1.815 | 89.8% |
| | 5 | 0.2625 | 0.5355 | 0.1478 | — | — | 0.5910 | — | 1.5368 | 2.372 | 89.5% |
| | 6 | 0.2625 | 0.5355 | 0.1478 | — | — | — | 0.0928 | 1.0385 | 1.782 | 90.1% |
| | 7 | 0.2100 | 0.4284 | 0.1182 | 0.0696 | 0.0924 | — | — | 0.9186 | 1.613 | 89.6% |
| | 8 | 0.2100 | 0.4284 | 0.1182 | 0.0696 | — | 0.4728 | — | 1.2990 | 2.103 | 89.8% |
| | 9 | 0.2100 | 0.4284 | 0.1182 | 0.0696 | — | — | 0.0742 | 0.9004 | 1.593 | 89.2% |
| | 10 | 0.1750 | 0.3570 | 0.0985 | 0.0580 | 0.0770 | 0.3940 | — | 1.1595 | 1.921 | 90.4% |
| | 11 | 0.1750 | 0.3570 | 0.0985 | 0.0580 | 0.0770 | — | 0.0618 | 0.8273 | 1.490 | 89.4% |
| | 12 | 0.1500 | 0.3060 | 0.0844 | 0.0497 | 0.0660 | 0.3377 | 0.0530 | 1.0469 | 1.785 | 88.7% |
| | 13 | 0.5250 | — | 0.2955 | — | — | — | — | 0.8205 | 1.471 | 91.9% |
| | 14 | 0.3500 | — | 0.1970 | 0.1160 | — | — | — | 0.6630 | 1.249 | 91.6% |
| | 15 | 0.3500 | — | 0.1970 | — | 0.1540 | — | — | 0.7010 | 1.303 | 90.4% |
| | 16 | 0.3500 | — | 0.1970 | — | — | 0.7880 | — | 1.3350 | 2.138 | 90.1% |
| | 17 | 0.3500 | — | 0.1970 | — | — | — | 0.1237 | 0.6707 | 1.275 | 89.4% |
| | 18 | 0.2625 | — | 0.1478 | 0.0870 | 0.1155 | — | — | 0.6128 | 1.186 | 90.0% |
| | 19 | 0.2625 | — | 0.1478 | 0.0870 | — | 0.5910 | — | 1.0883 | 1.837 | 90.0% |
| | 20 | 0.2625 | — | 0.1478 | 0.0870 | — | — | 0.0928 | 0.5900 | 1.141 | 90.6% |
| | 21 | 0.2100 | — | 0.1182 | 0.0696 | 0.0924 | 0.4728 | — | 0.9630 | 1.670 | 90.7% |
| | 22 | 0.2100 | — | 0.1182 | 0.0696 | 0.0924 | — | 0.0742 | 0.5644 | 1.108 | 89.7% |
| | 23 | 0.1750 | — | 0.0985 | 0.0580 | 0.0770 | 0.3940 | 0.0618 | 0.8643 | 1.526 | 88.5% |
| | 24 | 1.0500 | — | — | — | — | — | — | 1.0500 | 1.773 | 93.1% |
| | 25 | 0.5250 | — | — | 0.1740 | — | — | — | 0.6990 | 1.312 | 91.3% |
| | 26 | 0.5250 | — | — | — | 0.2310 | — | — | 0.7560 | 1.383 | 90.1% |
| | 27 | 0.5250 | — | — | — | — | 1.1820 | — | 1.7070 | 2.596 | 90.4% |
| | 28 | 0.5250 | — | — | — | — | — | 0.1855 | 0.7105 | 1.325 | 90.4% |
| | 29 | 0.3500 | — | — | 0.1160 | 0.1540 | — | — | 0.6200 | 1.187 | 89.8% |
| | 30 | 0.3500 | — | — | 0.1160 | — | 0.7880 | — | 1.2540 | 2.057 | 89.8% |
| | 31 | 0.3500 | — | — | 0.1160 | — | — | 0.1237 | 0.5897 | 1.155 | 89.4% |
| | 32 | 0.2625 | — | — | 0.0870 | 0.1155 | 0.5910 | — | 1.0560 | 1.783 | 89.0% |
| | 33 | 0.2625 | — | — | 0.0870 | 0.1155 | — | 0.0928 | 0.5578 | 1.091 | 89.8% |
| | 34 | 0.2100 | — | — | 0.0696 | 0.0924 | 0.4728 | 0.0742 | 0.9190 | 1.610 | 90.1% |
| | 35 | 9.8000 | — | — | — | — | — | — | 9.8000 | 9.833 | 76.2% |
| | 36 | 0.0150 | — | — | — | — | — | — | 0.0150 | 0.069 | 70.3% |
| COMPARATIVE EXAMPLES | 1 | 11.0000 | — | — | — | — | — | — | 11.0000 | 10.802 | 67.7% |
| | 2 | 0.0090 | — | — | — | — | — | — | 0.0090 | 0.047 | 60.1% |

In Comparative Example 1 where the Ag fixation amount was 11 mg/cm², the Ag concentration in the vicinity of the bonding area exceeded 10% by mass, and the bonding rate was 67.7% after a thermal cycle (−45° C. to 125° C.) had been repeated 2,000 times. The reason for this is presumed to be that the amount of Ag was high and the metal plate had become excessively hard, resulting in thermal stress associated with the thermal cycle load being applied on the bonding interface.

Moreover, in Comparative Example 2 where the Ag fixation amount was 0.009 mg/cm², the Ag concentration in the vicinity of the bonding area was less than 0.05% by mass, and the bonding rate was 60.1% after a thermal cycle (−45° C. to 125° C.) had been repeated 2,000 times. The reason for this is judged to be that the amount of Ag interposed on the interface was low, and a molten metal region could not be sufficiently formed on the interface between the metal plate and the ceramic substrate.

In contrast, in Examples 1 to 36 of the present invention, the Ag concentration or the total concentration of one or more additional elements selected from Ag, Zn, Ge, Mg, Ca, Ga, and Li in the vicinity of the bonding interface was greater than or equal to 0.05% by mass and less than or equal to 10% by mass, and the bonding rates were all 70% or higher after a thermal cycle (−45° C. to 125° C.) had been repeated 2,000 times. It is judged that diffusion of each additional element enabled reliable formation of a molten metal region on the interface between the metal plate and the ceramic substrate, enabling strong bonding between the metal plate and the ceramic substrate.

Example 2

A comparative experiment performed to verify the validity of the present invention is described.

A circuit layer containing 4N aluminum with thickness of 0.6 mm, and a metal layer containing 4N aluminum with thickness of 0.6 mm were bonded with a ceramic substrate composed of AlN with thickness of 0.635 mm, to produce a power module substrate.

Here, one or more additional elements selected from Zn, Ge, Mg, Ca, Ga, and Li were fixed on the bonding surface of the aluminum plates (4N aluminum) serving as the circuit layer and the metal layer, to thereby form fixation layers. Further, the metal plates and the ceramic substrate were stacked, and then heated and pressurized (temperature: 650° C., pressure: 4 kgf/cm², duration: 30 minutes), to thereby bond the metal plates with the ceramic substrate.

Then, various types of specimens with varied additional elements to be fixed were fabricated, and the concentration of the additional elements in the vicinity of the bonding interface (at a position 50 μm from the bonding interface) was analyzed by means of EPMA. Moreover, bonding reliability evaluation was conducted, using these specimens. As an evaluation of bonding reliability, bonding rates were compared after a thermal cycle (−45° C. to 125° C.) had been repeated 2,000 times.

The results are shown in Table 2 and Table 3. The bonding rates were calculated using the following formula. Here, the initial bonding area refers to an area to be bonded prior to bonding.

Bonding rate=(initial bonding area−peeled area)/initial bonding area

In Comparative Example 12 where the fixation amount of the additional element in the fixation layer was 0.009 mg/cm², the bonding rate was 59.8% after a thermal cycle (−45° C. to 125° C.) had been repeated 2,000 times. The reason for this is judged to be that the amount of the additional element interposed on the interface was low, and a molten metal region

TABLE 2

| | | FIXATION AMOUNT (mg/cm²) | | | | | | | BONDING |
| --- | --- | --- | --- | --- | --- | --- | --- | --- | --- |
| | | Zn | Ge | Mg | Ca | Ga | Li | TOTAL | MASS % | RATE |
| EXAMPLES OF THE PRESENT INVENTION | 41 | 2.1420 | — | — | — | — | — | 2.1420 | 1.263 | 88.1% |
| | 42 | 1.0710 | 0.2955 | — | — | — | — | 1.3665 | 0.847 | 89.1% |
| | 43 | 1.0710 | — | 0.1740 | — | — | — | 1.2450 | 0.771 | 89.2% |
| | 44 | 1.0710 | — | — | 0.2310 | — | — | 1.3020 | 0.811 | 87.0% |
| | 45 | 1.0710 | — | — | — | 1.1820 | — | 2.2530 | 1.327 | 88.3% |
| | 46 | 1.0710 | — | — | — | — | 0.1855 | 1.2565 | 0.779 | 86.7% |
| | 47 | 0.7140 | 0.1970 | 0.1160 | — | — | — | 1.0270 | 0.649 | 88.6% |
| | 48 | 0.7140 | 0.1970 | — | 0.1540 | — | — | 1.0650 | 0.672 | 88.4% |
| | 49 | 0.7140 | 0.1970 | — | — | 0.7880 | — | 1.6990 | 1.014 | 87.8% |
| | 50 | 0.7140 | 0.1970 | — | — | — | 0.1237 | 1.0347 | 0.652 | 87.6% |
| | 51 | 0.5355 | 0.1478 | 0.0870 | 0.1155 | — | — | 0.8858 | 0.564 | 88.7% |
| | 52 | 0.5355 | 0.1478 | 0.0870 | — | 0.5910 | — | 1.3613 | 0.834 | 89.6% |
| | 53 | 0.5355 | 0.1478 | 0.0870 | — | — | 0.0928 | 0.8630 | 0.557 | 88.3% |
| | 54 | 0.4284 | 0.1182 | 0.0696 | 0.0924 | 0.4728 | — | 1.1814 | 0.740 | 89.3% |
| | 55 | 0.4284 | 0.1182 | 0.0696 | 0.0924 | — | 0.0742 | 0.7828 | 0.512 | 89.5% |
| | 56 | 0.3570 | 0.0985 | 0.0580 | 0.0770 | 0.3940 | 0.0618 | 1.0463 | 0.661 | 87.7% |
| | 57 | — | 0.5910 | — | — | — | — | 0.5910 | 0.394 | 91.2% |
| | 58 | — | 0.2955 | 0.1740 | — | — | — | 0.4695 | 0.323 | 89.7% |
| | 59 | — | 0.2955 | — | 0.2310 | — | — | 0.5265 | 0.354 | 89.4% |
| | 60 | — | 0.2955 | — | — | 1.1820 | — | 1.4775 | 0.899 | 89.4% |
| | 61 | — | 0.2955 | — | — | — | 0.1855 | 0.4810 | 0.327 | 89.2% |
| | 62 | — | 0.1970 | 0.1160 | 0.1540 | — | — | 0.4670 | 0.320 | 89.7% |
| | 63 | — | 0.1970 | 0.1160 | — | 0.7880 | — | 1.1010 | 0.694 | 90.1% |
| | 64 | — | 0.1970 | 0.1160 | — | — | 0.1237 | 0.4367 | 0.302 | 89.4% |
| | 65 | — | 0.1478 | 0.0870 | 0.1155 | 0.5910 | — | 0.9413 | 0.606 | 89.4% |
| | 66 | — | 0.1478 | 0.0870 | 0.1155 | — | 0.0928 | 0.4430 | 0.303 | 90.0% |
| | 67 | — | 0.1182 | 0.0696 | 0.0924 | 0.4728 | 0.0742 | 0.8272 | 0.539 | 88.7% |

TABLE 3

| | | FIXATION AMOUNT (mg/cm²) | | | | | | | BONDING |
| --- | --- | --- | --- | --- | --- | --- | --- | --- | --- |
| | | Zn | Ge | Mg | Ca | Ga | Li | TOTAL | MASS % | RATE |
| EXAMPLES OF THE PRESENT INVENTION | 68 | — | — | 0.3480 | — | — | — | 0.3480 | 0.245 | 90.8% |
| | 69 | — | — | 0.1740 | 0.2310 | — | — | 0.4050 | 0.281 | 89.5% |
| | 70 | — | — | 0.1740 | — | 1.1820 | — | 1.3560 | 0.833 | 88.2% |
| | 71 | — | — | 0.1740 | — | — | 0.1855 | 0.3595 | 0.251 | 88.5% |
| | 72 | — | — | 0.1160 | 0.1540 | 0.7880 | — | 1.0580 | 0.665 | 87.8% |
| | 73 | — | — | 0.1160 | 0.1540 | — | 0.1237 | 0.3937 | 0.276 | 88.6% |
| | 74 | — | — | 0.0870 | 0.1155 | 0.5910 | 0.0928 | 0.8863 | 0.571 | 89.2% |
| | 75 | — | — | — | 0.4620 | — | — | 0.4620 | 0.318 | 88.1% |
| | 76 | — | — | — | 0.2310 | 1.1820 | — | 1.4130 | 0.873 | 86.6% |
| | 77 | — | — | — | 0.2310 | — | 0.1855 | 0.4165 | 0.290 | 86.8% |
| | 78 | — | — | — | 0.1540 | 0.7880 | 0.1237 | 1.0657 | 0.669 | 86.6% |
| | 79 | — | — | — | — | 2.3640 | — | 2.3640 | 1.366 | 87.6% |
| | 80 | — | — | — | — | 1.1820 | 0.1855 | 1.3675 | 0.836 | 87.1% |
| | 81 | — | — | — | — | — | 0.3710 | 0.3710 | 0.260 | 87.9% |
| | 82 | 2.8560 | 2.6595 | 0.8700 | — | 2.6595 | — | 9.0450 | 4.617 | 71.3% |
| | 83 | — | — | — | — | — | 0.0150 | 0.0150 | 0.015 | 70.1% |
| COMPARATIVE EXAMPLES | 11 | 3.5700 | 2.9550 | 0.8700 | — | 2.9550 | — | 10.3500 | 5.159 | 65.9% |
| | 12 | — | — | — | — | — | 0.0090 | 0.0090 | 0.009 | 59.8% |

In Comparative Example 11 where the total fixation amount of one or more additional elements selected from Zn, Ge, Mg, Ca, Ga, and Li in the fixation layer was 10.35 mg/cm², the bonding rate was 65.9% after a thermal cycle (−45° C. to 125° C.) had been repeated 2,000 times. The reason for this is presumed to be that the amount of the additional element was high and the metal plate had become excessively hard, resulting in thermal stress associated with the thermal cycle load being applied on the bonding interface.

could not be sufficiently formed on the interface between the metal plate and the ceramic substrate.

In contrast, in Examples 41 to 83 of the present invention, the bonding rates were all 70% or higher after a thermal cycle (−45° C. to 125° C.) had been repeated 2,000 times. It is judged that diffusion of each additional element enabled reliable formation of a molten metal region on the interface between the metal plate and the ceramic substrate, enabling strong bonding between the metal plate and the ceramic substrate.

INDUSTRIAL APPLICABILITY

According to the present invention, by strengthening the bonding interface side portion of the metal plate by solid solution strengthening, breakage at the metal plate portion can be prevented, and the level of bonding reliability can be improved.

BRIEF DESCRIPTION OF THE REFERENCE SYMBOLS

1, 101, 201, 301, 401, 1001: Power module
3: Semiconductor chip (electronic component)
10, 110, 210, 310, 410, 1010: Power module substrate
11, 111, 211, 311, 411, 1011: Ceramic substrate
12, 112, 212, 312, 412, 1012: Circuit layer
13, 113, 213, 313, 413, 1013: Metal layer
22, 122, 222, 322, 422: Metal plate (first metal plate)
23, 123, 223, 323, 423: Metal plate (second metal plate)

The invention claimed is:

1. A power module substrate comprising:
    a ceramic substrate composed of AlN or $Si_3N_4$; and
    a metal plate which contains aluminum or an aluminum alloy, and which is stacked and bonded on a surface of the ceramic substrate;
    wherein one or more additional elements selected from Ag, Zn, Ge, Mg, Ca, Ga, and Li are solid-solubilized in said metal plate,
    an Ag concentration in said metal plate in the vicinity of the interface with said ceramic substrate is greater than or equal to 0.05% by mass and less than or equal to 10% by mass, or the total concentration of Zn, Ge, Mg, Ca, Ga, and Li in said metal plate in the vicinity of the interface with said ceramic substrate is greater than or equal to 0.01% by mass and less than or equal to 5% by mass,
    an oxygen high concentration part having an oxygen concentration two or more times the oxygen concentration in the crystal grain of said ceramic substrate is formed in the bonding interface between said metal plate and said ceramic substrate, and
    the thickness of said oxygen high concentration part is less than or equal to 4 nm.
2. A power module substrate according to claim 1, wherein in the bonding interface between said metal plate and said ceramic substrate, an additional element high concentration part is formed in which the concentration of said additional element is two or more times the concentration of said additional element in said metal plate.
3. A power module substrate according to claim 1, wherein said ceramic substrate is composed of AlN, and
    the mass ratio of Al, said additional element, O, and N when said bonding interface including said additional element high concentration part is analyzed by means of energy dispersive X-ray analysis is Al:additional element:O:N=50 to 90% by mass:1 to 30% by mass:1 to 10% by mass:25% by mass or less.
4. A power module substrate according to claim 1, wherein said ceramic substrate is composed of $Si_3N_4$, and
    the mass ratio of Al, Si, said additional element, O, and N when said bonding interface including said additional element high concentration part is analyzed by means of energy dispersive X-ray analysis is Al:Si:additional element:O:N=15 to 45% by mass:15 to 45% by mass:1 to 30% by mass:1 to 10% by mass:25% by mass or less.

* * * * *